US011031357B2

(12) United States Patent
Takahashi et al.

(10) Patent No.: US 11,031,357 B2
(45) Date of Patent: Jun. 8, 2021

(54) SEMICONDUCTOR DEVICE

(71) Applicant: Mitsubishi Electric Corporation, Tokyo (JP)

(72) Inventors: Tetsuo Takahashi, Tokyo (JP); Masayoshi Tarutani, Tokyo (JP); Kazuhiko Sakutani, Tokyo (JP); Kenji Harada, Tamba (JP); Masao Takata, Tamba (JP); Kouichi In, Tamba (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/895,837

(22) Filed: Jun. 8, 2020

(65) Prior Publication Data

US 2020/0303323 A1 Sep. 24, 2020

Related U.S. Application Data

(62) Division of application No. 15/837,387, filed on Dec. 11, 2017, now Pat. No. 10,756,029.

(30) Foreign Application Priority Data

Mar. 16, 2017 (JP) .............................. JP2017-051414

(51) Int. Cl.
*H01L 23/00* (2006.01)
*H01L 29/06* (2006.01)
(Continued)

(52) U.S. Cl.
CPC .......... *H01L 23/562* (2013.01); *H01L 21/022* (2013.01); *H01L 21/0217* (2013.01);
(Continued)

(58) Field of Classification Search
CPC . H01L 23/562; H01L 29/0619; H01L 23/291; H01L 23/3171; H01L 21/0217;
(Continued)

(56) References Cited

U.S. PATENT DOCUMENTS 5,530,280 A 6/1996 White
5,665,655 A 9/1997 White
(Continued)

FOREIGN PATENT DOCUMENTS

JP H04251960 A 9/1992
JP H06232256 A 8/1994
(Continued)

OTHER PUBLICATIONS

An Office Action mailed by the Japanese Patent Office dated Jul. 7, 2020, which corresponds to Japanese Patent Application No. 2017-051414 with English Translation.

*Primary Examiner* — Mouloucoulaye Inoussa

(74) *Attorney, Agent, or Firm* — Studebaker & Brackett PC

(57) ABSTRACT

There is provided a semiconductor device having a structure that can suppress occurrence of chipping in a device region and that can reduce manufacturing cost of the semiconductor device. A semiconductor device includes a substrate and a first amorphous insulating film. The substrate has a main surface and an end surface. The main surface includes a peripheral region and a device region. The first amorphous insulating film is disposed on the peripheral region, and is separated from the device region. The first amorphous insulating film extends along the end surface in the form of a stripe. The first amorphous insulating film is flush with the end surface.

16 Claims, 63 Drawing Sheets

(51) Int. Cl.
*H01L 23/29* (2006.01)
*H01L 23/31* (2006.01)
*H01L 21/02* (2006.01)
*H01L 21/78* (2006.01)
*H01L 23/544* (2006.01)
*H01L 21/304* (2006.01)

(52) U.S. Cl.
CPC ............ *H01L 21/304* (2013.01); *H01L 21/78* (2013.01); *H01L 23/291* (2013.01); *H01L 23/3171* (2013.01); *H01L 23/544* (2013.01); *H01L 29/0619* (2013.01); *H01L 23/3192* (2013.01); *H01L 2223/5446* (2013.01); *H01L 2223/54426* (2013.01)

(58) Field of Classification Search
CPC ..... H01L 21/022; H01L 21/78; H01L 23/544; H01L 27/0755; H01L 29/7397; H01L 29/4236; H01L 29/41708; H01L 29/861; H01L 28/20; H01L 29/06; H01L 23/4824; H01L 29/0696; H01L 29/41775; H01L 29/66348
USPC .......... 257/287, E21.384, E29.013, E29.027, 257/E29.122, E29.201, 211, E21.066, 257/E27.069, E29.104, E29.313
See application file for complete search history.

(56) References Cited

U.S. PATENT DOCUMENTS

| | | | |
|---|---|---|---|
| 2008/0079081 | A1 | 4/2008 | Hashimoto |
| 2011/0006403 | A1* | 1/2011 | Okumura ............ H01L 29/0661 257/620 |
| 2011/0284957 | A1* | 11/2011 | Tamaki ............. H01L 29/66727 257/339 |
| 2013/0075760 | A1 | 3/2013 | Takaya et al. |
| 2013/0248993 | A1 | 9/2013 | Sedlmaier et al. |
| 2014/0203411 | A1* | 7/2014 | Kato ................... H01L 29/408 257/620 |
| 2015/0041828 | A1* | 2/2015 | Nagao ................ H01L 29/0692 257/77 |
| 2015/0221564 | A1* | 8/2015 | Yoshida .................. H01L 22/34 438/17 |
| 2017/0110545 | A1* | 4/2017 | Nagao ................... H01L 29/872 |

FOREIGN PATENT DOCUMENTS

| | | |
|---|---|---|
| JP | H06-275713 A | 9/1994 |
| JP | 2008053559 A | 3/2008 |
| JP | 2013-012652 A | 1/2013 |
| JP | 2015-220264 A | 12/2015 |
| JP | 2016-134411 A | 7/2016 |

* cited by examiner

SEMICONDUCTOR DEVICE

CROSS-REFERENCE TO RELATED APPLICATIONS

This application is a Divisional of U.S. patent application Ser. No. 15/837,387 filed Dec. 11, 2017, which claims benefit of priority to Japanese Patent Application No. 2017-051414 filed Mar. 16, 2017, the entire contents of which are incorporated herein by reference.

BACKGROUND OF THE INVENTION

Field of the Invention

The present invention relates to a semiconductor device.

Description of the Background Art

Japanese Patent Laying-Open No. 2013-12652 discloses a semiconductor device obtained by using a blade to cut a wafer having a plurality of semiconductor elements formed thereon. Each of the plurality of semiconductor elements includes: an insulated gate bipolar transistor; and a breakdown voltage structure portion surrounding the insulated gate bipolar transistor. The plurality of semiconductor elements are formed on the wafer such that a space between adjacent breakdown voltage structure portions is not less than 60 μm. Accordingly, even if a crack is generated in the step of cutting the wafer, this crack does not reach the breakdown voltage structure portion, whereby no chipping is caused in the breakdown voltage structure portion.

SUMMARY OF THE INVENTION

However, since the space between the adjacent breakdown voltage structure portions is not less than 60 μm in the wafer disclosed in Japanese Patent Laying-Open No. 2013-12652, a yield of semiconductor devices obtained from one wafer is low, thus resulting in high manufacturing cost of semiconductor devices. The present invention has been made in view of the above problem, and has an object to provide a semiconductor device having a structure with which occurrence of chipping can be suppressed in a device region and manufacturing cost of the semiconductor device can be reduced.

A semiconductor device according to a first embodiment of the present invention includes a substrate, a first insulating film, and a first amorphous insulating film. The substrate has a main surface and an end surface. The main surface includes a peripheral region and a device region surrounded by the peripheral region. The first insulating film is provided on the device region and the peripheral region. The first amorphous insulating film is provided on the first insulating film. The first amorphous insulating film is disposed on the peripheral region, and the first amorphous insulating film is separated from the device region. The first amorphous insulating film extends along the end surface in a form of a stripe. The first amorphous insulating film is flush with the end surface.

A semiconductor device according to a second embodiment of the present invention includes a substrate, a first stripe structure portion, and a second stripe structure portion. The substrate has a main surface and an end surface. The main surface includes a peripheral region and a device region surrounded by the peripheral region. The first stripe structure portion is located on the peripheral region and extends along the end surface. The second stripe structure portion is located on the peripheral region and extends along the end surface. The second stripe structure portion is located between the device region and the first stripe structure portion. The first stripe structure portion is thicker than the second stripe structure portion.

A semiconductor device according to a third embodiment of the present invention includes a substrate. The substrate has a main surface and an end surface and is provided with a notch portion. The main surface includes a peripheral region and a device region surrounded by the peripheral region. The notch portion includes: a side surface connected to the main surface; and a bottom surface connected to the side surface and the end surface. The notch portion is constituted of only an exposed surface of the substrate.

A semiconductor device according to a fourth embodiment of the present invention includes: a substrate and a first polycrystal film. The substrate has a main surface and an end surface and is provided with a notch portion. The main surface includes a peripheral region and a device region surrounded by the peripheral region. The notch portion is connected to the main surface and the end surface and extends along the end surface in a form of a stripe. The first polycrystal film is provided on the notch portion, and the first polycrystal film extends along the end surface in a form of a stripe.

A semiconductor device according to a fifth embodiment of the present invention includes a substrate and a first polycrystal film. The substrate has a main surface and an end surface and is provided with a first groove portion. The main surface includes a peripheral region and a device region surrounded by the peripheral region. The first groove portion is formed in the peripheral region, and the first groove portion extends along the end surface in a form of a stripe. The first polycrystal film is provided in the first groove portion, and the first polycrystal film extends along the end surface in a form of a stripe.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following describes embodiments of the present invention. It should be noted that the same configuration is given the same reference number and will not be described repeatedly.

First Embodiment

Figure 1:
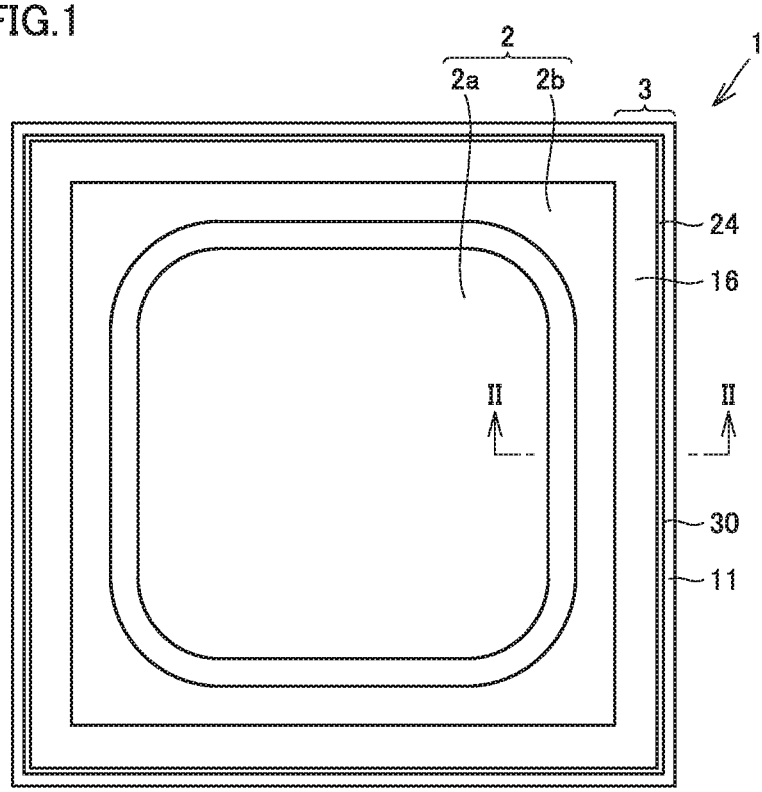
FIG. 1 is a schematic plan view of a semiconductor device according to a first embodiment of the present invention.
Figure 2:
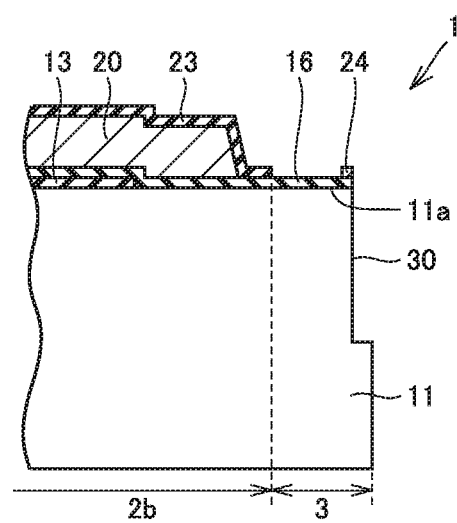
FIG. 2 is a schematic partial enlarged cross sectional view of the semiconductor device according to the first embodiment of the present invention along a cross section line II-II shown in FIG. 1.

With reference to FIG. 1 and FIG. 2, a semiconductor device 1 according to a first embodiment will be described. Semiconductor device 1 of the present embodiment mainly includes a substrate 11, a first insulating film 16, and a first amorphous insulating film 24. Semiconductor device 1 may further include a second insulating film 13, an electrode film 20, and a second amorphous insulating film 23.

Substrate 11 has a main surface 11a and an end surface 30. Substrate 11 is not limited in particular, and may be a semiconductor substrate such as a Si substrate. End surface 30 crosses main surface 11a. Main surface 11a of substrate 11 includes a peripheral region 3 and a device region 2 surrounded by peripheral region 3. An active element is formed on device region 2.

Specifically, device region 2 may include an active device region 2a and a breakdown voltage holding region 2b. An active element is formed on active device region 2a. The active element may be a power semiconductor element. The active element may be an insulated gate bipolar transistor (IGBT), a metal oxide semiconductor field effect transistor (MOSFET), or a diode, for example. Active device region 2a is surrounded by breakdown voltage holding region 2b. Breakdown voltage holding region 2b is adjacent to peripheral region 3. A breakdown voltage holding structure is formed in breakdown voltage holding region 2b. As an exemplary breakdown voltage holding structure, breakdown voltage holding region 2b of substrate 11 may have p⁻ type conductivity and active device region 2a of substrate 11 may have n⁻ type conductivity. In an exemplary breakdown voltage holding structure, a guard ring may be provided in breakdown voltage holding region 2b.

First insulating film 16 is provided on device region 2 and peripheral region 3. First insulating film 16 provided on peripheral region 3 may be in one piece with first insulating film 16 provided on device region 2. First insulating film 16 may be a silicon dioxide film, for example.

Second insulating film 13 is provided on a portion of device region 2 separated from peripheral region 3. On the portion of device region 2, second insulating film 13 is provided between substrate 11 and first insulating film 16. Second insulating film 13 may be a field oxide film. Second insulating film 13 may be a silicon dioxide film, for example.

First amorphous insulating film 24 is provided on first insulating film 16 provided on peripheral region 3. First amorphous insulating film 24 is disposed on peripheral region 3, and is separated from device region 2. First amorphous insulating film 24 extends along end surface 30 in the form of a stripe. When main surface 11a of substrate 11 is viewed in a plan view, the length of first amorphous insulating film 24 may be ⅓ or more, ½ or more, ⅔ or more, or ¾ or more of the length of end surface 30. When main surface 11a of substrate 11 is viewed in a plan view, the length of first amorphous insulating film 24 is equal to the length of end surface 30 or is smaller than the length of end surface 30. First amorphous insulating film 24 is flush with end surface 30 of substrate 11. First amorphous insulating film 24 may be composed of a material different from first insulating film 16. First amorphous insulating film 24 may be an amorphous silicon nitride film, for example.

Electrode film 20 is disposed on device region 2, and is provided on first insulating film 16. Electrode film 20 may be separated from peripheral region 3. Electrode film 20 may be an AlSi film or Al film, for example.

Second amorphous insulating film 23 is disposed on device region 2. Second amorphous insulating film 23 is separated from first amorphous insulating film 24. Second amorphous insulating film 23 may cover electrode film 20. Second amorphous insulating film 23 may be formed also on a portion of first insulating film 16 exposed through electrode film 20. Second amorphous insulating film 23 may be composed of the same material as that of first amorphous insulating film 24, or may be composed of a material different therefrom. Second amorphous insulating film 23 may be an amorphous silicon nitride film, for example.

With reference to FIG. 3 to FIG. 7, the following describes a method for manufacturing semiconductor device 1 in the present embodiment.

With reference to FIG. 3 to FIG. 5 and FIG. 7, the method for manufacturing semiconductor device 1 in the present embodiment includes: forming (S1) first insulating film 16 on peripheral region 3 of main surface 10a of wafer 10. First amorphous insulating film 24 may be formed on first insulating film 16 using a chemical vapor deposition (CVD) method, an evaporation method, or a thermal oxidation method, for example. Wafer 10 is not limited in particular, and may be a semiconductor wafer such as a Si wafer. Main surface 10a of wafer 10 includes peripheral region 3 and a plurality of device regions 2 surrounded by peripheral region 3. Peripheral region 3 surrounds each of the plurality of device regions 2 on main surface 10a of wafer 10.

Width $W_1$ of peripheral region 3 may be not more than 50 μm or not more than 40 μm, for example. Peripheral region 3 has a width $W_1$ defined as a space between adjacent device regions 2. Width $W_1$ of peripheral region 3 may be more than 25 μm or may be not less than 30 μm, for example. Width $W_1$ of peripheral region 3 is equal to or more than a total of the maximum thickness of a blade to be used when cutting (S3) wafer 10 and alignment accuracy of the blade with respect to wafer 10. Forming (S1) first insulating film 16 on peripheral region 3 may be performed in the same step as forming first insulating film 16 on the plurality of device regions 2.

Figure 3:
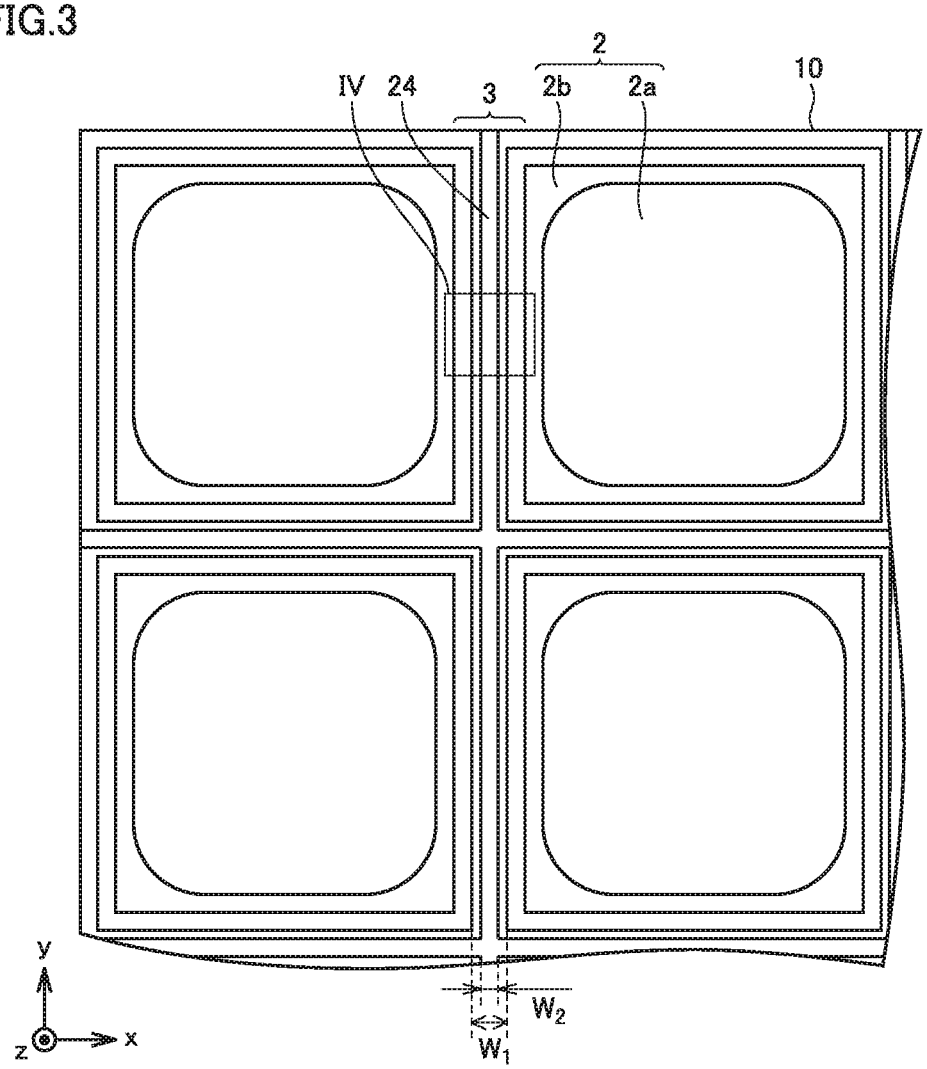
FIG. 3 is a schematic plan view showing one step of a method for manufacturing the semiconductor device according to the first embodiment of the present invention.
Figure 4:
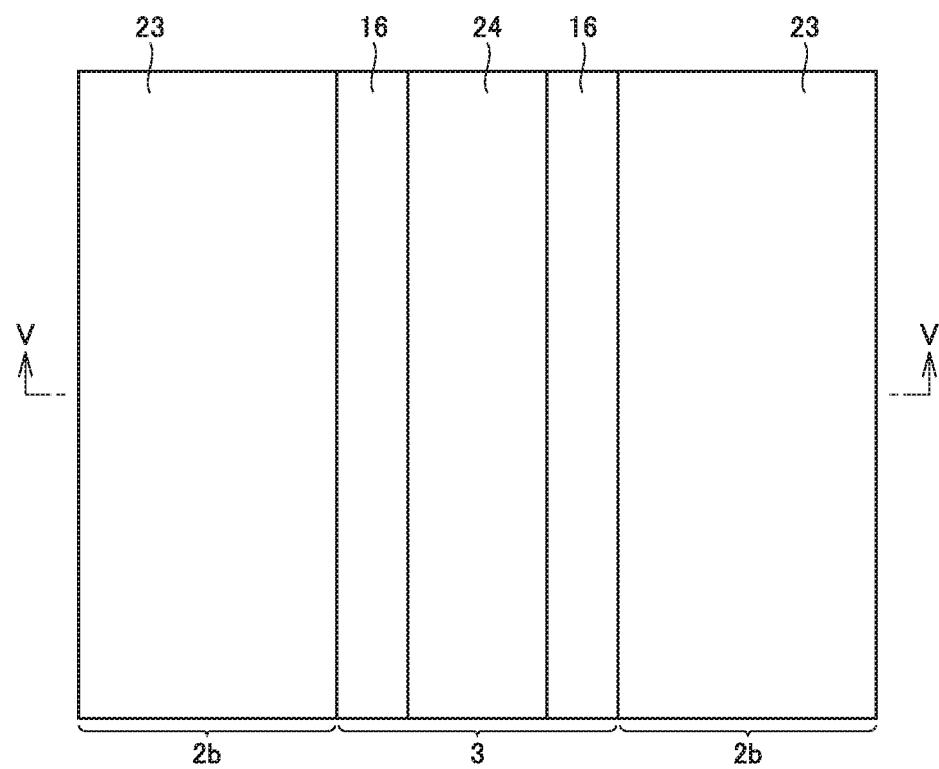
FIG. 4 is a schematic partial enlarged plan view of a region IV shown in FIG. 3 in one step of the method for manufacturing the semiconductor device according to the first embodiment of the present invention.
Figure 5:
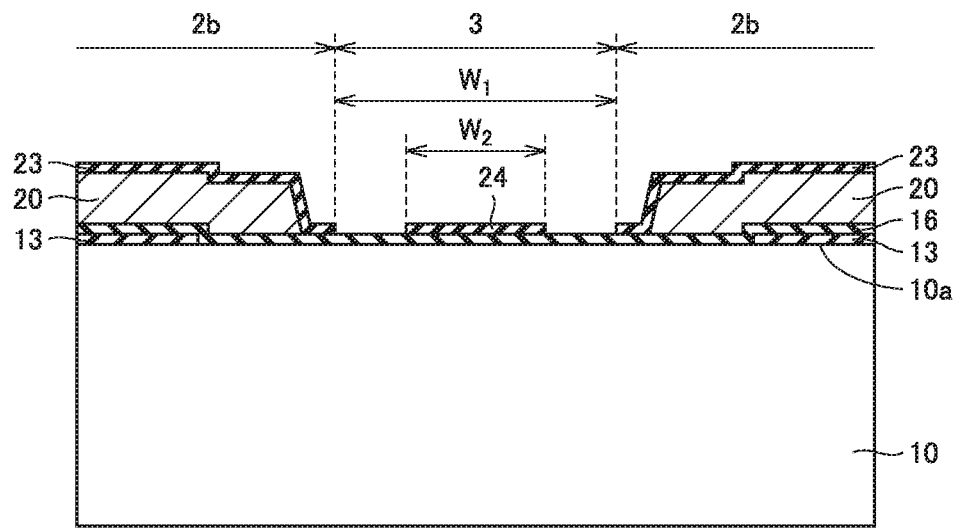
FIG. 5 is a schematic partial enlarged cross sectional view along a cross section line V-V shown in FIG. 4 in one step of the method for manufacturing the semiconductor device according to the first embodiment of the present invention.

With reference to FIG. 3 to FIG. 5 and FIG. 7, the method for manufacturing semiconductor device 1 in the present embodiment includes forming (S2) first amorphous insulating film 24 on first insulating film 16. First amorphous insulating film 24 may be formed on first insulating film 16 using the chemical vapor deposition (CVD) method, the evaporation method, or a spin coat method, for example. First amorphous insulating film 24 is disposed on peripheral region 3, and is separated from device region 2. First amorphous insulating film 24 extends along a first direction (for example, y direction in FIG. 3) in the form of a stripe. As shown in FIG. 3 and FIG. 5, first amorphous insulating film 24 has a width $W_2$ smaller than width $W_1$ of peripheral region 3. Width $W_2$ of first amorphous insulating film 24 is defined as the length of first amorphous insulating film 24 in a second direction (for example, x direction in FIG. 3) orthogonal to the first direction. Width $W_2$ of first amorphous insulating film 24 may be not more than 45 μm or may be not more than 35 μm. Width $W_2$ of first amorphous insulating film 24 may be not less than 25 μm.

As shown in FIG. 3, first amorphous insulating film 24 may extend in the form of a stripe also in the second direction orthogonal to the first direction. That is, first amorphous insulating film 24 may be formed in the form of a lattice on first insulating film 16. Forming (S2) first amorphous insulating film 24 on first insulating film 16 may be performed in the same step as forming second amorphous insulating film 23 on electrode film 20.

Figure 6:
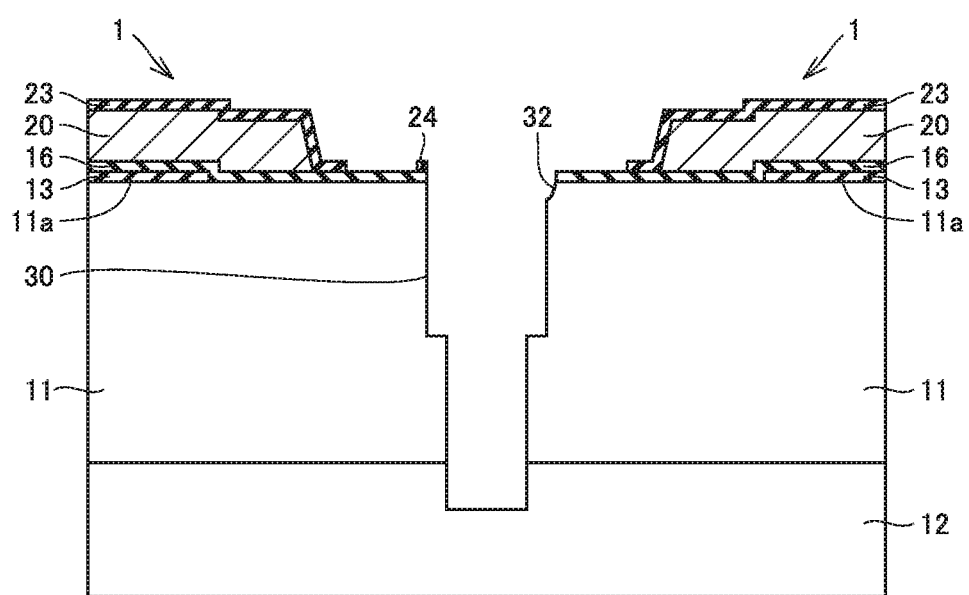
FIG. 6 is a schematic partial enlarged cross sectional view showing a step subsequent to the step shown in FIG. 5 in the method for manufacturing the semiconductor device according to the first embodiment of the present invention.
Figure 7:
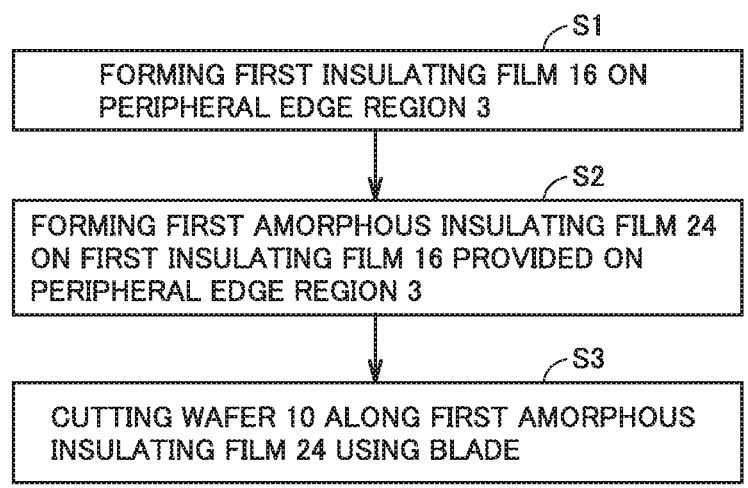
FIG. 7 shows a flowchart of the method for manufacturing the semiconductor device according to the first embodiment of the present invention.

With reference to FIG. 6 and FIG. 7, the method for manufacturing semiconductor device 1 in the present embodiment includes cutting (S3) wafer 10 along first amorphous insulating film 24 using the blade. Specifically, wafer 10 is adhered to a dicing tape 12. Then, wafer 10 is cut using the blade along first amorphous insulating film 24. Wafer 10 is divided into a plurality of substrates 11, thus forming end surface 30 of each substrate 11. Main surface 11a of substrate 11 is a portion of main surface 10a of wafer 10. End surface 30 of substrate 11 is a surface cut by the blade. The plurality of substrates 11 are removed from dicing tape 12, thereby obtaining a plurality of semiconductor devices 1.

When cutting (S3) wafer 10, a central portion of first amorphous insulating film 24 is removed whereas end portions of first amorphous insulating film 24 remains adjacent to the both ends of the blade in the width direction thereof. Accordingly, first amorphous insulating film 24 extends along end surface 30 in the form of a stripe and is flush with end surface 30. The blade may have a thickness of not less than 15 μm. The blade may have a thickness of not more than 35 μm, and may have a thickness of not more than 25 μm. In the present embodiment, wafer 10 is cut by a step cut method. The step cut method includes: cutting a portion of wafer 10 using a first blade; and thereafter cutting wafer 10 completely using a second blade having a thickness smaller than that of the first blade. Wafer 10 may be cut by a single cut method. The single cut method is a method of cutting wafer 10 completely using one blade.

When cutting (S3) wafer 10, the blade is first brought into contact with first amorphous insulating film 24. Large mechanical energy is applied from the blade to first amorphous insulating film 24. First amorphous insulating film 24 is more fragile than first insulating film 16. When the blade is brought into contact with first amorphous insulating film 24, a portion of first amorphous insulating film 24 is removed from first insulating film 16. A part of the mechanical energy of the blade is consumed to remove the portion of first amorphous insulating film 24 from first insulating film 16. First amorphous insulating film 24 can attenuate the mechanical energy applied from the blade to first insulating film 16 and wafer 10 when the blade is brought into contact with first insulating film 16 and wafer 10 under first amorphous insulating film 24.

Therefore, as shown in semiconductor device 1 on the left-hand side of FIG. 6, occurrence of chipping 32 can be suppressed in substrate 11 even when the blade is brought into contact with wafer 10. Moreover, even if a crack is generated in a portion of substrate 11 when the blade is brought into contact with wafer 10, the length of the crack can be decreased, thus preventing the crack from reaching device region 2. In this way, even though width $W_1$ of peripheral region 3 of wafer 10 is narrowed, occurrence of chipping 32 can be prevented in device region 2 as shown in semiconductor device 1 on the right-hand side of FIG. 6, although chipping 32 may occur in a portion of peripheral region 3. Since width $W_1$ of peripheral region 3 of wafer 10 can be narrowed, a yield of semiconductor devices 1 obtained from one wafer 10 is increased, thus reducing the manufacturing cost of semiconductor device 1.

Further, first amorphous insulating film 24 is separated from device region 2. Therefore, even if first amorphous insulating film 24 is damaged when cutting (S3) wafer 10, this damage can be prevented from reaching device region 2 via first amorphous insulating film 24. The structure (for example, electrode film 20) formed on the surface of device region 2 can be suppressed from being damaged.

The following describes effects of semiconductor device 1 and the method for manufacturing semiconductor device 1 in the present embodiment.

Semiconductor device 1 of the present embodiment includes substrate 11, first insulating film 16, and first amorphous insulating film 24. Substrate 11 has main surface 11a and end surface 30. Main surface 11a includes peripheral region 3 and device region 2 surrounded by peripheral region 3. First insulating film 16 is provided on each of device region 2 and peripheral region 3. First amorphous insulating film 24 is provided on first insulating film 16. First amorphous insulating film 24 is disposed on peripheral region 3 and is separated from device region 2. First amorphous insulating film 24 extends along end surface 30 in the form of a stripe. First amorphous insulating film 24 is flush with end surface 30. Even though the width of peripheral region 3 is narrowed, first amorphous insulating film 24 can prevent occurrence of chipping 32 in device region 2. Semiconductor device 1 of the present embodiment has a structure with which occurrence of chipping 32 can be suppressed in device region 2 and the manufacturing cost of semiconductor device 1 can be reduced.

The method for manufacturing semiconductor device 1 in the present embodiment includes forming (S1) first insulating film 16 on peripheral region 3 of main surface 10a of wafer 10. Peripheral region 3 surrounds each of the plurality of device regions 2 of main surface 10a of wafer 10. The method for manufacturing semiconductor device 1 in the present embodiment includes forming (S2) first amorphous insulating film 24 on first insulating film 16. First amorphous insulating film 24 is disposed on peripheral region 3 and is separated from device region 2. First amorphous insulating film 24 extends along the first direction in the form of a stripe. The method for manufacturing semiconductor device 1 in the present embodiment further includes cutting (S3) wafer 10 along first amorphous insulating film 24 using the blade. When cutting wafer 10, a central portion of first amorphous insulating film 24 is removed whereas the end portions of first amorphous insulating film 24 remain adjacent to the both ends of the blade in the width direction thereof.

First amorphous insulating film 24 can attenuate mechanical energy applied from the blade to first insulating film 16 and wafer 10. Therefore, even though width $W_1$ of peripheral region 3 of wafer 10 is narrowed, occurrence of chipping 32 can be prevented in device region 2. According to the method for manufacturing semiconductor device 1 in the present embodiment, occurrence of chipping 32 can be suppressed in device region 2 and the manufacturing cost of semiconductor device 1 can be reduced.

Second Embodiment

Figure 8:
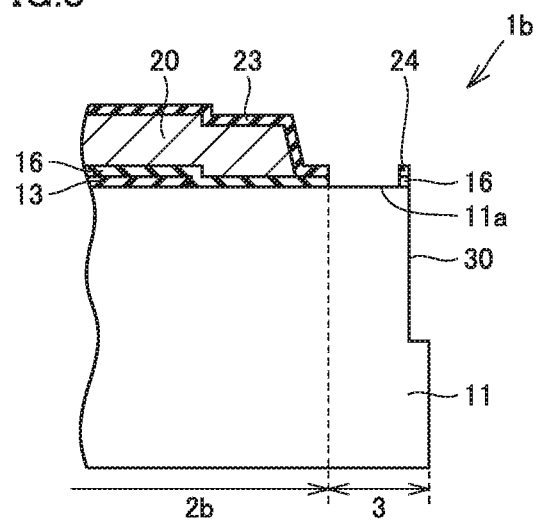
FIG. 8 is a schematic partial enlarged cross sectional view of a semiconductor device according to a second embodiment of the present invention.

With reference to FIG. 8, a semiconductor device 1b according to a second embodiment will be described. Semiconductor device 1b of the present embodiment includes a configuration similar to that of semiconductor device 1 of the first embodiment, but is mainly different therefrom in the following points.

In semiconductor device 1b of the present embodiment, between device region 2 and first amorphous insulating film 24, first insulating film 16 provided under first amorphous insulating film 24 is separated from first insulating film 16 provided on device region 2. Specifically, main surface 11a of substrate 11 is exposed through first insulating film 16 between first insulating film 16 provided under first amorphous insulating film 24 and first insulating film 16 provided on device region 2. Substrate 11 has exposed main surface 11a between first insulating film 16 provided under first amorphous insulating film 24 and first insulating film 16 provided on device region 2. First insulating film 16 provided under first amorphous insulating film 24 extends along end surface 30 in the form of a stripe. First insulating film 16 provided under first amorphous insulating film 24 is flush with end surface 30.

With reference to FIG. 9 to FIG. 12, the following describes a method for manufacturing semiconductor device 1b according to the second embodiment. The method for manufacturing semiconductor device 1b in the present embodiment includes steps similar to those in the method for manufacturing semiconductor device 1 in the first embodiment, but is mainly different therefrom in the following points.

Figure 9:
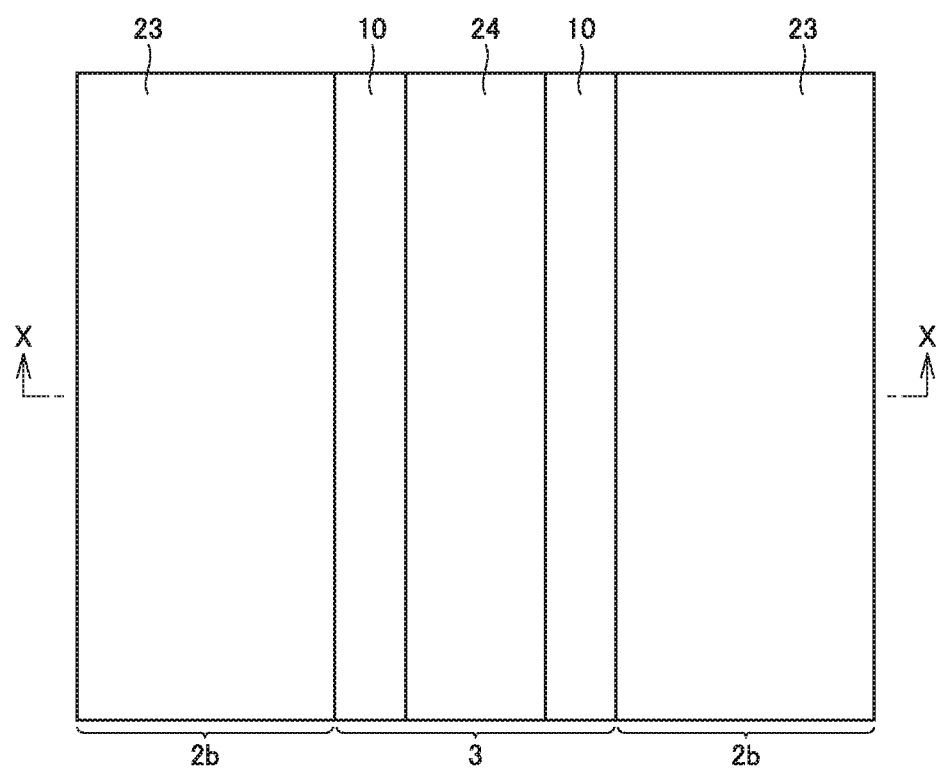
FIG. 9 is a schematic partial enlarged plan view showing one step of a method for manufacturing the semiconductor device according to the second embodiment of the present invention.
Figure 10:
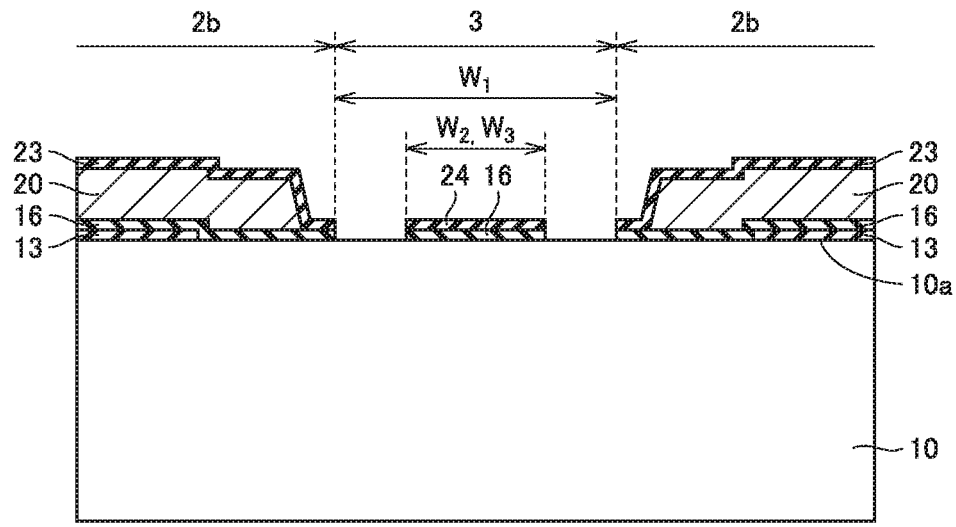
FIG. 10 is a schematic partial enlarged cross sectional view along a cross section line X-X shown in FIG. 9 in one step of the method for manufacturing the semiconductor device according to the second embodiment of the present invention.
Figure 12:
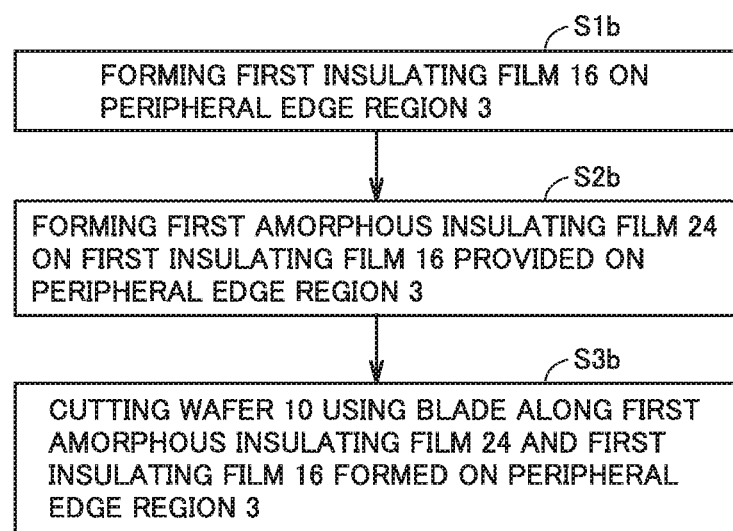
FIG. 12 shows a flowchart of the method for manufacturing the semiconductor device according to the second embodiment of the present invention.

With reference to FIG. 9, FIG. 10, and FIG. 12, the method for manufacturing semiconductor device 1b in the present embodiment includes forming (S1b) first insulating film 16 on peripheral region 3 of main surface 10a of wafer 10. First insulating film 16 formed on peripheral region 3 is separated from first insulating film 16 provided on device region 2. First insulating film 16 formed on peripheral region 3 extends along the first direction in the form of a stripe. Width $W_3$ of first insulating film 16 formed on peripheral region 3 is smaller than width $W_1$ of peripheral region 3. Width $W_3$ of first insulating film 16 formed on peripheral region 3 is defined as the length of first insulating film 16 formed on peripheral region 3 in the second direction orthogonal to the first direction. Width $W_3$ of first insulating film 16 formed on peripheral region 3 may be not more than 45 µm, or may be not more than 35 µm. Width $W_3$ of first insulating film 16 formed on peripheral region 3 may be not less than 25 µm. First insulating film 16 may extend in the form of a stripe along the second direction orthogonal to the first direction. That is, first insulating film 16 may be formed on first insulating film 16 in the form of a lattice.

With reference to FIG. 9, FIG. 10, and FIG. 12, the method for manufacturing semiconductor device 1b in the present embodiment includes forming (S2b) first amorphous insulating film 24 on first insulating film 16. Forming (S2b) first amorphous insulating film 24 on first insulating film 16 in the present embodiment is basically the same as forming (S2) first amorphous insulating film 24 on first insulating film 16 in the first embodiment. Width $W_2$ of first amorphous insulating film 24 may be equal to width $W_3$ of first insulating film 16 formed on peripheral region 3, or may be smaller than width $W_3$ of first insulating film 16 formed on peripheral region 3.

Figure 11:
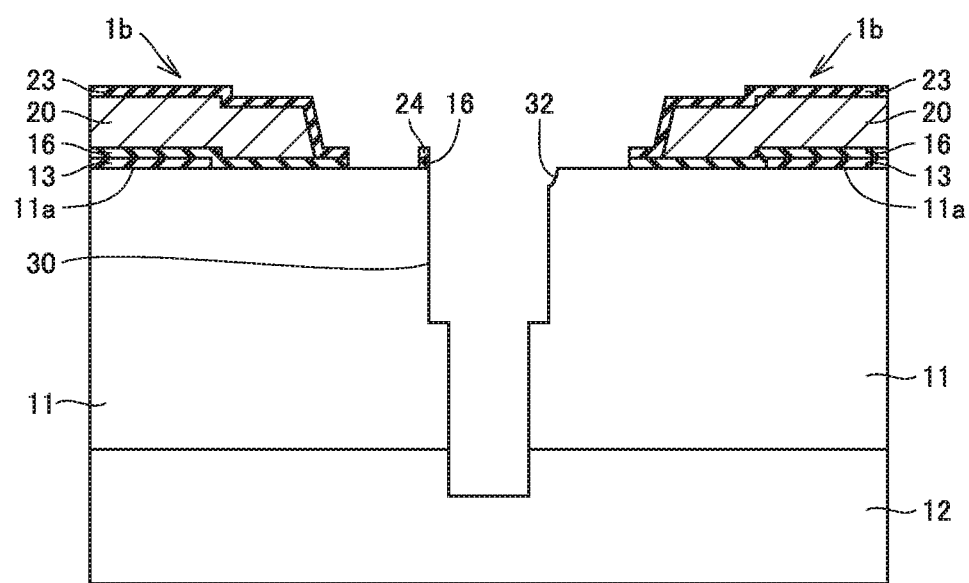
FIG. 11 is a schematic partial enlarged cross sectional view showing a step subsequent to the step shown in FIG. 10 in the method for manufacturing the semiconductor device according to the second embodiment of the present invention.

With reference to FIG. 11 and FIG. 12, the method for manufacturing semiconductor device 1b in the present embodiment includes cutting (S3b) wafer 10 using a blade along first amorphous insulating film 24 and first insulating film 16 formed on peripheral region 3. When cutting (S3b) wafer 10, the central portion of first amorphous insulating film 24 and the central portion of first insulating film 16 formed on peripheral region 3 are removed, whereas the end portions of first amorphous insulating film 24 and the end portions of first insulating film 16 formed on peripheral region 3 remain adjacent to the both ends of the blade in the width direction thereof. After cutting (S3b) wafer 10, first amorphous insulating film 24 and first insulating film 16 formed on peripheral region 3 extend along end surface 30 of semiconductor device 1b in the form of a stripe and is flush with end surface 30 of substrate 11.

In addition to the effects of semiconductor device 1 and the method for manufacturing semiconductor device 1 in the first embodiment, semiconductor device 1b and the method for manufacturing semiconductor device 1b in the present embodiment exhibit the following effects.

In semiconductor device 1b of the present embodiment, between device region 2 and first amorphous insulating film 24, first insulating film 16 provided under first amorphous insulating film 24 is separated from first insulating film 16 provided on device region 2. First insulating film 16 provided under first amorphous insulating film 24 extends along end surface 30 in the form of a stripe. First insulating film 16 provided under first amorphous insulating film 24 is flush with end surface 30.

In semiconductor device 1b of the present embodiment, first insulating film 16 provided under first amorphous insulating film 24 is separated from first insulating film 16 provided on device region 2. Therefore, damage in first insulating film 16 formed under first amorphous insulating film 24 can be prevented from reaching device region 2 via first insulating film 16. Semiconductor device 1b of the present embodiment has a structure with which occurrence of chipping 32 can be suppressed in device region 2 and the manufacturing cost of semiconductor device 1b can be reduced.

The method for manufacturing semiconductor device 1b in the present embodiment includes forming (S1b) first insulating film 16 on peripheral region 3 of main surface 10a of wafer 10. First insulating film 16 formed on peripheral region 3 is separated from device region 2. First insulating film 16 formed on peripheral region 3 extends along the first direction in the form of a stripe. The method for manufacturing semiconductor device 1b in the present embodiment includes forming (S2) first amorphous insulating film 24 on first insulating film 16. First amorphous insulating film 24 is disposed on peripheral region 3 and is separated from device region 2. First amorphous insulating film 24 extends along the first direction in the form of a stripe. The method for manufacturing semiconductor device 1b in the present embodiment further includes cutting (S3b) wafer 10 using a blade along first amorphous insulating film 24 and first insulating film 16 formed on peripheral region 3. When cutting (S3b) wafer 10, the central portion of first amorphous insulating film 24 and the central portion of first insulating film 16 formed on peripheral region 3 are removed, whereas the end portions of first amorphous insulating film 24 and the end portions of first insulating film 16 formed on peripheral region 3 remain adjacent to the both ends of the blade in the width direction thereof.

In the method for manufacturing semiconductor device 1b in the present embodiment, first insulating film 16 formed on peripheral region 3 and under first amorphous insulating film 24 is separated from device region 2. Therefore, even if first insulating film 16 formed under first amorphous insulating film 24 is damaged when cutting (S3b) wafer 10, this damage can be prevented from reaching device region 2 via first insulating film 16. According to the method for manufacturing semiconductor device 1b in the present embodiment, occurrence of chipping 32 can be suppressed in device region 2 and the manufacturing cost of semiconductor device 1b can be reduced.

Third Embodiment

Figure 13:
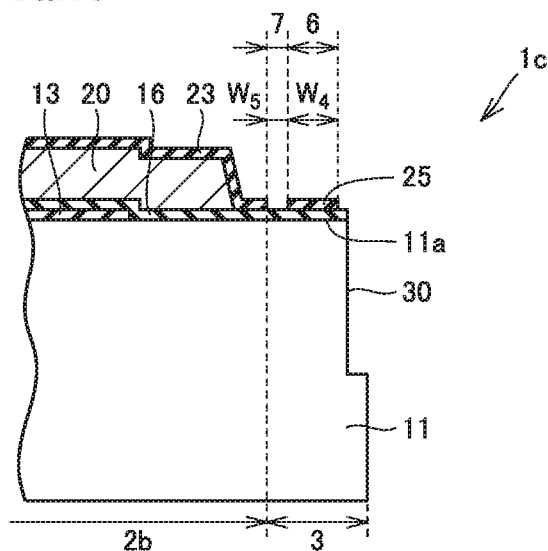
FIG. 13 is a schematic partial enlarged cross sectional view of a semiconductor device according to a third embodiment of the present invention.
Figure 14:
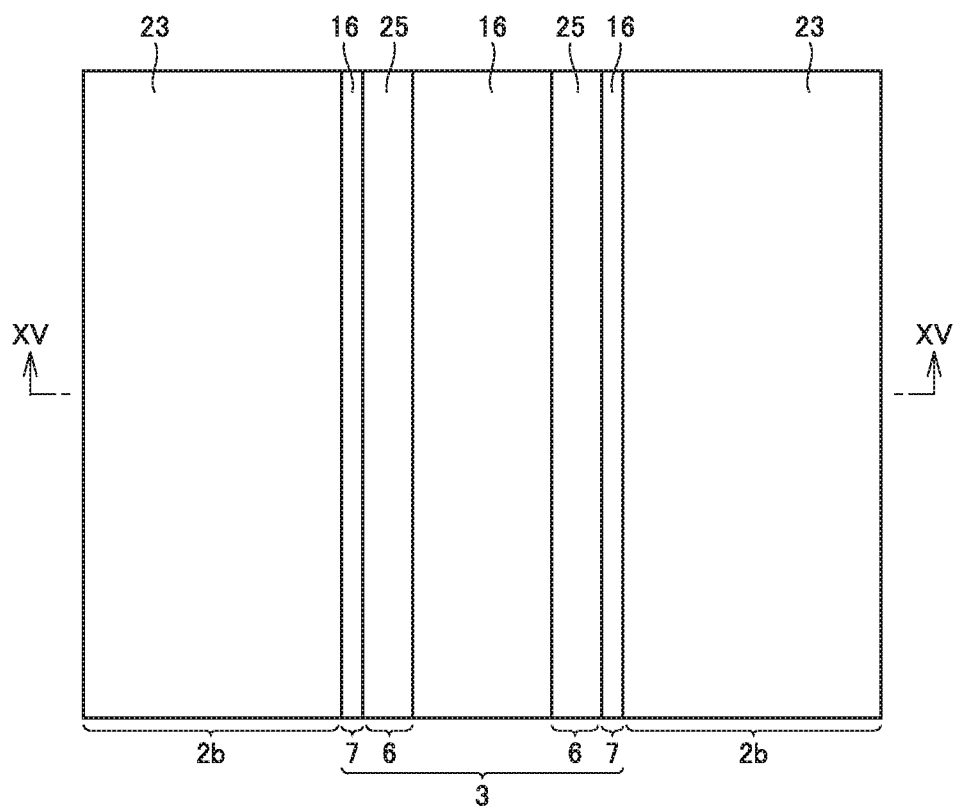
FIG. 14 is a schematic partial enlarged plan view showing one step of a method for manufacturing the semiconductor device according to the third embodiment of the present invention.
Figure 15:
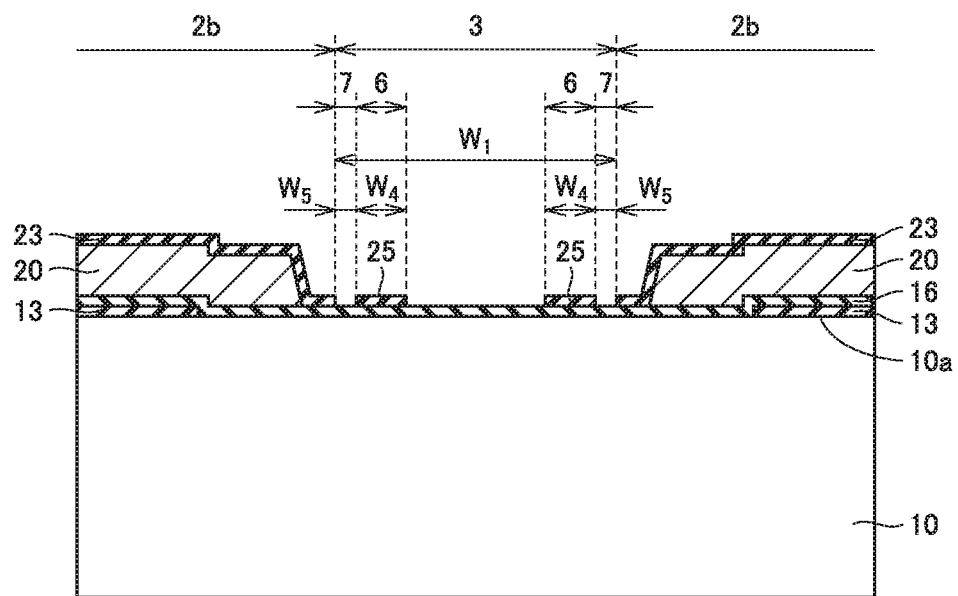
FIG. 15 is a schematic partial enlarged cross sectional view along a cross section line XV-XV shown in FIG. 14 in one step of the method for manufacturing the semiconductor device according to the third embodiment of the present invention.

With reference to FIG. 13, a semiconductor device 1c according to a third embodiment will be described. Semiconductor device 1c of the present embodiment includes a configuration similar to that of semiconductor device 1 of the first embodiment, but is mainly different therefrom in the following points.

Semiconductor device 1c of the present embodiment includes a third insulating film 25 instead of first amorphous insulating film 24 of the first embodiment. Third insulating film 25 is provided on a portion of first insulating film 16 and extends along end surface 30 in the form of a stripe. A portion of first insulating film 16 is provided on peripheral region 3, and extends along end surface 30. Third insulating film 25 may be separated from device region 2 by not less than 1 µm. Third insulating film 25 may be separated from device region 2 by not more than 5 µm. Third insulating film 25 may be separated from end surface 30. Third insulating film 25 is composed of a material different from that of first insulating film 16. Third insulating film 25 may be composed of the same material as that of second amorphous insulating film 23, or may be composed of a material different therefrom. Third insulating film 25 may be an amorphous silicon nitride film, for example.

Semiconductor device 1c of the present embodiment includes a first stripe structure portion 6 and a second stripe structure portion 7. First stripe structure portion 6 is located on peripheral region 3 and extends along end surface 30. Second stripe structure portion 7 is located on peripheral region 3 and extends along end surface 30. Second stripe structure portion 7 is located between device region 2 and first stripe structure portion 6. First stripe structure portion 6 is thicker than second stripe structure portion 7. Width $W_4$ of first stripe structure portion 6 may be larger than width $W_5$ of second stripe structure portion 7. Width $W_5$ of second stripe structure portion 7 may be not less than 1 μm, for example. Width $W_5$ of second stripe structure portion 7 may be not more than 5 μm, for example.

First stripe structure portion 6 includes a portion of first insulating film 16 and third insulating film 25 provided on the portion of first insulating film 16. Second stripe structure portion 7 includes first insulating film 16 but includes no third insulating film 25. In second stripe structure portion 7, main surface 11a of substrate 11 may be exposed through first insulating film 16 and second stripe structure portion 7 may not include first insulating film 16. A portion of first insulating film 16 is provided on peripheral region 3, and extends along end surface 30 in the form of a stripe.

With reference to FIG. 14 to FIG. 17, the following describes a method for manufacturing semiconductor device 1c according to the third embodiment. The method for manufacturing semiconductor device 1c in the present embodiment includes steps similar to those in the method for manufacturing semiconductor device 1 in the first embodiment, but is mainly different therefrom in the following points. The method for manufacturing semiconductor device 1c in the present embodiment includes forming (S4) a pair of third insulating films 25 on first insulating film 16 provided on peripheral region 3 instead of forming (S2) first amorphous insulating film 24 in the first embodiment. Third insulating films 25 may be formed on first insulating film 16 using the chemical vapor deposition (CVD) method, the evaporation method, or the spin coat method, for example. Forming (S4) the pair of third insulating films 25 may be performed in the same step as forming second amorphous insulating film 23 on electrode film 20.

The pair of third insulating films 25 are disposed on peripheral region 3 and are separated from device region 2. Each of the pair of third insulating films 25 extends along the first direction in the form of a stripe. The pair of third insulating films 25 are separated from each other in the second direction orthogonal to the first direction. A space between the pair of third insulating films 25 may be larger than the thickness of the blade to be used when cutting (S3c) wafer 10, or may be equal to the thickness of the blade.

First stripe structure portions 6 are portions of peripheral region 3 at which the pair of third insulating films 25 are formed on first insulating film 16. Each of first stripe structure portions 6 is thicker than a portion to be in contact with the blade when cutting (S3c) wafer 10. First stripe structure portions 6 are thicker than portions located adjacent to respective sides of first stripe structure portions 6 and each extending along the first direction in the form of a stripe. Specifically, first stripe structure portion 6 is thicker than second stripe structure portion 7 and a portion of peripheral region 3 between the pair of third insulating films 25. For example, first stripe structure portion 6 includes first insulating film 16 and third insulating film 25 on first insulating film 16. Each of second stripe structure portion 7 and the portion of peripheral region 3 between the pair of third insulating films 25 includes first insulating film 16 but does not include third insulating film 25. Second stripe structure portion 7 is located between first stripe structure portion 6 and device region 2, and is adjacent to first stripe structure portion 6.

The method for manufacturing semiconductor device 1c in the present embodiment further includes cutting (S3c) wafer 10 along the pair of third insulating films 25 using the blade. When cutting (S3c) wafer 10, the blade is brought into contact with wafer 10 between the pair of third insulating films 25, whereby wafer 10 between the pair of third insulating films 25 is cut using the blade. When cutting (S3c) wafer 10, at least portions of the pair of third insulating films 25 remain adjacent to the both ends of the blade in the width direction thereof. Specifically, when cutting (S3c) wafer 10, the pair of third insulating films 25 may entirely remain adjacent to the both ends of the blade in the width direction thereof.

When cutting (S3c) wafer 10, the blade is brought into contact with main surface 10a of wafer 10 located between the pair of third insulating films 25. On main surface 10a of wafer 10 between the pair of third insulating films 25, only first insulating film 16 is formed. On the other hand, on main surface 10a of wafer 10 in first stripe structure portion 6, not only first insulating film 16 but also third insulating film 25 stacked on first insulating film 16 are formed. Mechanical energy required to chip a portion of wafer 10 on which first stripe structure portion 6 is formed is larger than mechanical energy required to chip a portion of wafer 10 which is located between the pair of third insulating films 25 and on which only first insulating film 16 is formed. Therefore, even if a crack is generated near the portion of wafer 10 with which the blade is brought into contact when cutting (S3c) wafer 10, first stripe structure portion 6 can prevent this crack from reaching device region 2.

Figure 16:
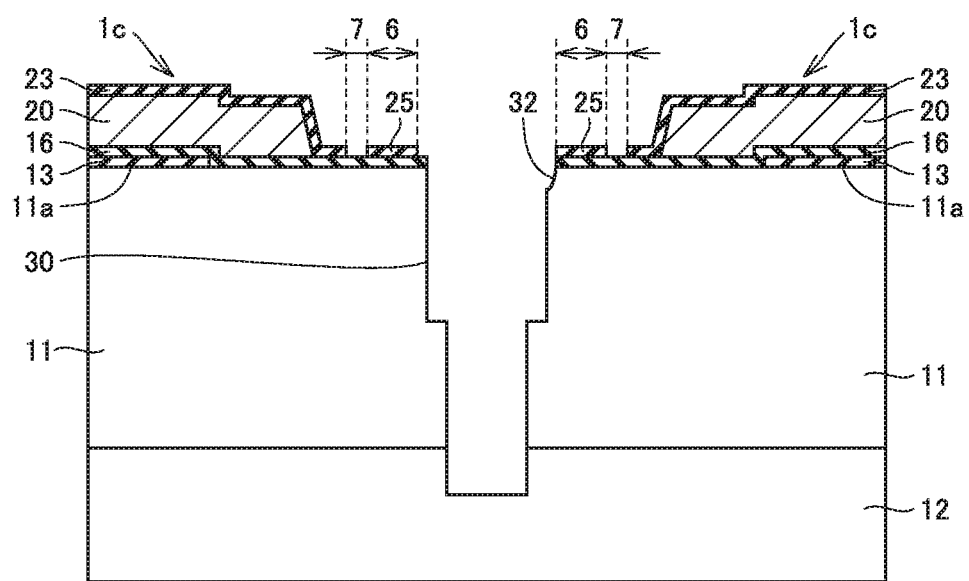
FIG. 16 is a schematic partial enlarged cross sectional view showing a step subsequent to the step shown in FIG. 15 in the method for manufacturing the semiconductor device according to the third embodiment of the present invention.
Figure 17:
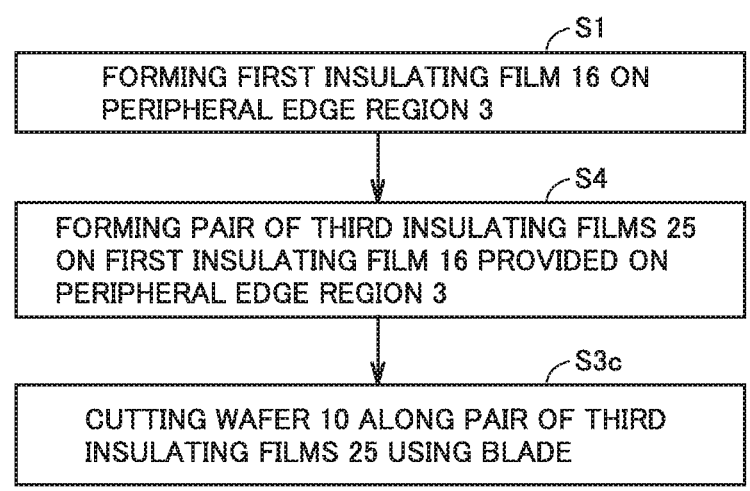
FIG. 17 shows a flowchart of the method for manufacturing the semiconductor device according to the third embodiment of the present invention.

Thus, as shown in semiconductor device 1c on the right-hand side of FIG. 16, even though width $W_1$ of peripheral region 3 of wafer 10 is narrowed, occurrence of chipping 32 can be prevented in device region 2. Since width $W_1$ of peripheral region 3 of wafer 10 can be narrowed, a yield of semiconductor devices 1c obtained from one wafer 10 is increased, thus reducing the manufacturing cost of semiconductor device 1c. By setting width $W_5$ of second stripe structure portion 7 to be not more than 5 μm, width $W_4$ of first stripe structure portion 6 can be increased. Therefore, first stripe structure portion 6 can further prevent occurrence of chipping 32 in device region 2.

Furthermore, third insulating film 25 is separated from device region 2. Third insulating film 25 is not formed in second stripe structure portion 7. Therefore, even if third insulating film 25 provided between second stripe structure portions 7 is damaged when cutting (S3c) wafer 10, this damage can be prevented from reaching device region 2 via third insulating film 25. By setting width $W_5$ of second stripe structure portion 7 at not less than 1 μm, this damage can be further prevented from reaching device region 2. The structure (for example, electrode film 20) formed on the surface of device region 2 can be suppressed from being damaged.

Each of semiconductor device 1c and the method for manufacturing semiconductor device 1c in the present embodiment exhibits effects similar to those in semiconductor device 1 and the method for manufacturing semiconductor device 1 in the first embodiment, but is mainly different therefrom in the following points.

Semiconductor device 1c of the present embodiment includes substrate 11, first stripe structure portion 6, and second stripe structure portion 7. Substrate 11 has main surface 11a and end surface 30. Main surface 11a includes peripheral region 3 and device region 2 surrounded by peripheral region 3. First stripe structure portion 6 is located on peripheral region 3 and extends along end surface 30. Second stripe structure portion 7 is located on peripheral region 3 and extends along end surface 30. Second stripe structure portion 7 is located between device region 2 and first stripe structure portion 6. First stripe structure portion 6 is thicker than second stripe structure portion 7. Even though the width of peripheral region 3 is narrowed, first stripe structure portion 6 can prevent occurrence of chipping 32 in device region 2. Semiconductor device 1c of the present embodiment has a structure with which occurrence of chipping 32 can be suppressed in device region 2 and the manufacturing cost of semiconductor device 1c can be reduced.

In semiconductor device 1c of the present embodiment, first stripe structure portion 6 includes a portion of first insulating film 16, and third insulating film 25 provided on the portion of first insulating film 16. Second stripe structure portion 7 includes first insulating film 16. First insulating film 16 is provided on each of device region 2 and peripheral region 3. The portion of first insulating film 16 is provided on peripheral region 3, and extends along end surface 30 in the form of a stripe. Third insulating film 25 extends along end surface 30 in the form of a stripe. Second stripe structure portion 7 separates third insulating film 25 from device region 2. Therefore, even if third insulating film 25 is damaged, this damage can be prevented from reaching device region 2 via third insulating film 25. The structure (for example, electrode film 20) formed on the surface of device region 2 can be suppressed from being damaged. Semiconductor device 1c of the present embodiment has a structure with which occurrence of chipping 32 can be suppressed in device region 2 and the manufacturing cost of semiconductor device 1c can be reduced.

The method for manufacturing semiconductor device 1c in the present embodiment further includes forming (S4) the pair of third insulating films 25 on first insulating film 16 provided on peripheral region 3. The pair of third insulating films 25 are separated from device region 2. Each of the pair of third insulating films 25 extends along the first direction in the form of a stripe. The method for manufacturing semiconductor device 1c in the present embodiment further includes cutting (S3c) wafer 10 along third insulating film 25 using the blade. When cutting wafer 10, at least portions of third insulating films 25 remain adjacent to the both ends of the blade in the width direction thereof.

Even though width $W_1$ of peripheral region 3 of wafer 10 is narrowed, first stripe structure portion 6 including first insulating film 16 and third insulating film 25 on first insulating film 16 can prevent occurrence of chipping 32 in device region 2. According to the method for manufacturing semiconductor device 1c in the present embodiment, occurrence of chipping 32 can be suppressed in device region 2 and the manufacturing cost of semiconductor device 1c can be reduced.

The pair of third insulating films 25 are separated from device region 2. Therefore, even if third insulating film 25 provided between second stripe structure portions 7 is damaged, this damage can be prevented from reaching device region 2 via third insulating film 25. The structure (for example, electrode film 20) formed on the surface of device region 2 can be suppressed from being damaged. According to the method for manufacturing semiconductor device 1c in the present embodiment, occurrence of chipping 32 can be suppressed in device region 2 and the manufacturing cost of semiconductor device 1c can be reduced.

Fourth Embodiment

Figure 18:
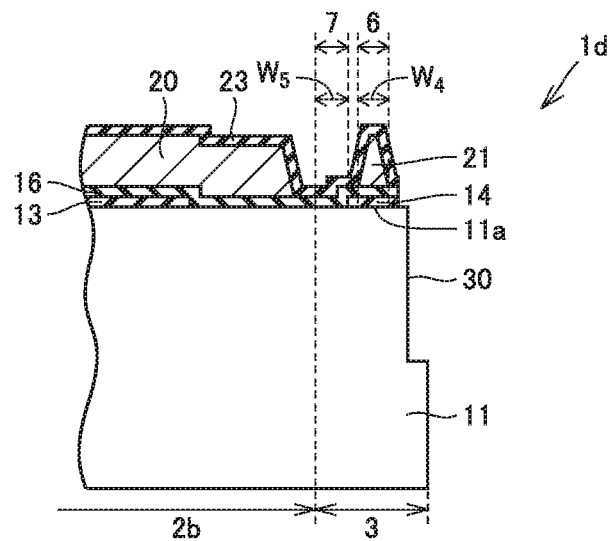
FIG. 18 is a schematic partial enlarged cross sectional view of a semiconductor device according to a fourth embodiment of the present invention.
Figure 19:
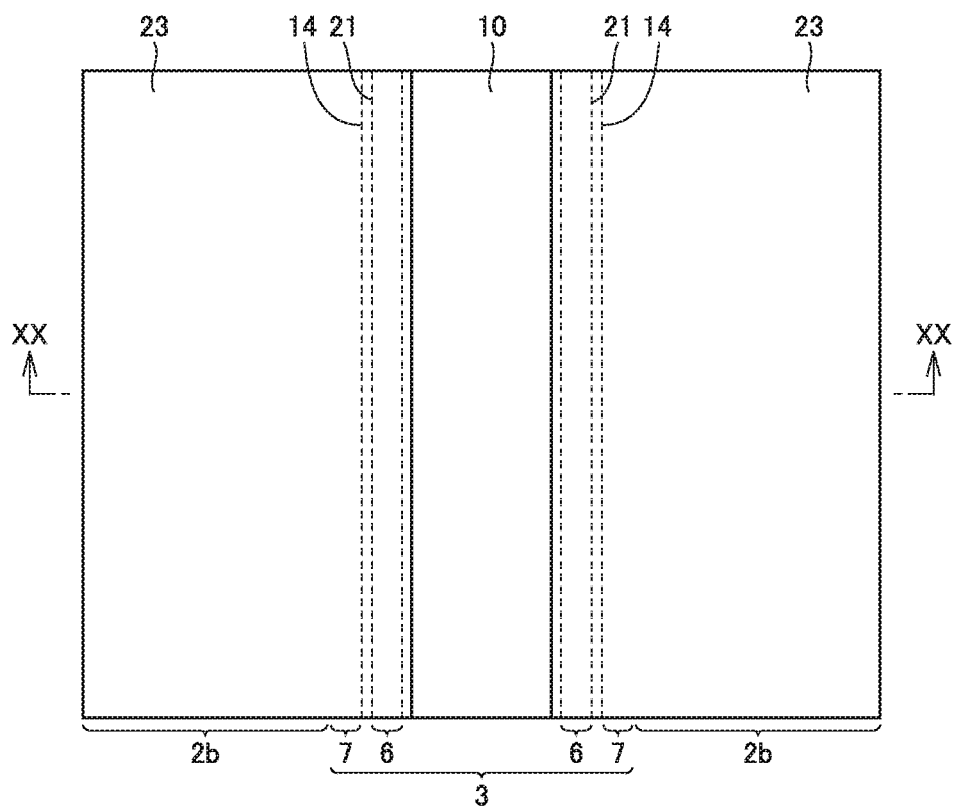
FIG. 19 is a schematic partial enlarged plan view showing one step of a method for manufacturing the semiconductor device according to the fourth embodiment of the present invention.
Figure 20:
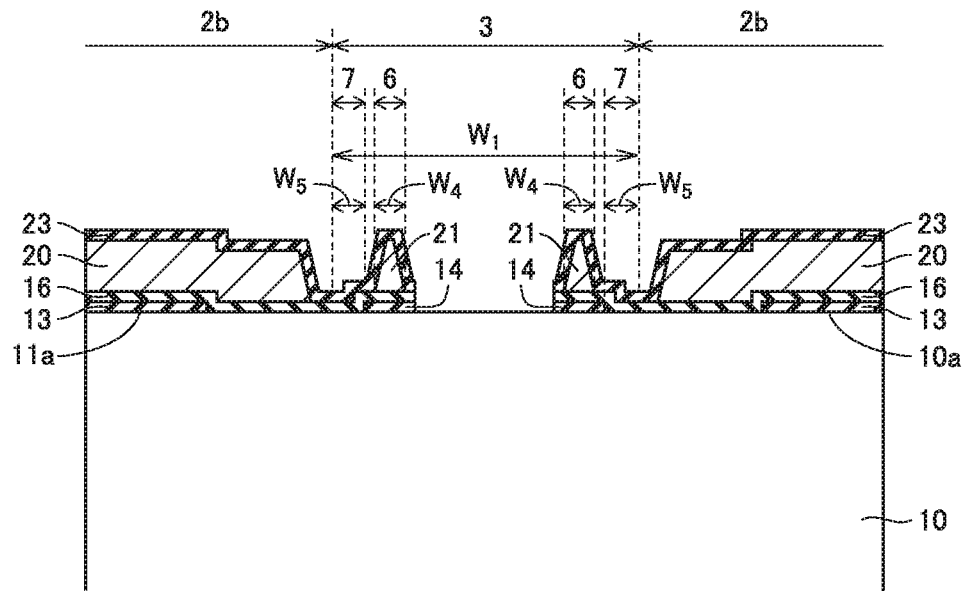
FIG. 20 is a schematic partial enlarged cross sectional view along a cross section line XX-XX shown in FIG. 19 in one step of the method for manufacturing the semiconductor device according to the fourth embodiment of the present invention.

With reference to FIG. 18, a semiconductor device 1d according to a fourth embodiment will be described. Semiconductor device 1d of the present embodiment includes a configuration similar to that of semiconductor device 1c of the third embodiment, but is mainly different therefrom in the following points.

In semiconductor device 1d of the present embodiment, first stripe structure portion 6 includes a fourth insulating film 14, first insulating film 16 provided on fourth insulating film 14, and a first conductive film 21 provided on first insulating film 16. Fourth insulating film 14 is provided on peripheral region 3, and extends along end surface 30 in the form of a stripe. First conductive film 21 extends along end surface 30 in the form of a stripe. In first stripe structure portion 6, fourth insulating film 14, first insulating film 16, and first conductive film 21 are stacked on one another.

Fourth insulating film 14 is provided on peripheral region 3, and extends along end surface 30 in the form of a stripe. Fourth insulating film 14 is separated from device region 2. Fourth insulating film 14 may be composed of the same material as second insulating film 13, or may be composed of a material different therefrom. Fourth insulating film 14 may be a silicon dioxide film, for example.

First conductive film 21 is provided on first insulating film 16, and extends along end surface 30 in the form of a stripe. First conductive film 21 is separated from device region 2. First conductive film 21 may be thicker than first insulating film 16. First conductive film 21 may be composed of the same material as electrode film 20, or may be composed of a material different therefrom. First conductive film 21 may be an AlSi film or Al film, for example.

First stripe structure portion 6 and second stripe structure portion 7 may further include second amorphous insulating film 23. Second amorphous insulating film 23 may cover first conductive film 21. In first stripe structure portion 6, fourth insulating film 14, first insulating film 16, first conductive film 21, and second amorphous insulating film 23 may be stacked on one another. In second stripe structure portion 7, first insulating film 16 and second amorphous insulating film 23 may be stacked on each other.

With reference to FIG. 19 to FIG. 22, the following describes a method for manufacturing semiconductor device 1d according to the fourth embodiment. The method for manufacturing semiconductor device 1d in the present embodiment includes steps similar to those in the method for manufacturing semiconductor device 1c in the third embodiment, but is mainly different therefrom in the following points.

The method for manufacturing semiconductor device 1d in the present embodiment includes forming (S5) a pair of fourth insulating films 14 on peripheral region 3 of main surface 10a of wafer 10. The pair of fourth insulating films 14 may be formed on first insulating film 16 using the chemical vapor deposition (CVD) method, the evaporation method, or the thermal oxidation method, for example. The pair of fourth insulating films 14 are separated from device region 2. Each of the pair of fourth insulating films 14 extends along the first direction in the form of a stripe. The pair of fourth insulating films 14 are separated from each other in the second direction orthogonal to the first direction. A space between the pair of fourth insulating films 14 may be larger than or equal to the thickness of the blade to be used when cutting (S3d) wafer 10. Forming (S5) the pair of fourth insulating films 14 on peripheral region 3 may be performed in the same step as forming second insulating film 13 on the plurality of device regions 2.

The method for manufacturing semiconductor device 1d in the present embodiment includes forming (S1d) first insulating film 16 on peripheral region 3 of main surface 11a surrounding device region 2. Forming (S1d) first insulating film 16 on peripheral region 3 in the present embodiment is basically the same as forming (S1) first insulating film 16 on peripheral region 3 in the first embodiment. First insulating film 16 covers the pair of fourth insulating films 14. Forming (S1d) first insulating film 16 on peripheral region 3 may be performed at the same step as forming first insulating film 16 on the plurality of device regions 2 of wafer 10. In the pair of fourth insulating films 14, main surface 10a of wafer 10 may be exposed through first insulating film 16.

The method for manufacturing semiconductor device 1d in the present embodiment includes forming (S6) a pair of first conductive films 21 on first insulating film 16 provided on peripheral region 3. The pair of first conductive films 21 may be formed on first insulating film 16 using the evaporation method or the like, for example. The pair of first conductive films 21 are separated from device regions 2. Each of the pair of first conductive films 21 extends along the first direction in the form of a stripe. The pair of first conductive films 21 are separated from each other in the second direction orthogonal to the first direction. When main surface 11a is viewed in a plan view, the pair of first conductive films 21 overlap with the pair of fourth insulating films 14. A space between the pair of first conductive films 21 may be larger than or equal to the thickness of the blade to be used when cutting (S3d) wafer 10. Forming (S6) the pair of first conductive films 21 may be performed in the same step as forming electrode films 20 on the plurality of device regions 2.

First stripe structure portion 6 includes fourth insulating film 14, first insulating film 16 on fourth insulating film 14, and first conductive film 21 on first insulating film 16. Second stripe structure portion 7 includes first insulating film 16, but does not include fourth insulating film 14 and first conductive film 21. A portion of peripheral region 3 between the pair of first conductive films 21 and between the pair of fourth insulating films 14 also does not include fourth insulating film 14 and first conductive film 21.

The method for manufacturing semiconductor device 1d in the present embodiment includes cutting (S3d) wafer 10 along fourth insulating films 14 and first conductive films 21 using the blade. When cutting (S3d) wafer 10, the blade is brought into contact with wafer 10 between the pair of fourth insulating films 14 and between the pair of first conductive films 21. Wafer 10 between the pair of fourth insulating films 14 and between the pair of first conductive films 21 is cut using the blade. When cutting (S3d) wafer 10, at least portions of fourth insulating films 14 and at least portions of first conductive films 21 remain adjacent to the both ends of the blade in the width direction thereof. Specifically, when cutting (S3d) wafer 10, the whole of fourth insulating films 14 and the whole of first conductive films 21 may remain adjacent to the both ends of the blade in the width direction thereof.

When cutting (S3d) wafer 10, the blade is brought into contact with main surface 10a of wafer 10 between the pair of first conductive films 21 and between the pair of fourth insulating films 14. Fourth insulating film 14 and first conductive film 21 are not formed on main surface 10a of wafer 10 between the pair of first conductive films 21 and between the pair of fourth insulating films 14. On the other hand, not only first insulating film 16 but also fourth insulating film 14 and first conductive film 21 are formed on main surface 10a of wafer 10 in first stripe structure portion 6. Mechanical energy required to chip the portion of wafer 10 on which first stripe structure portion 6 is formed is larger than mechanical energy required to chip the portion of wafer 10 located between the pair of first conductive films 21 and between the pair of fourth insulating films 14. Therefore, even if a crack is generated near the portion of wafer 10 with which the blade is brought into contact when cutting (S3d) wafer 10, first stripe structure portion 6 can prevent this crack from reaching device region 2.

Figure 21:
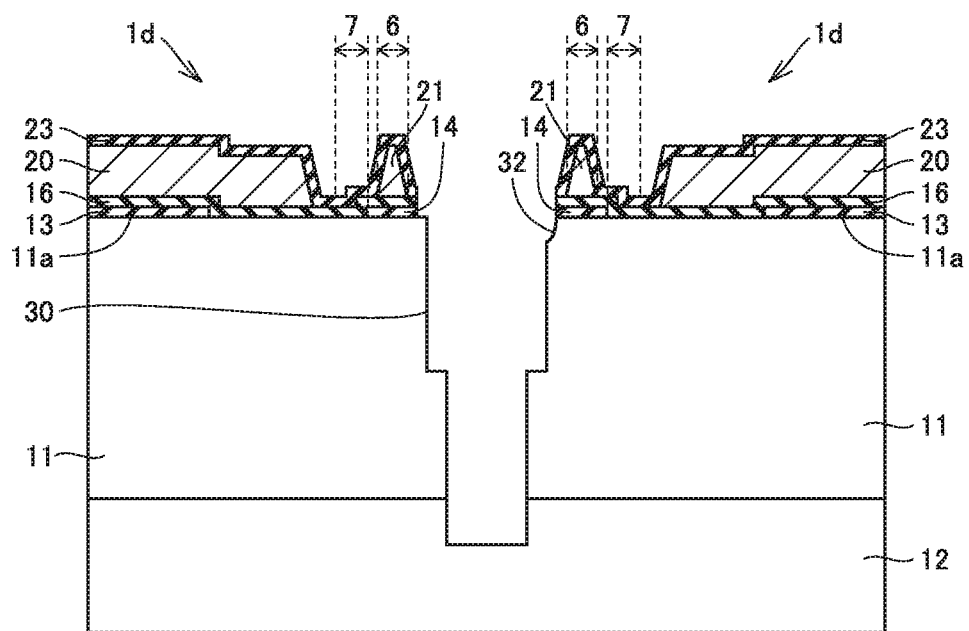
FIG. 21 is a schematic partial enlarged cross sectional view showing a step subsequent to the step shown in FIG. 20 in the method for manufacturing the semiconductor device according to the fourth embodiment of the present invention.
Figure 22:
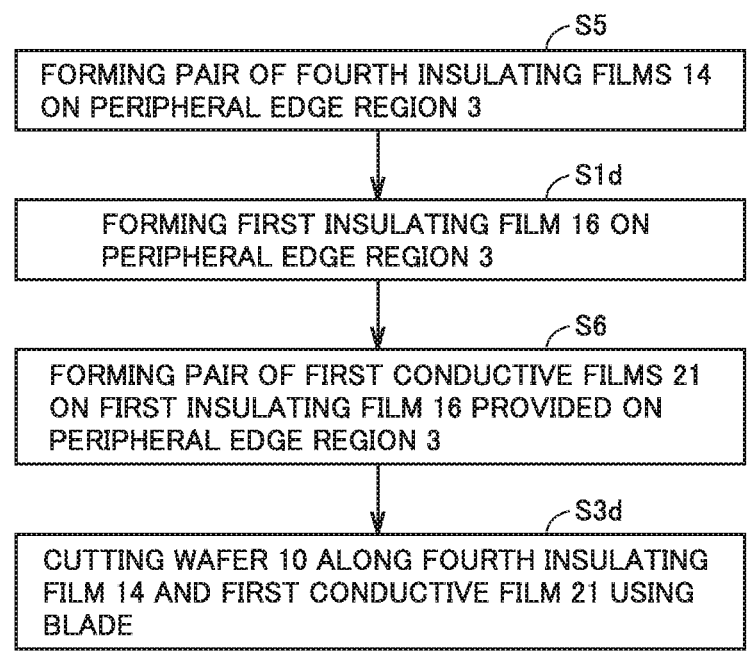
FIG. 22 shows a flowchart of the method for manufacturing the semiconductor device according to the fourth embodiment of the present invention.

Thus, as shown in semiconductor device 1d on the right-hand side of FIG. 21, even though width $W_1$ of peripheral region 3 of wafer 10 is narrowed, occurrence of chipping 32 can be prevented in device region 2. Since width $W_1$ of peripheral region 3 of wafer 10 can be narrowed, a yield of semiconductor devices 1d obtained from one wafer 10 is increased, thus reducing the manufacturing cost of semiconductor device 1d.

Further, fourth insulating film 14 and first conductive film 21 are separated from device region 2. In second stripe structure portion 7, fourth insulating film 14 and first conductive film 21 are not formed. Therefore, even if fourth insulating film 14 and first conductive film 21 provided between second stripe structure portions 7 are damaged when cutting (S3d) wafer 10, this damage can be prevented from reaching device region 2 via fourth insulating film 14 and first conductive film 21. The structure (for example, electrode film 20) formed on the surface of device region 2 can be suppressed from being damaged.

Semiconductor device 1d and the method for manufacturing semiconductor device 1d in the present embodiment exhibit the same effects as those of semiconductor device 1c and the method for manufacturing semiconductor device 1c in the third embodiment as described below. In semiconductor device 1d of the present embodiment, first stripe structure portion 6 includes fourth insulating film 14, first insulating film 16 provided on fourth insulating film 14, and first conductive film 21 provided on first insulating film 16. Fourth insulating film 14 is provided on peripheral region 3, and extends along end surface 30 in the form of a stripe. First conductive film 21 extends along end surface 30 in the form of a stripe. First stripe structure portion 6 can prevent occurrence of chipping 32 in device region 2. Semiconductor device 1d of the present embodiment has a structure with which occurrence of chipping 32 can be suppressed in device region 2 and the manufacturing cost of semiconductor device 1d can be reduced.

Second stripe structure portion 7 separates fourth insulating film 14 and first conductive film 21 from device region 2. Therefore, even if fourth insulating film 14 and first conductive film 21 are damaged, this damage can be prevented from reaching device region 2 via fourth insulating film 14 and first conductive film 21. The structure (for example, electrode film 20) formed on the surface of device region 2 can be suppressed from being damaged. Semiconductor device 1d of the present embodiment has a structure with which occurrence of chipping 32 can be suppressed in device region 2 and the manufacturing cost of semiconductor device 1d can be reduced.

The method for manufacturing semiconductor device 1d in the present embodiment further includes forming (S5) the pair of fourth insulating films 14 on peripheral region 3 of main surface 10a of wafer 10. The pair of fourth insulating films 14 are disposed on peripheral region 3 and are separated from device region 2. The pair of fourth insulating films 14 extend along the first direction in the form of stripes. The method for manufacturing semiconductor device 1d in the present embodiment includes forming (S1d) first insulating film 16 on fourth insulating film 14 provided on peripheral region 3. First insulating film 16 covers fourth insulating film 14. The method for manufacturing semiconductor device 1d in the present embodiment includes forming (S6) the pair of first conductive films 21 on first insulating film 16. The pair of first conductive films 21 are disposed on peripheral region 3 and are separated from device region 2. Each of the pair of first conductive films 21 extends along the first direction in the form of a stripe. When main surface 11a is viewed in a plan view, the pair of first conductive films 21 overlap with the pair of fourth insulating films 14. The method for manufacturing semiconductor device 1d in the present embodiment includes cutting (S3d) wafer 10 along fourth insulating films 14 and first conductive films 21 using the blade. When cutting (S3d) wafer 10, at least portions of fourth insulating films 14 and at least portions of first conductive films 21 remain adjacent to the both ends of the blade in the width direction thereof.

Even though width $W_1$ of peripheral region 3 of wafer 10 is narrowed, first stripe structure portion 6 including fourth insulating film 14, first insulating film 16 on fourth insulating film 14, and first conductive film 21 on first insulating film 16 can prevent occurrence of chipping 32 in device region 2. According to the method for manufacturing semiconductor device 1d in the present embodiment, occurrence of chipping 32 can be suppressed in device region 2 and the manufacturing cost of semiconductor device 1d can be reduced.

The pair of fourth insulating films 14 and the pair of first conductive films 21 are separated from device region 2. Therefore, even if fourth insulating films 14 and first conductive films 21 provided between second stripe structure portions 7 are damaged, this damage can be prevented from reaching device region 2 via fourth insulating films 14 and first conductive films 21. The structure (for example, electrode film 20) formed on the surface of device region 2 can be suppressed from being damaged. According to the method for manufacturing semiconductor device 1d in the present embodiment, occurrence of chipping 32 can be suppressed in device region 2 and the manufacturing cost of semiconductor device 1d can be reduced.

Fifth Embodiment

Figure 23:
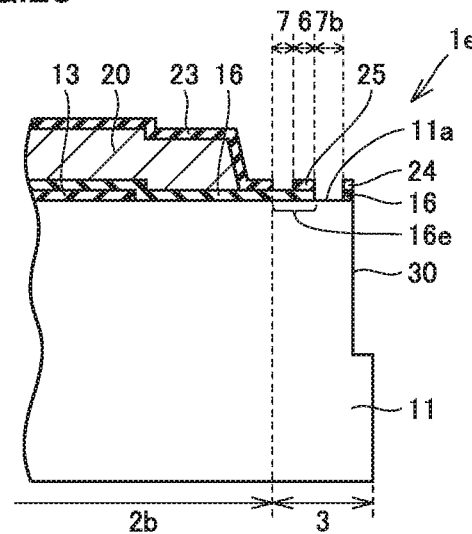
FIG. 23 is a schematic partial enlarged cross sectional view of a semiconductor device according to a fifth embodiment of the present invention.

With reference to FIG. 23, a semiconductor device 1e according to a fifth embodiment will be described. Semiconductor device 1e of the present embodiment includes a configuration similar to that of semiconductor device 1b of the second embodiment, but is mainly different therefrom in the following points.

Semiconductor device 1e of the present embodiment further includes third insulating film 25 provided on first insulating film 16 provided on peripheral region 3. Third insulating film 25 is provided between device region 2 and first amorphous insulating film 24. Third insulating film 25 is separated from device region 2 and first amorphous insulating film 24. Third insulating film 25 extends along end surface 30 in the form of a stripe. Third insulating film 25 of the present embodiment is composed of the same material as that of third insulating film 25 of the third embodiment.

In semiconductor device 1e of the present embodiment, between third insulating film 25 and first amorphous insulating film 24, first insulating film 16 provided under first amorphous insulating film 24 may be separated from first insulating film 16 provided under third insulating film 25. Between third insulating film 25 and first amorphous insulating film 24, main surface 11a of substrate 11 may be exposed through first insulating film 16, first amorphous insulating film 24, and third insulating film 25. Substrate 11 may have exposed main surface 11a between first insulating film 16 provided under first amorphous insulating film 24 and first insulating film 16 provided under third insulating film 25. First insulating film 16 provided under first amorphous insulating film 24 may extend along end surface 30 in the form of a stripe. First insulating film 16 provided under first amorphous insulating film 24 may be flush with end surface 30.

First stripe structure portion 6 includes a portion (16e) of first insulating film 16 and third insulating film 25 provided on the portion (16e) of first insulating film 16. First stripe structure portion 6 is thicker than second stripe structure portions 7, 7b located adjacent to the both sides of first stripe structure portion 6. Second stripe structure portion 7 is adjacent to first stripe structure portion 6 and is located between first stripe structure portion 6 and device region 2. Second stripe structure portion 7 may include first insulating film 16 provided on peripheral region 3, but does not include third insulating film 25. Second stripe structure portion 7 may not include first insulating film 16, and main surface 11a may be exposed through first insulating film 16 and third insulating film 25.

Second stripe structure portion 7b is adjacent to first stripe structure portion 6, and is located between first stripe structure portion 6 and end surface 30. Second stripe structure portion 7b does not include first insulating film 16 and third insulating film 25, and main surface 11a is exposed through first insulating film 16 and third insulating film 25. Second stripe structure portion 7b does not include third insulating film 25, but may include first insulating film 16 provided on peripheral region 3.

With reference to FIG. 24 to FIG. 27, the following describes a method for manufacturing semiconductor device 1e according to the fifth embodiment. The method for manufacturing semiconductor device 1e in the present embodiment includes steps similar to those in the method for manufacturing semiconductor device 1b in the second embodiment, but is mainly different therefrom in the following points.

Figure 24:
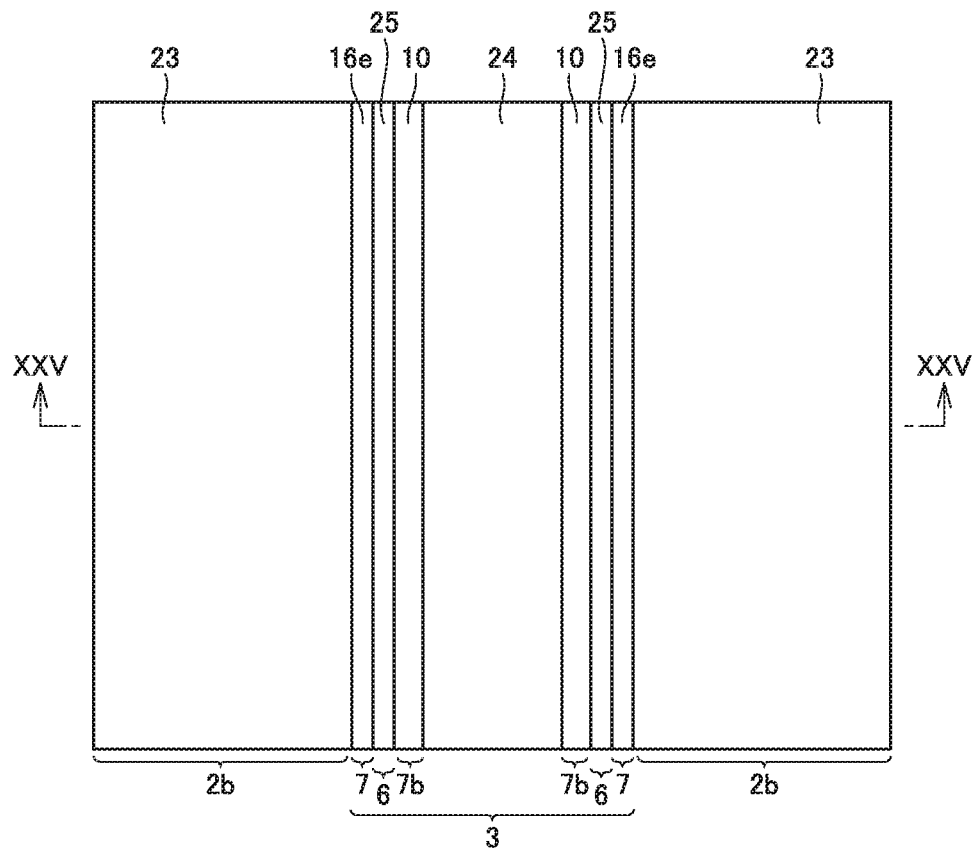
FIG. 24 is a schematic partial enlarged plan view showing one step of a method for manufacturing the semiconductor device according to the fifth embodiment of the present invention.
Figure 25:
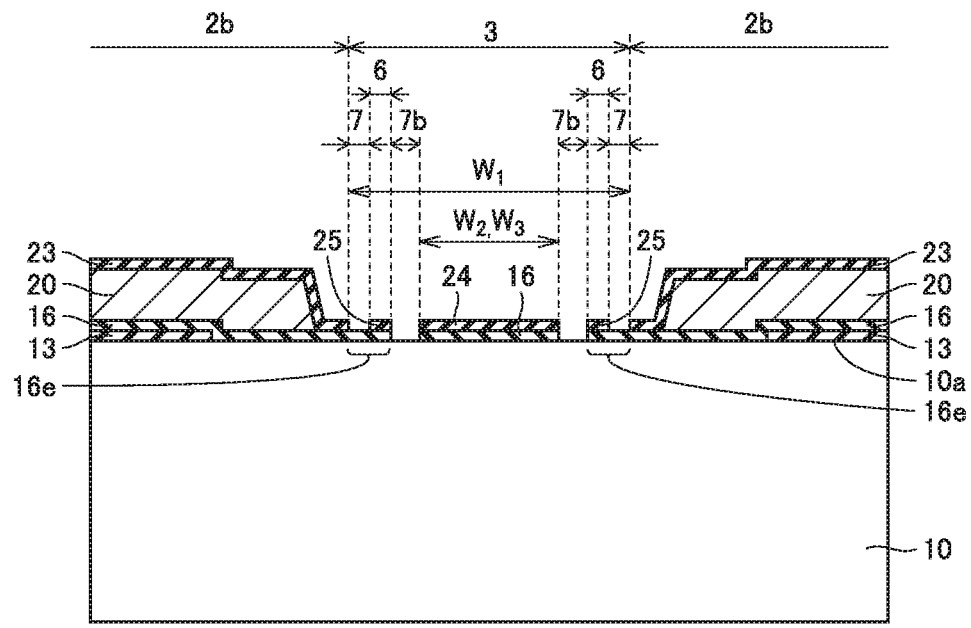
FIG. 25 is a schematic partial enlarged cross sectional view along a cross section line XXV-XXV shown in FIG. 24 in one step of the method for manufacturing the semiconductor device according to the fifth embodiment of the present invention.
Figure 26:
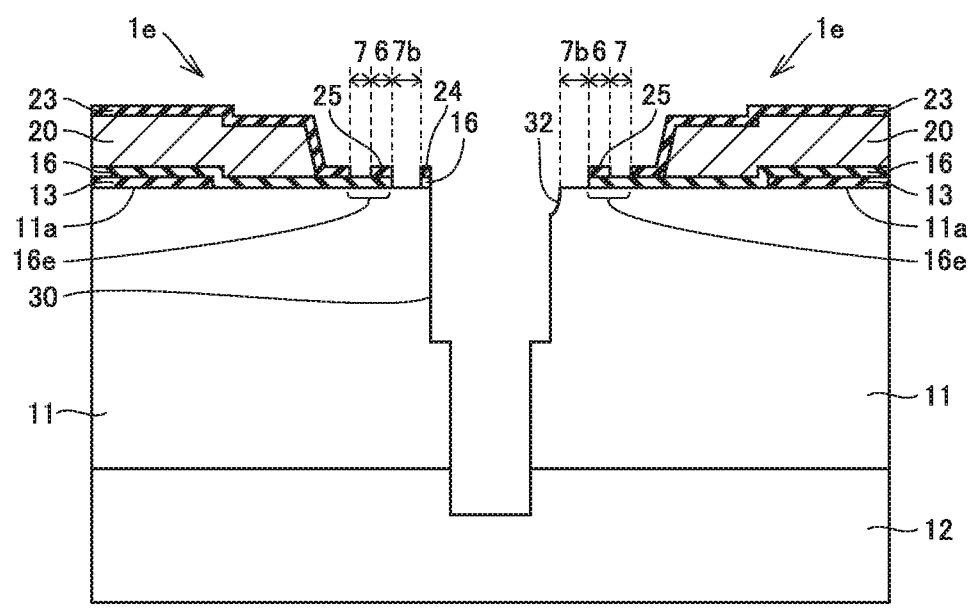
FIG. 26 is a schematic partial enlarged cross sectional view showing a step subsequent to the step shown in FIG. 25 in the method for manufacturing the semiconductor device according to the fifth embodiment of the present invention.
Figure 27:
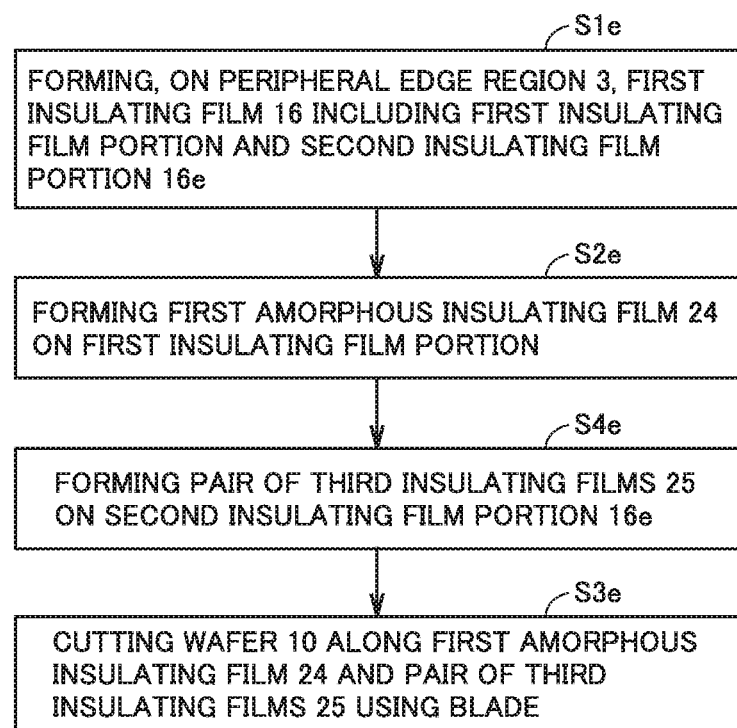
FIG. 27 shows a flowchart of the method for manufacturing the semiconductor device according to the fifth embodiment of the present invention.

With reference to FIG. 24, FIG. 25 and FIG. 27, the method for manufacturing semiconductor device 1e in the present embodiment includes forming (S1e) first insulating film 16 on peripheral region 3 of main surface 10a of wafer 10. Forming (S1e) first insulating film 16 in the present embodiment is basically the same as forming (S1) first insulating film 16 in the first embodiment. First insulating film 16 formed on peripheral region 3 extends along the first direction in the form of a stripe. First insulating film 16 formed on peripheral region 3 includes: a first insulating film portion (16) extending along the first direction in the form of a stripe; and second insulating film portions 16e each extending along the first direction in the form of a stripe. Each of second insulating film portion 16e is disposed between the first insulating film portion (16) and device region 2. The first insulating film portion (16) may be separated from second insulating film portion 16e. Second insulating film portion 16e may be in one piece with first insulating film 16 provided on device region 2. Width $W_3$ of the first insulating film portion (16) is smaller than width $W_1$ of peripheral region 3.

With reference to FIG. 24, FIG. 25 and FIG. 27, the method for manufacturing semiconductor device 1e in the present embodiment includes forming (S2e) first amorphous insulating film 24 on the first insulating film portion (16). Forming (S2e) first amorphous insulating film 24 in the present embodiment is basically the same as forming (S2) first amorphous insulating film 24 in the first embodiment. First amorphous insulating film 24 is disposed on peripheral region 3, and is separated from device region 2. First amorphous insulating film 24 extends along the first direction in the form of a stripe. Width $W_2$ of first amorphous insulating film 24 is smaller than width $W_1$ of peripheral region 3. Width $W_2$ of first amorphous insulating film 24 may be equal to width $W_3$ of the first insulating film portion (16), or may be smaller than width $W_3$ of the first insulating film portion (16). Forming (S2e) first amorphous insulating film 24 may be performed in the same step as forming second amorphous insulating film 23 on the plurality of device regions 2.

The method for manufacturing semiconductor device 1e in the present embodiment further includes forming (S4e) a pair of third insulating films 25 on second insulating film portions 16e. Forming (S4e) third insulating films 25 in the present embodiment is basically the same as forming (S4) third insulating films 25 in the third embodiment. The pair of third insulating films 25 are disposed in peripheral region 3, and are separated from device regions 2 and first amorphous insulating film 24. Each of the pair of third insulating films 25 extends along the first direction in the form of a stripe. The pair of third insulating films 25 are separated from each other in the second direction orthogonal to the first direction. A space between the pair of third insulating films 25 is larger than the thickness of the blade to be used when cutting (S3e) wafer 10. Forming (S4e) the pair of third insulating films 25 on second insulating film portions 16e may be performed in the same step as forming (S2e) first amorphous insulating film 24 on the first insulating film portion (16). Forming (S4e) the pair of third insulating films 25 on second insulating film portions 16e may be performed in the same step as forming second amorphous insulating films 23 on the plurality of device regions 2.

The method for manufacturing semiconductor device 1e in the present embodiment further includes cutting (S3e) wafer 10 along first amorphous insulating film 24 and the pair of third insulating films 25 using the blade. When cutting (S3e) wafer 10, the central portion of first amorphous insulating film 24 and the central portion of the first insulating film portion (16) are removed, whereas the end portions of first amorphous insulating film 24 and the end portions of the first insulating film portion (16) remain adjacent to the both ends of the blade in the width direction thereof. Therefore, each of first amorphous insulating film 24 and the first insulating film portion (16) extends along end surface 30 of semiconductor device 1e in the form of a stripe and is flush with end surface 30 of substrate 11. When cutting (S3e) wafer 10, at least portions of the pair of third insulating films 25 remain adjacent to the both ends of the blade in the width direction thereof. Specifically, when cutting (S3e) wafer 10, the whole of the pair of third insulating films 25 may remain adjacent to the both ends of the blade in the width direction thereof.

As with first amorphous insulating film 24 in the first embodiment, first amorphous insulating film 24 in the present embodiment can prevent occurrence of chipping 32 in device region 2 even though width $W_1$ of peripheral region 3 of wafer 10 is narrowed. Further, as with first stripe structure portion 6 in the third embodiment, first stripe structure portion 6 in the present embodiment can prevent occurrence of chipping 32 in device region 2 even though width $W_1$ of peripheral region 3 of wafer 10 is narrowed.

Second stripe structure portions 7, 7b thinner than first stripe structure portion 6 are formed adjacent to the both sides of first stripe structure portion 6. Therefore, even if at least one of the first insulating film portion (16) and third insulating film 25 is damaged when cutting (S3e) wafer 10, this damage can be prevented from reaching device region 2 via at least one of the first insulating film portion (16) and third insulating film 25. The structure (for example, electrode film 20) formed on the surface of device region 2 can be suppressed from being damaged.

In addition to the effects of semiconductor device 1 and the method for manufacturing semiconductor device 1 in the first embodiment, semiconductor device 1e and the method for manufacturing semiconductor device 1e in the present embodiment exhibit the effects of semiconductor device 1c and the method for manufacturing semiconductor device 1c in the third embodiment as described below.

Semiconductor device 1e of the present embodiment further includes third insulating film 25 provided on first insulating film 16 provided on peripheral region 3. Third insulating film 25 is provided between device region 2 and first amorphous insulating film 24. Third insulating film 25 is separated from device region 2 and first amorphous insulating film 24. Third insulating film 25 extends along end surface 30 in the form of a stripe. First amorphous insulating film 24, and first stripe structure portion 6 including first insulating film 16 and third insulating film 25 stacked on first insulating film 16 can prevent occurrence of chipping 32 in device region 2 even though the width of the peripheral region is narrowed. Semiconductor device 1e of the present embodiment has a structure with which occurrence of chipping 32 can be suppressed in device region 2 and the manufacturing cost of semiconductor device 1e can be reduced.

The method for manufacturing semiconductor device 1e in the present embodiment includes forming (S1e) first insulating film 16 on peripheral region 3 of main surface 10a of wafer 10. First insulating film 16 formed on peripheral region 3 includes: the first insulating film portion (16) extending along the first direction in the form of a stripe; and second insulating film portions 16e each extending along the first direction in the form of a stripe. Each of second insulating film portions 16e is disposed between the first insulating film portion (16) and device region 2. The method for manufacturing semiconductor device 1e in the present embodiment includes forming (S2e) first amorphous insulating film 24 on the first insulating film portion (16). First amorphous insulating film 24 is disposed on peripheral region 3 and is separated from device region 2. First amorphous insulating film 24 extends along the first direction in the form of a stripe.

The method for manufacturing semiconductor device 1e in the present embodiment further includes forming (S4e) the pair of third insulating films 25 on second insulating film portions 16e. The pair of third insulating films 25 are disposed on peripheral region 3, and are separated from device regions 2 and first amorphous insulating film 24. Each of third insulating films 25 extends along the first direction in the form of a stripe. The method for manufacturing semiconductor device 1e in the present embodiment further includes cutting (S3e) wafer 10 along first amorphous insulating film 24 and third insulating films 25 using the blade. When cutting (S3e) wafer 10, the central portion of first amorphous insulating film 24 and the central portion of the first insulating film portion (16) are removed, whereas the end portions of first amorphous insulating film 24 and the end portions of the first insulating film portion (16) remain adjacent to the both ends of the blade in the width direction thereof.

First amorphous insulating film 24, and first stripe structure portion 6 including first insulating film 16 and third insulating film 25 stacked on first insulating film 16 can prevent occurrence of chipping 32 in device region 2 when cutting (S3e) wafer 10 even though width $W_1$ of peripheral region 3 of wafer 10 is narrowed. According to the method for manufacturing semiconductor device 1e in the present embodiment, occurrence of chipping 32 can be suppressed in device region 2 and the manufacturing cost of semiconductor device 1e can be reduced.

Sixth Embodiment

Figure 28:
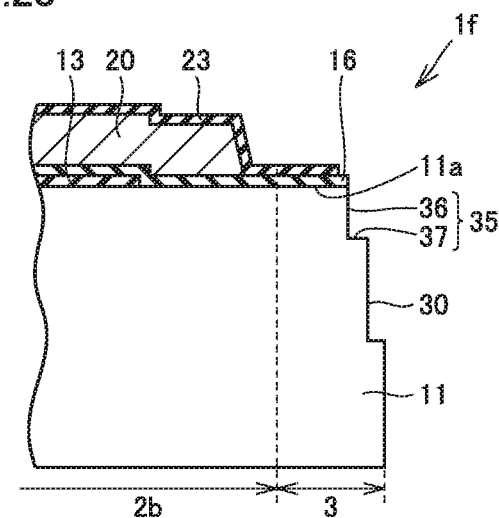
FIG. 28 is a schematic partial enlarged cross sectional view of a semiconductor device according to a sixth embodiment of the present invention.
Figure 29:
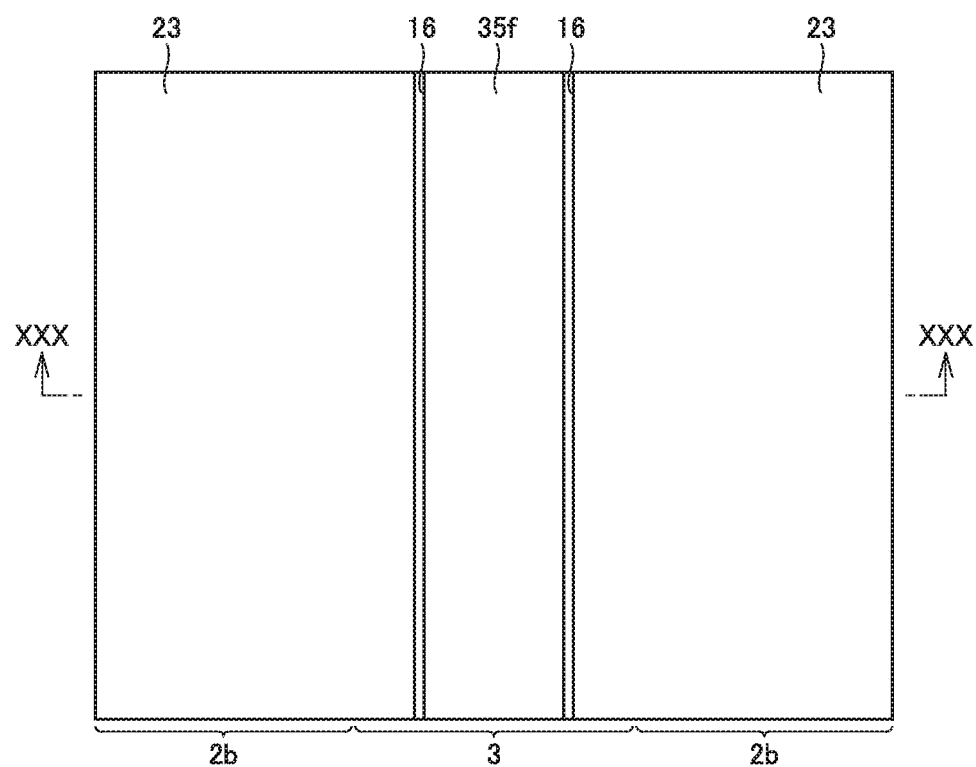
FIG. 29 is a schematic partial enlarged plan view showing one step of a method for manufacturing the semiconductor device according to the sixth embodiment of the present invention.
Figure 30:
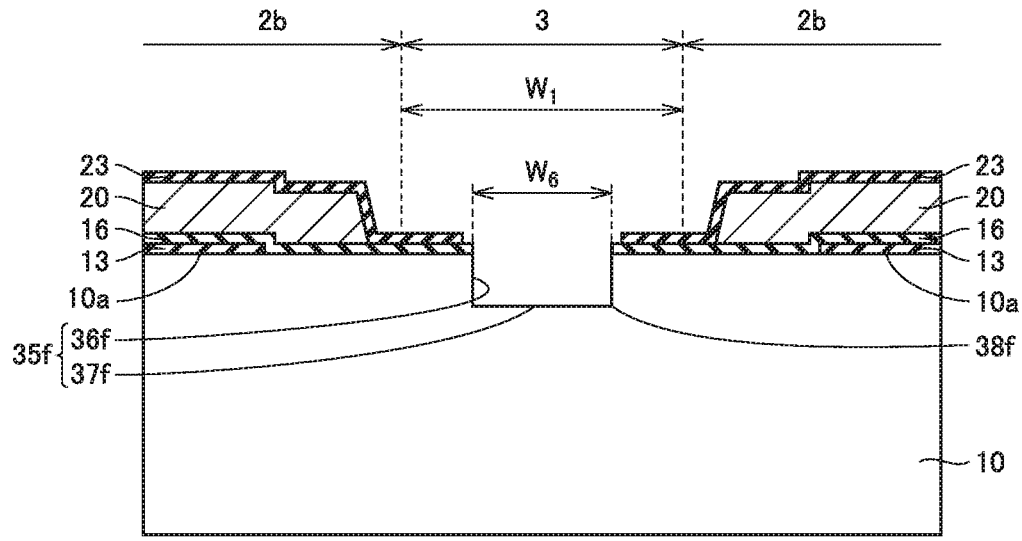
FIG. 30 is a schematic partial enlarged cross sectional view along a cross section line XXX-XXX shown in FIG. 29 in one step of the method for manufacturing the semiconductor device according to the sixth embodiment of the present invention.
Figure 31:
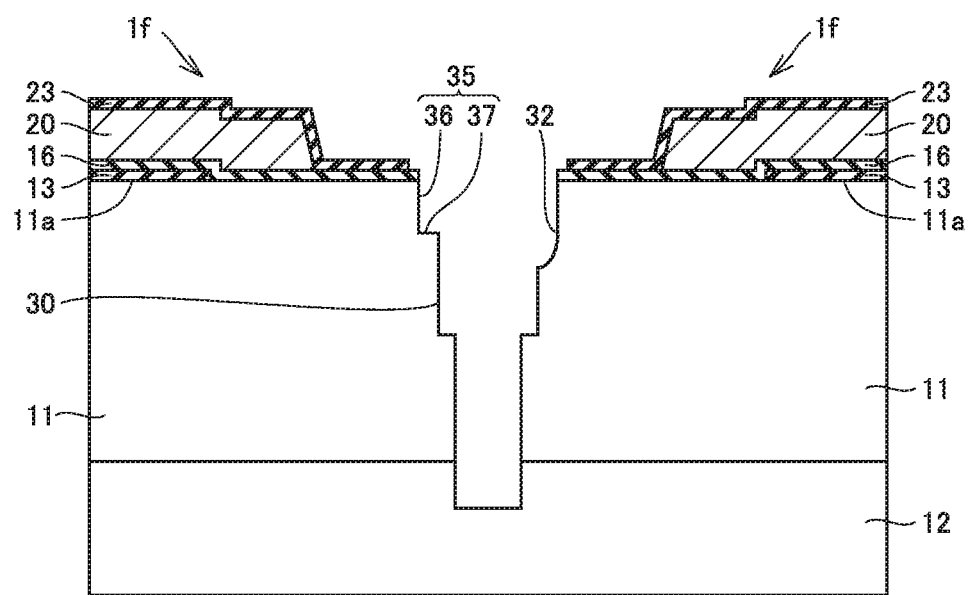
FIG. 31 is a schematic partial enlarged cross sectional view showing a step subsequent to the step shown in FIG. 30 in the method for manufacturing the semiconductor device according to the sixth embodiment of the present invention.
Figure 32:
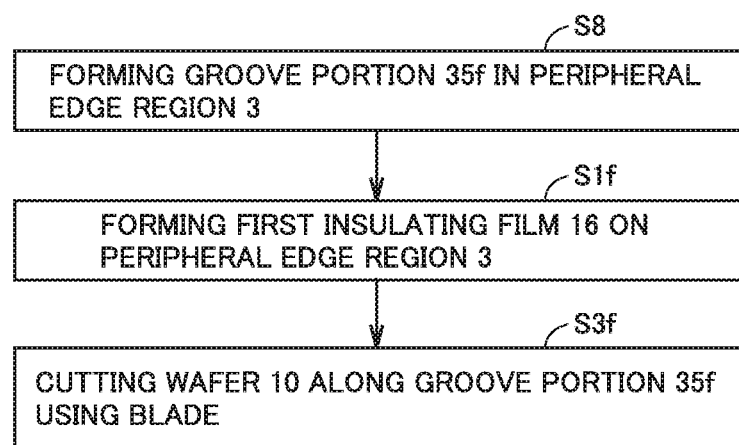
FIG. 32 shows a flowchart of the method for manufacturing the semiconductor device according to the sixth embodiment of the present invention.

With reference to FIG. 28, a semiconductor device if according to a sixth embodiment will be described. Semiconductor device 1f of the present embodiment includes a configuration similar to that of semiconductor device 1 of the first embodiment, but is mainly different therefrom in the following points.

In semiconductor device if of the present embodiment, substrate 11 includes main surface 11a and end surface 30 and is provided with a notch portion 35 connected to main surface 11a and end surface 30. Notch portion 35 includes: a side surface 36 connected to main surface 11a; and a bottom surface 37 connected to side surface 36 and end surface 30. Notch portion 35 is constituted of only the exposed surface of substrate 11.

With reference to FIG. 29 to FIG. 32, the following describes a method for manufacturing semiconductor device 1f according to the sixth embodiment. The method for manufacturing semiconductor device 1f in the present embodiment includes steps similar to those in the method for manufacturing semiconductor device 1 in the first embodiment, but is mainly different therefrom in the following points.

The method for manufacturing semiconductor device if in the present embodiment includes forming (S8) a groove portion 3M in peripheral region 3 of main surface 10a of wafer 10. Groove portion 3M may be formed by etching a portion of peripheral region 3 of wafer 10. Groove portion 35f is separated from device region 2. Groove portion 35f extends along the first direction in the form of a stripe. Groove portion 35f includes: a side surface 36f connected to main surface 11a; and a bottom surface 37f connected to side surface 36f. Groove portion 35f is constituted of only the exposed surface of substrate 11. Width $W_6$ of groove portion 35f is smaller than width $W_1$ of peripheral region 3. Width $W_6$ of groove portion 3M is larger than the maximum width of the blade used when cutting (S3f) wafer 10.

The method for manufacturing semiconductor device if in the present embodiment may include forming (S1f) first insulating films 16 on peripheral region 3 of main surface 10a of wafer 10. Forming (S1f) first insulating films 16 in the present embodiment is basically the same as forming (S1) first insulating film 16 in the first embodiment. First insulating films 16 are provided on main surface 10a of wafer 10 to be located adjacent to the both sides of groove portion 35f.

The method for manufacturing semiconductor device if in the present embodiment includes cutting (S3f) wafer 10 along groove portion 35f using the blade. When cutting (S3f) wafer 10, the central portion of groove portion 35f is removed in the width direction of groove portion 35f orthogonal to the first direction, whereas a portion of groove portion 35f remains, as notch portion 35, adjacent to the both ends of the blade in the width direction thereof.

When cutting (S3f) wafer 10, the blade is brought into contact with bottom surface 37f of groove portion 35f. Accordingly, stress applied from the blade to substrate 11 is concentrated on a corner portion 38f of groove portion 35f at which side surface 36f and bottom surface 37f cross. Therefore, even if chipping 32 occurs in substrate 11 when cutting (S3f) wafer 10 as shown in semiconductor device if on the right-hand side of FIG. 31, this chipping 32 selectively occurs in a region of substrate 11 near corner portion 38f of groove portion 35f. Therefore, even though width $W_1$ of peripheral region 3 of wafer 10 is narrowed, occurrence of chipping 32 can be prevented in device region 2. Since width $W_1$ of peripheral region 3 of wafer 10 can be narrowed, a yield of semiconductor devices if obtained from one wafer 10 is increased, thus reducing the manufacturing cost of semiconductor device 1f.

Semiconductor device if and the method for manufacturing semiconductor device 1f in the present embodiment exhibit effects similar to those in semiconductor device 1 and the method for manufacturing semiconductor device 1 in the first embodiment, but is mainly different therefrom in the following points.

Semiconductor device if of the present embodiment includes substrate 11. Substrate 11 has main surface 11a and end surface 30 and is provided with notch portion 35. Main surface 11a includes peripheral region 3 and device region 2 surrounded by peripheral region 3. Notch portion 35 includes: side surface 36 connected to main surface 11a; and bottom surface 37 connected to side surface 36 and end surface 30. Notch portion 35 is constituted of only the exposed surface of substrate 11. Even though the width of peripheral region 3 is narrowed, notch portion 35 can prevent occurrence of chipping 32 in device region 2. Semiconductor device if of the present embodiment has a structure with which occurrence of chipping 32 can be suppressed in device region 2 and the manufacturing cost of semiconductor device if can be reduced.

The method for manufacturing semiconductor device if in the present embodiment includes forming (S8) groove portion 35f in peripheral region 3 of main surface 10a of wafer 10. Groove portion 35f is separated from device region 2. Groove portion 35f extends along the first direction in the form of a stripe. Groove portion 35f includes: side surface 36f connected to main surface 11a; and bottom surface 37f connected to side surface 36f. Groove portion 35f is constituted of only the exposed surface of substrate 11. The method for manufacturing semiconductor device if in the present embodiment includes cutting (S3f) wafer 10 along groove portion 35f using the blade. When cutting (S3f) wafer 10, the central portion of groove portion 35f is removed in the width direction of groove portion 35f orthogonal to the first direction, whereas a portion of groove portion 35f remains, as notch portion 35, adjacent to the both ends of the blade in the width direction thereof.

Even though width $W_1$ of peripheral region 3 of wafer 10 is narrowed, groove portion 35f can prevent occurrence of chipping 32 in device region 2. According to the method for manufacturing semiconductor device if in the present embodiment, occurrence of chipping 32 can be suppressed in device region 2 and the manufacturing cost of semiconductor device if can be reduced.

Seventh Embodiment

Figure 33:
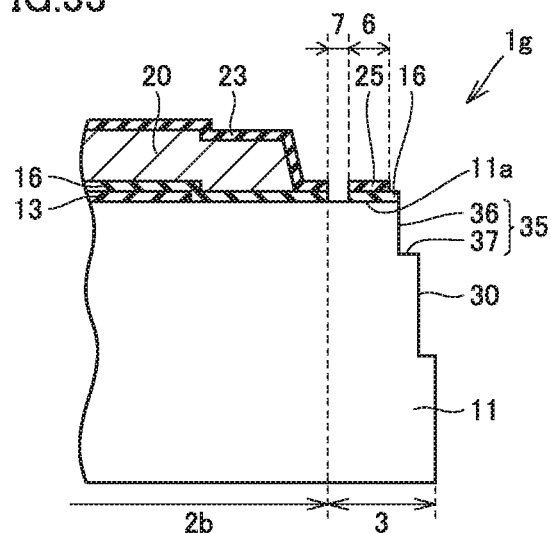
FIG. 33 is a schematic partial enlarged cross sectional view of a semiconductor device according to a seventh embodiment of the present invention.

With reference to FIG. 33, a semiconductor device 1g according to a seventh embodiment will be described. Semiconductor device 1g of the present embodiment includes a configuration similar to that of semiconductor device 1f of the sixth embodiment, but is mainly different therefrom in the following points.

Semiconductor device 1g of the present embodiment further includes first insulating film 16 and third insulating film 25. First insulating film 16 is provided on each of device region 2 and peripheral region 3. Third insulating film 25 is provided on first insulating film 16 provided on peripheral region 3. Third insulating film 25 is provided between device region 2 and notch portion 35. Third insulating film 25 is separated from device region 2. Third insulating film 25 extends along end surface 30 in the form of a stripe. Third insulating film 25 of the present embodiment is composed of the same material as that of third insulating film 25 of each of the third embodiment and the fifth embodiment.

Between device region 2 and third insulating film 25, first insulating film 16 provided under third insulating film 25 may be separated from first insulating film 16 provided on device region 2. Between first insulating film 16 provided under third insulating film 25 and first insulating film 16 provided on device region 2, substrate 11 may be exposed from first insulating film 16. Substrate 11 may have exposed main surface 11a between first insulating film 16 provided under third insulating film 25 and first insulating film 16 provided on device region 2. First insulating film 16 provided under third insulating film 25 may extend along notch portion 35 in the form of a stripe. First insulating film 16 provided under third insulating film 25 may be flush with end surface 30.

First stripe structure portion 6 is thicker than second stripe structure portion 7. First stripe structure portion 6 includes third insulating film 25 and first insulating film 16 provided under third insulating film 25. Second stripe structure portion 7 does not include first insulating film 16 and third insulating film 25. In second stripe structure portion 7, main surface 11a of substrate 11 may be exposed through first insulating film 16 and third insulating film 25. Second stripe structure portion 7 does not include third insulating film 25, but may include first insulating film 16.

With reference to FIG. 34 to FIG. 37, the following describes a method for manufacturing semiconductor device 1g according to the seventh embodiment. The method for manufacturing semiconductor device 1g in the present embodiment includes steps similar to those in the method for manufacturing semiconductor device 1f in the sixth embodiment, but is mainly different therefrom in the following points.

Figure 34:
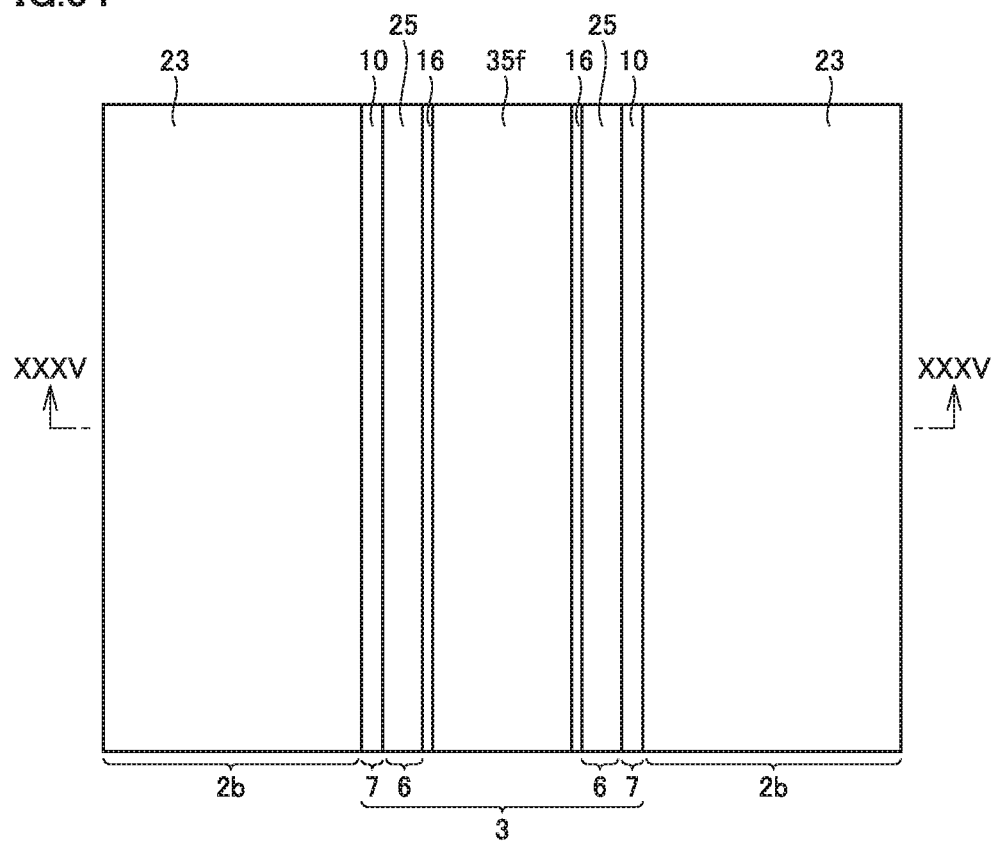
FIG. 34 is a schematic partial enlarged plan view showing one step of a method for manufacturing the semiconductor device according to the seventh embodiment of the present invention.
Figure 35:
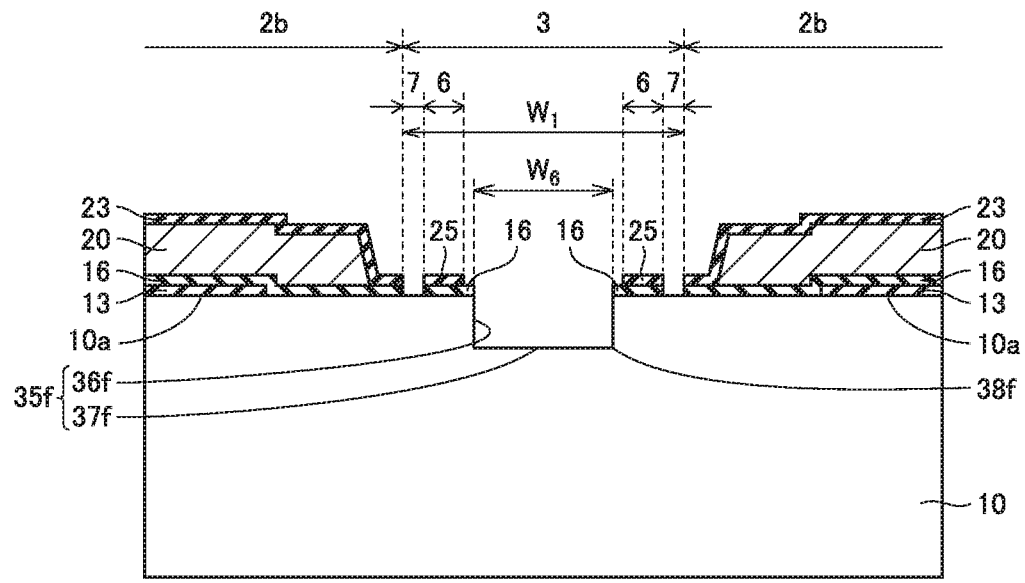
FIG. 35 is a schematic partial enlarged cross sectional view along a cross section line XXXV-XXXV shown in FIG. 34 in one step of the method for manufacturing the semiconductor device according to the seventh embodiment of the present invention.
Figure 36:
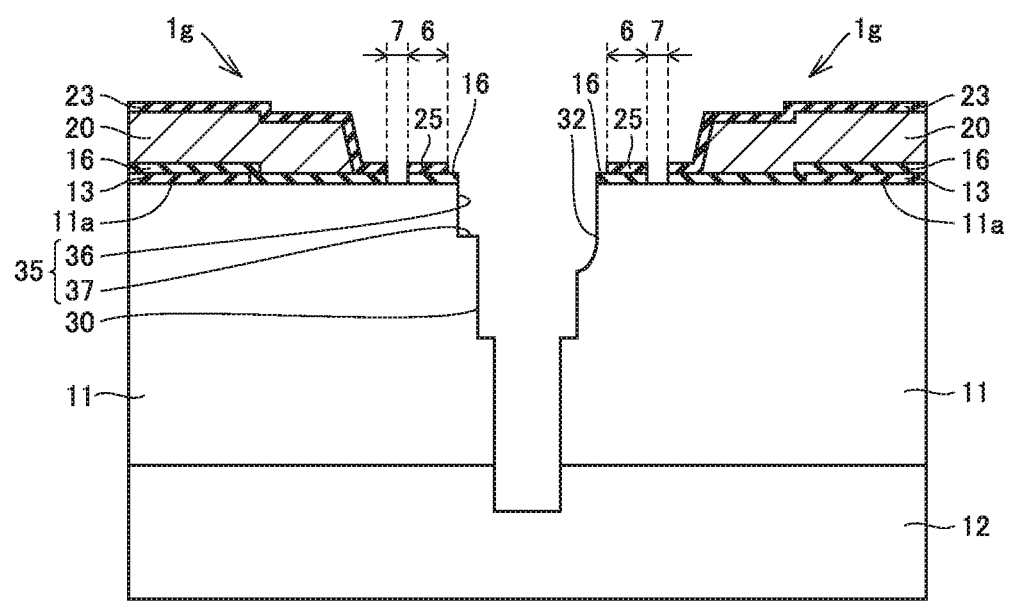
FIG. 36 is a schematic partial enlarged cross sectional view showing a step subsequent to the step shown in FIG. 35 in the method for manufacturing the semiconductor device according to the seventh embodiment of the present invention.
Figure 37:
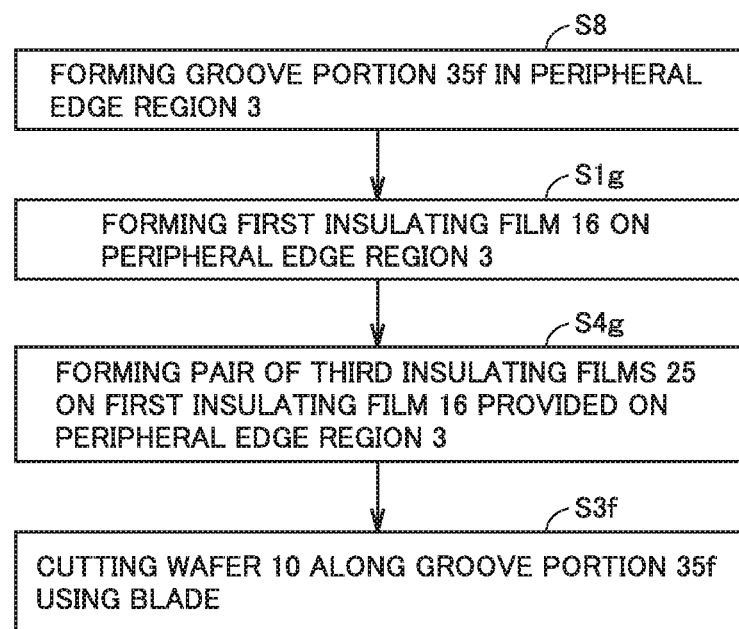
FIG. 37 shows a flowchart of the method for manufacturing the semiconductor device according to the seventh embodiment of the present invention.

With reference to FIG. 34, FIG. 35, and FIG. 37, the method for manufacturing semiconductor device 1g in the present embodiment includes forming (S1g) first insulating film 16 on peripheral region 3 of main surface 10a of wafer 10. Forming (S1g) first insulating film 16 in the present embodiment is basically the same as forming (S1f) first insulating film 16 in the sixth embodiment. In the present embodiment, first insulating films 16 are provided adjacent to the both sides of groove portion 35f. In the present embodiment, first insulating film 16 formed on peripheral region 3 may be separated from first insulating film 16 provided on device region 2. First insulating film 16 formed on peripheral region 3 extends along the first direction in the form of a stripe.

The method for manufacturing semiconductor device 1g in the present embodiment includes forming (S4g) a pair of third insulating films 25 on first insulating film 16 provided on peripheral region 3. Forming (S4g) the pair of third insulating films 25 is basically the same as forming (S4) the pair of third insulating films 25 in the third embodiment. The pair of third insulating films 25 are formed adjacent to the both sides of groove portion 35f.

As with groove portion 35f in the sixth embodiment, even though width $W_1$ of peripheral region 3 of wafer 10 is narrowed, groove portion 35f in the present embodiment can prevent occurrence of chipping 32 in device region 2. As with first stripe structure portion 6 in each of the third embodiment and the fifth embodiment, even though width $W_1$ of peripheral region 3 of wafer 10 is narrowed, first stripe structure portion 6 in the present embodiment can prevent occurrence of chipping 32 in device region 2. Since width $W_1$ of peripheral region 3 of wafer 10 can be narrowed, a yield of semiconductor devices 1g obtained from one wafer 10 is increased, thus reducing the manufacturing cost of semiconductor device 1g.

In second stripe structure portion 7 located between device region 2 and third insulating film 25, first insulating film 16 and third insulating film 25 are not formed. Therefore, even if at least one of first insulating film 16 and third insulating film 25 provided between second stripe structure portions 7 is damaged when cutting (S3f) wafer 10, this damage can be prevented from reaching device region 2 via at least one of first insulating film 16 and third insulating film 25. The structure (for example, electrode film 20) formed on the surface of device region 2 can be suppressed from being damaged.

In addition to the effects of semiconductor device 1f and the method for manufacturing semiconductor device 1f in the sixth embodiment, semiconductor device 1g and the method for manufacturing semiconductor device 1g in the present embodiment exhibit the following effects.

Semiconductor device 1g of the present embodiment further includes first insulating film 16 and third insulating film 25. First insulating film 16 is provided on each of device region 2 and peripheral region 3. Third insulating film 25 is provided on first insulating film 16 provided on peripheral region 3. Third insulating film 25 is provided between device region 2 and notch portion 35. Third insulating film 25 is separated from device region 2. Third insulating film 25 extends along end surface 30 in the form of a stripe.

The method for manufacturing semiconductor device 1g in the present embodiment includes: forming (S1g) first insulating film 16 on peripheral region 3 of main surface 10a of wafer 10; and forming (S4g) the pair of third insulating films 25 on first insulating film 16 provided on peripheral region 3. The pair of third insulating films 25 are separated from device regions 2.

In each of semiconductor device 1g and the method for manufacturing semiconductor device 1g in the present embodiment, first stripe structure portion 6 including first insulating film 16 and third insulating film 25 stacked on first insulating film 16 can prevent occurrence of chipping 32 in device region 2 even though the width of peripheral region 3 is narrowed. Moreover, even if at least one of first insulating film 16 and third insulating film 25 provided between second stripe structure portions 7 is damaged, this damage can be prevented from reaching device region 2 via at least one of first insulating film 16 and third insulating film 25 when cutting (S3f) wafer 10. The structure (for example, electrode film 20) formed on the surface of device region 2 can be suppressed from being damaged. Semiconductor device 1g of the present embodiment has a structure with which occurrence of chipping 32 can be suppressed in device region 2 and the manufacturing cost of semiconductor device 1g can be reduced. According to the method for manufacturing semiconductor device 1g in the present embodiment, occurrence of chipping 32 can be suppressed in device region 2 and the manufacturing cost of semiconductor device 1g can be reduced.

Eighth Embodiment

Figure 38:
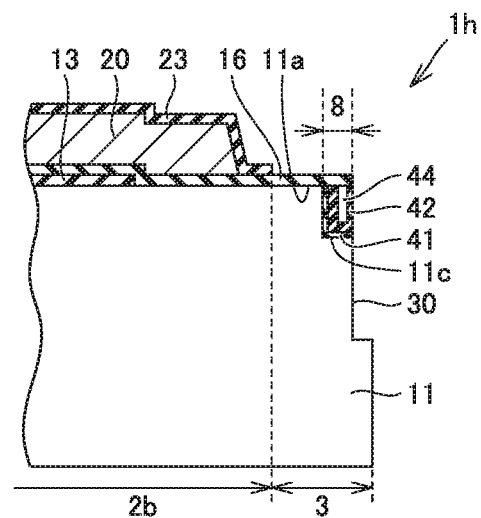
FIG. 38 is a schematic partial enlarged cross sectional view of a semiconductor device according to an eighth embodiment of the present invention.

With reference to FIG. 38, a semiconductor device 1h according to an eighth embodiment will be described. Semiconductor device 1h of the present embodiment includes a configuration similar to that of semiconductor device if of the sixth embodiment, but is mainly different therefrom in the following points.

Semiconductor device 1h of the present embodiment includes substrate 11 and a first polycrystal film 42. Substrate 11 has main surface 11a and end surface 30 and is provided with a notch portion 11c. Main surface 11a includes peripheral region 3 and device region 2 surrounded by peripheral region 3. Notch portion 11c is connected to main surface 11a and end surface 30. Notch portion 11c extends along end surface 30 in the form of a stripe.

First polycrystal film 42 is provided at notch portion 11c. First polycrystal film 42 extends along end surface 30 in the form of a stripe. First polycrystal film 42 may be a polysilicon film, for example. Fifth insulating film 41 is provided at notch portion 11c, and first polycrystal film 42 may be provided on this fifth insulating film 41. Fifth insulating film 41 may be a silicon dioxide film, for example. First polycrystal film 42 may also be provided with a cavity 44 inside first polycrystal film 42. First polycrystal film 42 may be covered with first insulating film 16 provided on peripheral region 3.

With reference to FIG. 39 to FIG. 42, a method for manufacturing semiconductor device 1h according to the eighth embodiment will be described.

Figure 39:
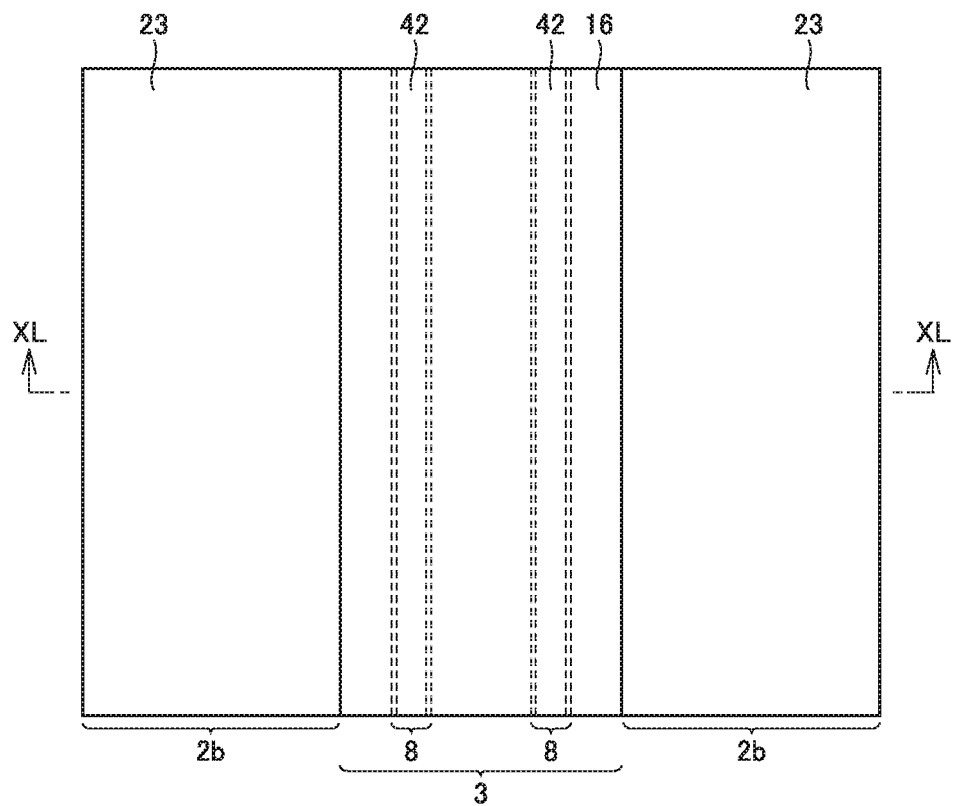
FIG. 39 is a schematic partial enlarged plan view showing one step of a method for manufacturing the semiconductor device according to the eighth embodiment of the present invention.
Figure 40:
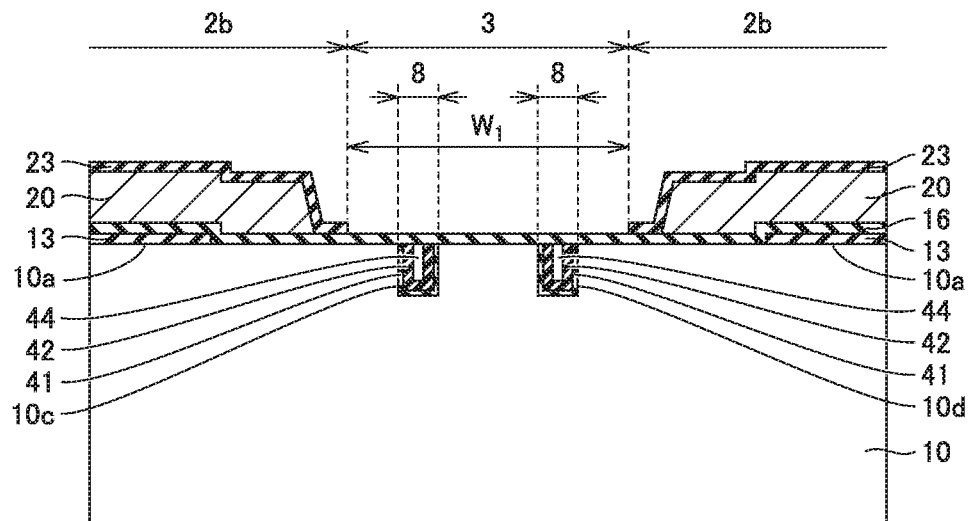
FIG. 40 is a schematic partial enlarged cross sectional view along a cross section line XL-XL shown in FIG. 39 in one step of the method for manufacturing the semiconductor device according to the eighth embodiment of the present invention.
Figure 42:
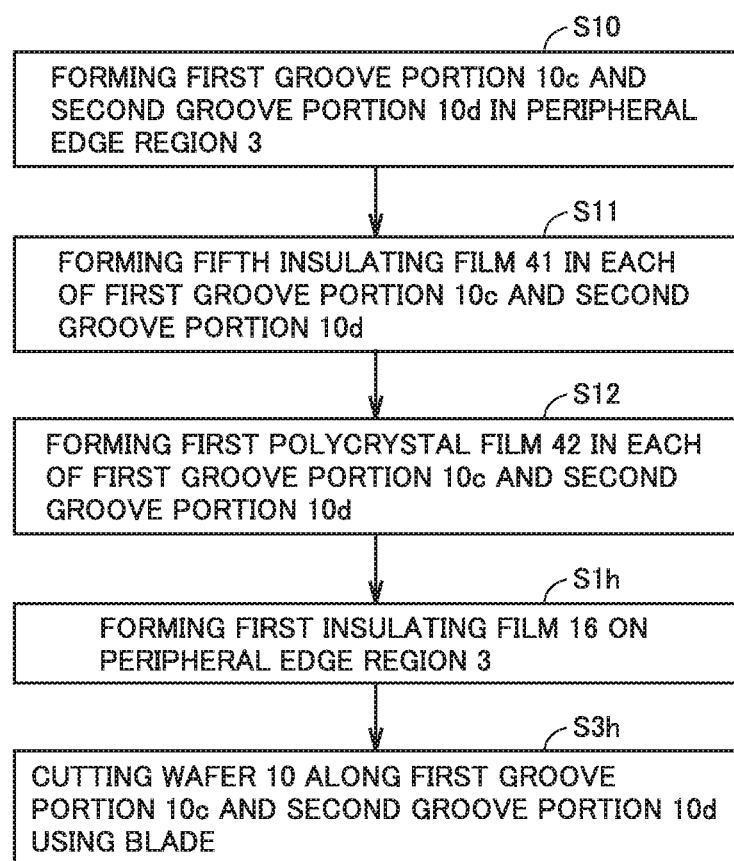
FIG. 42 shows a flowchart of the method for manufacturing the semiconductor device according to the eighth embodiment of the present invention.

With reference to FIG. 39, FIG. 40, and FIG. 42, the method for manufacturing semiconductor device 1h in the present embodiment includes forming (S10) a first groove portion 10c and a second groove portion 10d in peripheral region 3 of main surface 10a of wafer 10. First groove portion 10c and second groove portion 10d may be formed by etching a portion of peripheral region 3 of main surface 10a of wafer 10. First groove portion 10c and second groove portion 10d are separated from device regions 2. Each of first groove portion 10c and second groove portion 10d extends along the first direction in the form of a stripe. First groove portion 10c and second groove portion 10d are separated from each other in the second direction orthogonal to the first direction. A space between first groove portion 10c and second groove portion 10d is narrower than the maximum thickness of the blade to be used when cutting (S3h) wafer 10.

With reference to FIG. 39, FIG. 40, and FIG. 42, the method for manufacturing semiconductor device 1h in the present embodiment may include forming (S11) fifth insulating film 41 in each of first groove portion 10c and second groove portion 10d. Fifth insulating film 41 may be formed by oxidizing a surface of each of first groove portion 10c and second groove portion 10d.

With reference to FIG. 39, FIG. 40, and FIG. 42, the method for manufacturing semiconductor device 1h in the present embodiment includes forming (S12) first polycrystal film 42 in each of first groove portion 10c and second groove portion 10d. Specifically, first polycrystal film 42 may be formed on fifth insulating film 41 in each of first groove portion 10c and second groove portion 10d. First polycrystal film 42 may be formed on first insulating film 16 using the chemical vapor deposition (CVD) method or the evaporation method, for example. First polycrystal film 42 may also be provided with cavity 44 inside first polycrystal film 42. The region of wafer 10 in which first polycrystal film 42 is formed is a fragile region 8 of wafer 10. Fragile region 8 of wafer 10 is more likely to be cracked than other regions of wafer 10.

With reference to FIG. 39, FIG. 40, and FIG. 42, the method for manufacturing semiconductor device 1h in the present embodiment includes forming (S1h) first insulating film 16 on peripheral region 3 of main surface 10a of wafer 10. Forming (S1h) first insulating film 16 in the present embodiment is basically the same as forming (S1) first insulating film 16 in the first embodiment. First insulating film 16 provided on peripheral region 3 may be formed on main surface 10a of wafer 10 between first groove portion 10c and second groove portion 10d, and on first polycrystal film 42 formed in each of first groove portion 10c and second groove portion 10d.

Figure 41:
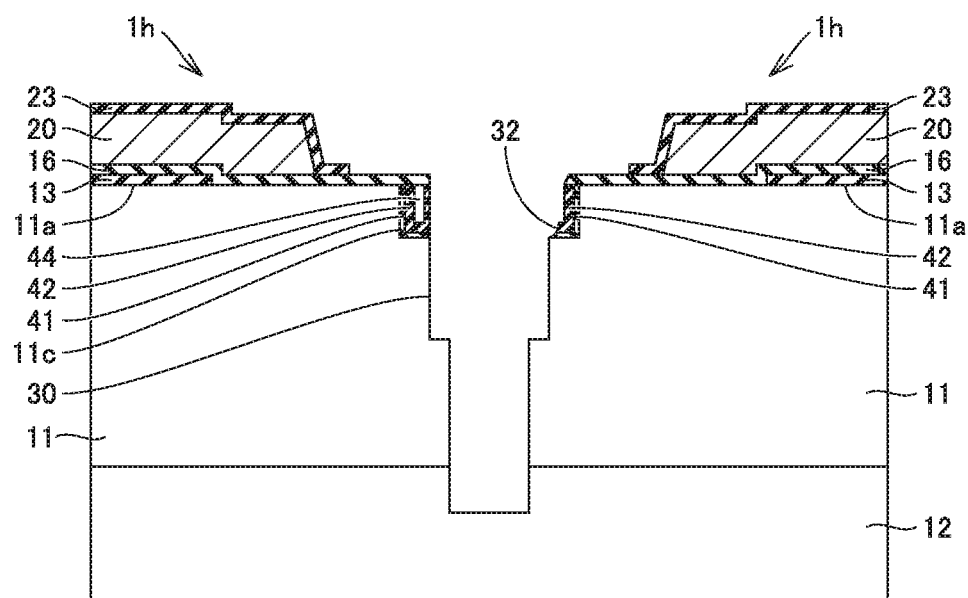
FIG. 41 is a schematic partial enlarged cross sectional view showing a step subsequent to the step shown in FIG. 40 in the method for manufacturing the semiconductor device according to the eighth embodiment of the present invention.

With reference to FIG. 41 and FIG. 42, the method for manufacturing semiconductor device 1h in the present embodiment includes: cutting (S3h) wafer 10 along first groove portion 10c and second groove portion 10d using the blade. When cutting (S3h) wafer 10, each of a portion of first groove portion 10c and a portion of second groove portion 10d remains as notch portion 11c. When cutting (S3u) wafer 10, at least a portion of first polycrystal film 42 remains.

Even if chipping 32 occurs in substrate 11 when cutting (S3h) wafer 10 as shown in semiconductor device 1h on the right-hand side of FIG. 41, this chipping 32 selectively occurs in fragile region 8. Therefore, even though width $W_1$ of peripheral region 3 of wafer 10 is narrowed, occurrence of chipping 32 can be prevented in device region 2. Since width $W_1$ of peripheral region 3 of wafer 10 can be narrowed, a yield of semiconductor devices 1h obtained from one wafer 10 is increased, thus reducing the manufacturing cost of semiconductor device 1h.

Effects of semiconductor device 1h and the method for manufacturing semiconductor device 1h in the present embodiment will be described as follows.

Semiconductor device 1h of the present embodiment includes substrate 11 and first polycrystal film 42. Substrate 11 has main surface 11a and end surface 30 and is provided with notch portion 11c. Main surface 11a includes peripheral region 3 and device region 2 surrounded by peripheral region 3. Notch portion 11c is connected to main surface 11a and end surface 30, and extends along end surface 30 in the form of a stripe. First polycrystal film 42 is provided at notch portion 11c, and extends along end surface 30 in the form of a stripe. Even though the width of peripheral region 3 is narrowed, fragile region 8 including first polycrystal film 42 provided at notch portion 11c can prevent occurrence of chipping 32 in device region 2. Semiconductor device 1h of the present embodiment has a structure with which occurrence of chipping 32 can be suppressed in device region 2 and the manufacturing cost of semiconductor device 1h can be reduced.

The method for manufacturing semiconductor device 1h in the present embodiment includes forming (S10) first groove portion 10c and second groove portion 10d in peripheral region 3 of main surface 10a of wafer 10. First groove portion 10c and second groove portion 10d are separated from device region 2. Each of first groove portion 10c and second groove portion 10d extends along the first direction in the form of a stripe. First groove portion 10c and second groove portion 10d are separated from each other in the second direction orthogonal to the first direction. The method for manufacturing semiconductor device 1h in the present embodiment includes: forming (S12) first polycrystal film 42 in each of first groove portion 10c and second groove portion 10d; forming (S1h) first insulating film 16 on peripheral region 3; and cutting (S3h) wafer 10 along first groove portion 10c and second groove portion 10d using the blade. When cutting (S3h) wafer 10, at least a portion of first groove portion 10c and at least a portion of second groove portion 10d remain.

Even though width $W_1$ of peripheral region 3 of wafer 10 is narrowed, fragile region 8 including first polycrystal film 42 provided at notch portion 11c can prevent occurrence of chipping 32 in device region 2 when cutting (S3h) wafer 10. According to the method for manufacturing semiconductor device 1h in the present embodiment, occurrence of chipping 32 can be suppressed in device region 2 and the manufacturing cost of semiconductor device 1h can be reduced.

In each of semiconductor device 1h and the method for manufacturing semiconductor device 1h in the present embodiment, first polycrystal film 42 may also be provided with cavity 44 inside first polycrystal film 42. Since first polycrystal film 42 is provided with cavity 44, chipping 32 occurs in fragile region 8 of wafer 10 more selectively. Semiconductor device 1h of the present embodiment has a structure with which occurrence of chipping 32 can be suppressed in device region 2 and the manufacturing cost of semiconductor device 1h can be reduced. According to the method for manufacturing semiconductor device 1h in the present embodiment, occurrence of chipping 32 can be suppressed in device region 2 and the manufacturing cost of semiconductor device 1h can be reduced.

Ninth Embodiment

Figure 43:
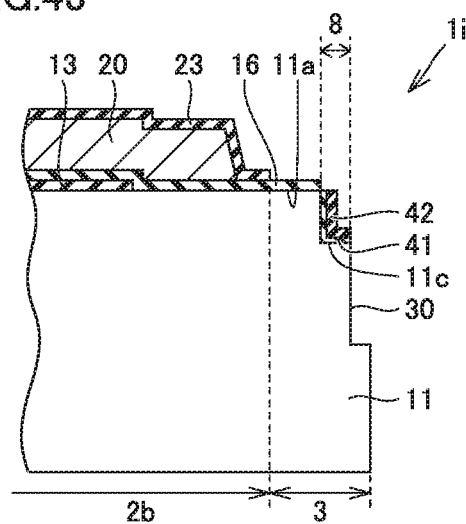
FIG. 43 is a schematic partial enlarged cross sectional view of a semiconductor device according to a ninth embodiment of the present invention.

With reference to FIG. 43, a semiconductor device 1i according to a ninth embodiment will be described. Semiconductor device 1i of the present embodiment includes a configuration similar to that of semiconductor device 1h of the eighth embodiment, but is mainly different therefrom in the following points. In semiconductor device 1i of the present embodiment, first polycrystal film 42 is exposed through first insulating film 16. First insulating film 16 is not formed on first polycrystal film 42. First polycrystal film 42 is not provided with cavity 44.

With reference to FIG. 44 to FIG. 47, a method for manufacturing semiconductor device 1i according to the ninth embodiment will be described. The method for manufacturing semiconductor device 1i in the present embodiment includes steps similar to those in the method for manufacturing semiconductor device 1h in the eighth embodiment, but is mainly different therefrom in the following points.

Figure 44:
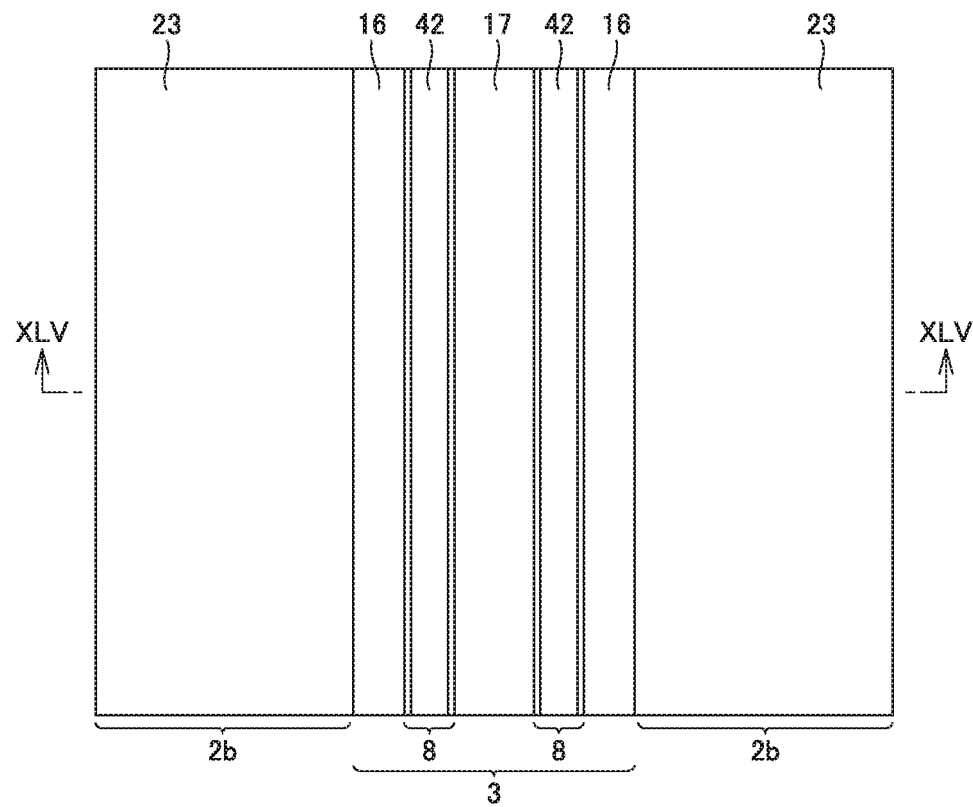
FIG. 44 is a schematic partial enlarged plan view showing one step of a method for manufacturing the semiconductor device according to the ninth embodiment of the present invention.
Figure 45:
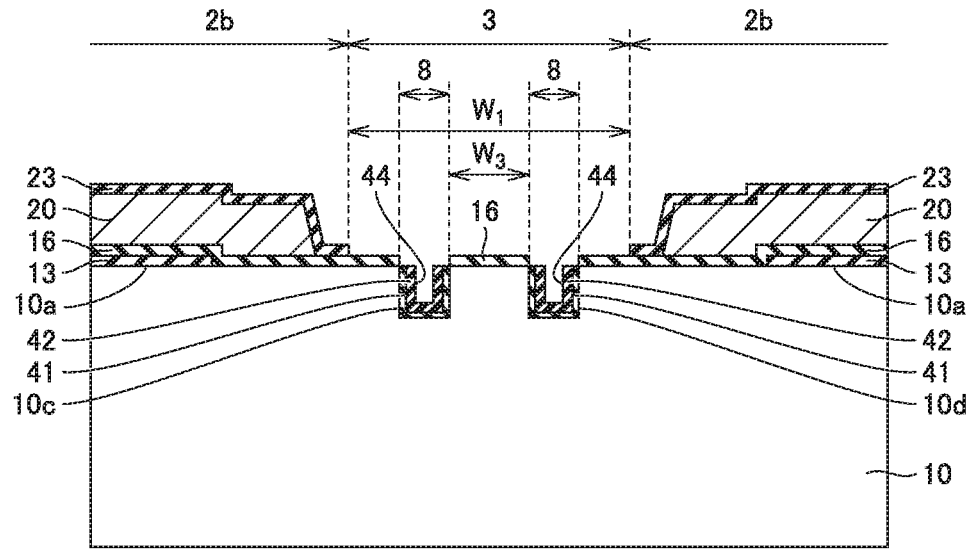
FIG. 45 is a schematic partial enlarged cross sectional view along a cross section line XLV-XLV shown in FIG. 44 in one step of the method for manufacturing the semiconductor device according to the ninth embodiment of the present invention.
Figure 46:
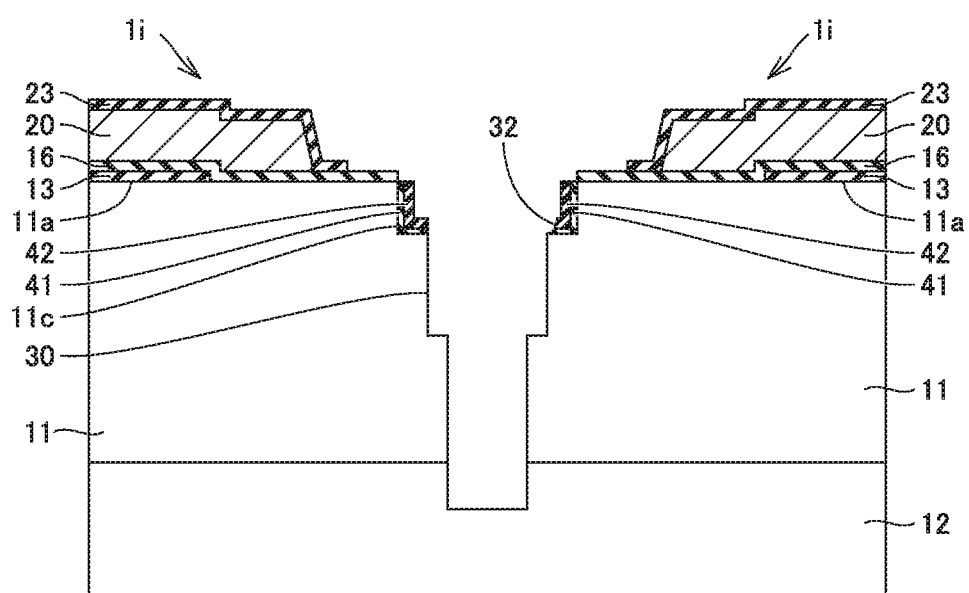
FIG. 46 is a schematic partial enlarged cross sectional view showing a step subsequent to the step shown in FIG. 45 in the method for manufacturing the semiconductor device according to the ninth embodiment of the present invention.
Figure 47:
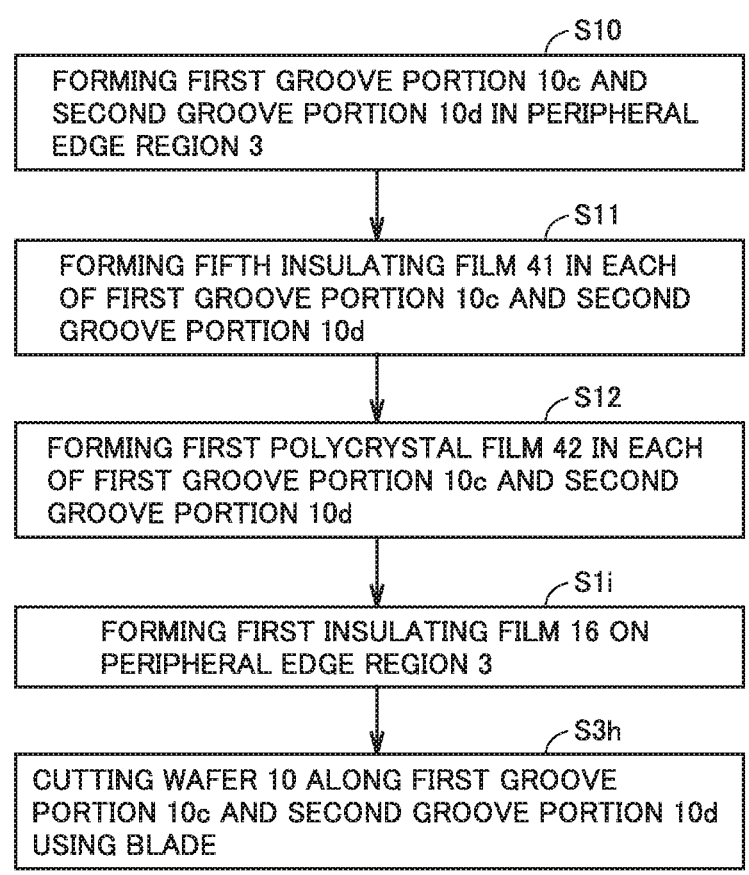
FIG. 47 shows a flowchart of the method for manufacturing the semiconductor device according to the ninth embodiment of the present invention.

With reference to FIG. 44, FIG. 45, and FIG. 47, the method for manufacturing semiconductor device 1i in the present embodiment includes forming (S1i) first insulating film 16 on peripheral region 3 of main surface 10a of wafer 10. First insulating film 16 provided on peripheral region 3 is formed on main surface 10a of wafer 10 between first groove portion 10c and second groove portion 10d, but is not formed on first polycrystal film 42 formed in each of first groove portion 10c and second groove portion 10d. First insulating film 16 formed on peripheral region 3 extends along the first direction in the form of a stripe. Width $W_3$ of first insulating film 16 formed on peripheral region 3 between first groove portion 10c and second groove portion 10d is smaller than width $W_1$ of peripheral region 3. Width $W_3$ of first insulating film 16 formed between first groove portion 10c and second groove portion 10d is smaller than the maximum width of the blade.

Semiconductor device 1i and the method for manufacturing semiconductor device 1i in the present embodiment exhibit the following effects in addition to the effects of semiconductor device 1h and the method for manufacturing semiconductor device 1h in the eighth embodiment. First insulating film 16 is not formed in fragile region 8 in the present embodiment. Therefore, as compared with fragile region 8 in the eighth embodiment, chipping 32 occurs more selectively in fragile region 8 in the present embodiment. According to semiconductor device 1i and the method for manufacturing semiconductor device 1i in the present embodiment, occurrence of chipping 32 can be further prevented in device region 2. Semiconductor device 1i of the present embodiment has a structure with which occurrence of chipping 32 can be suppressed in device region 2 and the manufacturing cost of semiconductor device 1i can be reduced. According to the method for manufacturing semiconductor device 1i in the present embodiment, occurrence of chipping 32 can be suppressed in device region 2 and the manufacturing cost of semiconductor device 1i can be reduced.

Tenth Embodiment

Figure 48:
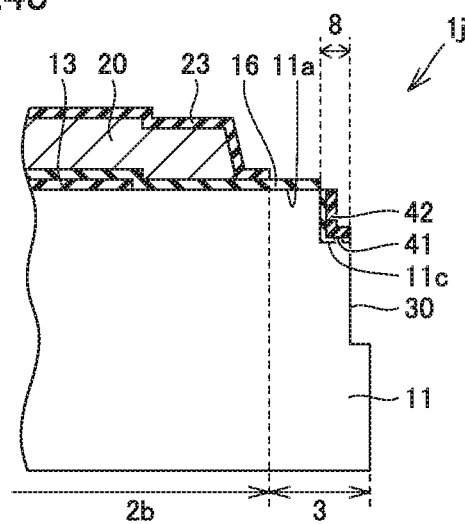
FIG. 48 is a schematic partial enlarged cross sectional view of a semiconductor device according to a tenth embodiment of the present invention.

With reference to FIG. 48, a semiconductor device 1j according to a tenth embodiment will be described. Semiconductor device 1j of the present embodiment includes the same configuration as that of semiconductor device 1i of the ninth embodiment.

With reference to FIG. 49 to FIG. 52, a method for manufacturing semiconductor device 1j according to the tenth embodiment will be described. The method for manufacturing semiconductor device 1j in the present embodiment includes steps similar to those in the method for manufacturing semiconductor device 1i in the ninth embodiment, but is mainly different therefrom in the following points.

Figure 49:
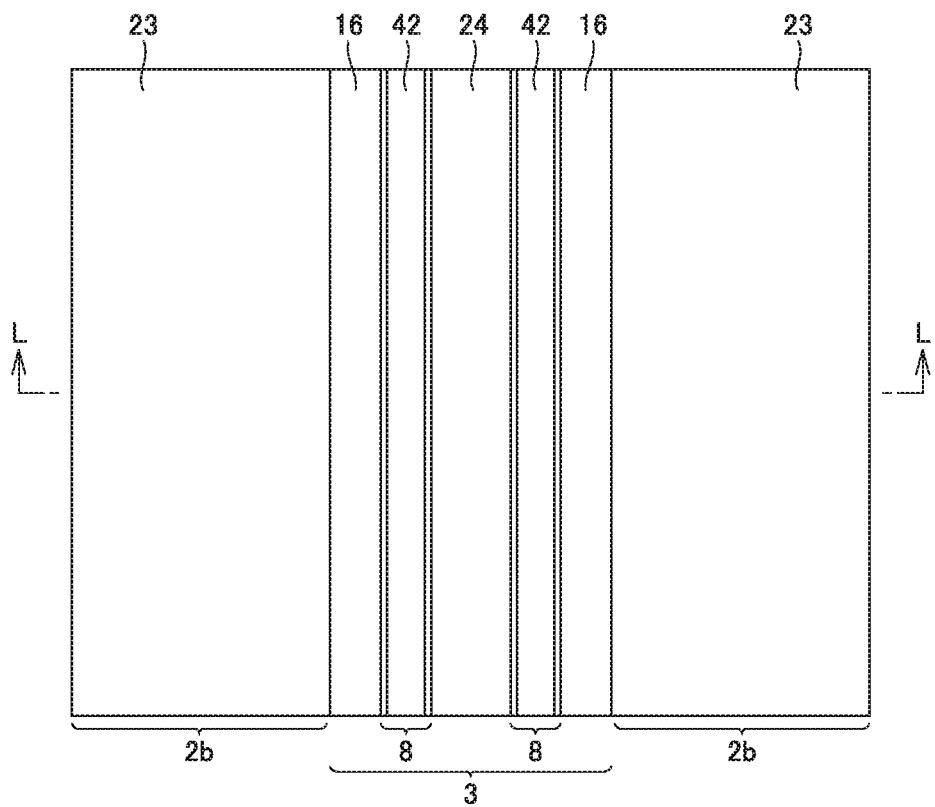
FIG. 49 is a schematic partial enlarged plan view showing one step of a method for manufacturing the semiconductor device according to the tenth embodiment of the present invention.
Figure 50:
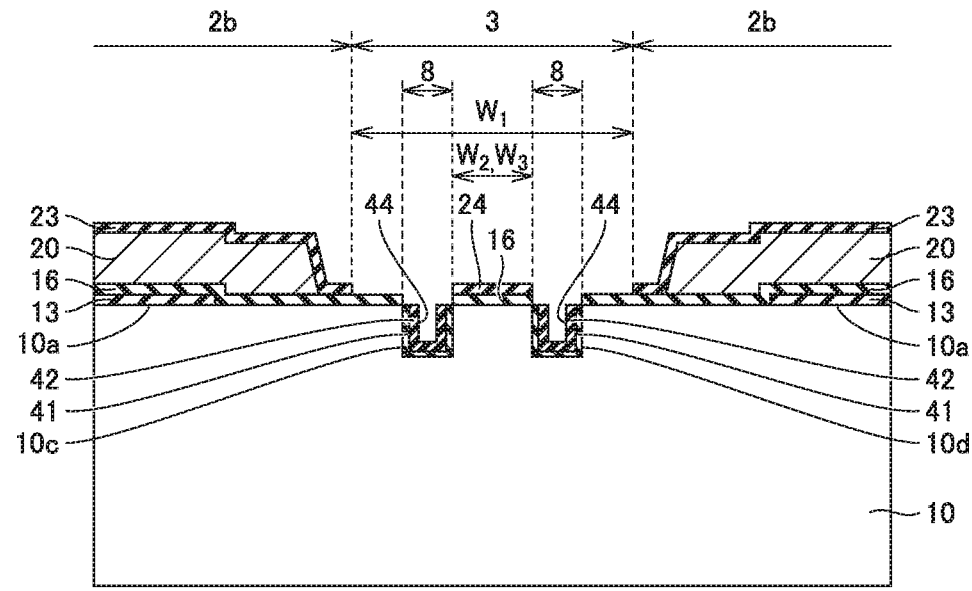
FIG. 50 is a schematic partial enlarged cross sectional view along a cross section line L-L shown in FIG. 49 in one step of the method for manufacturing the semiconductor device according to the tenth embodiment of the present invention.
Figure 52:
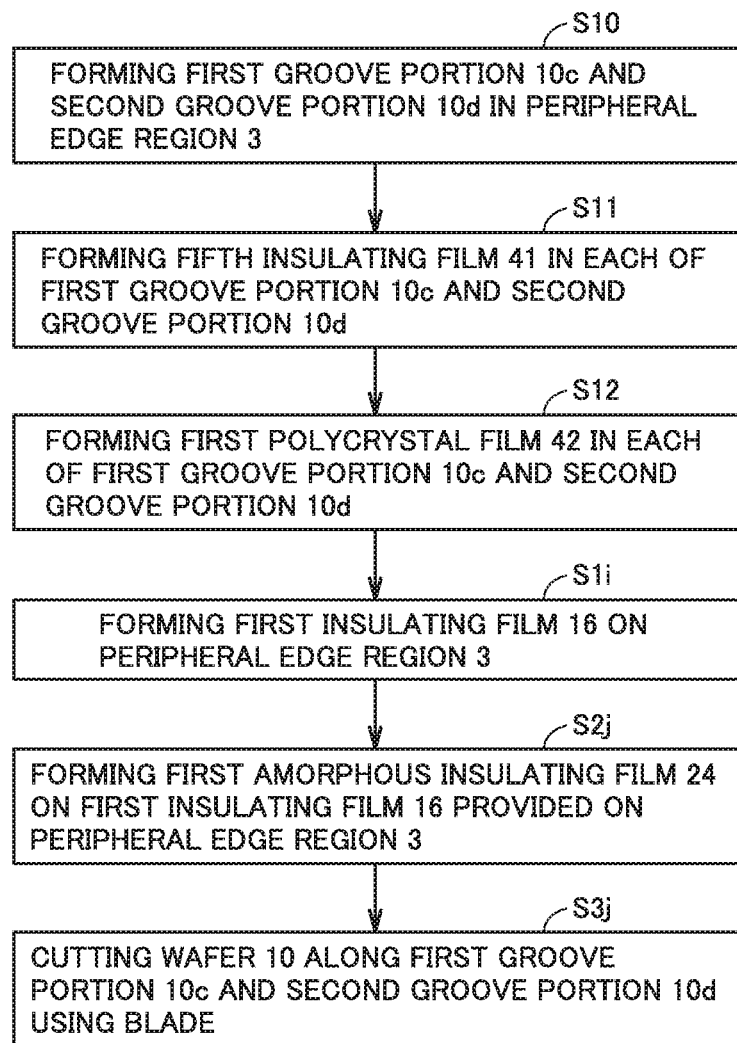
FIG. 52 shows a flowchart of the method for manufacturing the semiconductor device according to the tenth embodiment of the present invention.

With reference to FIG. 49, FIG. 50, and FIG. 52, the method for manufacturing semiconductor device 1j in the present embodiment includes forming (S2j) first amorphous insulating film 24 on first insulating film 16 provided on peripheral region 3. First amorphous insulating film 24 is formed between first groove portion 10c and second groove portion 10d. Forming (S2j) first amorphous insulating film 24 in the present embodiment is basically the same as forming (S2e) first amorphous insulating film 24 in the fifth embodiment. Width $W_2$ of first amorphous insulating film 24 is smaller than the maximum width of the blade.

Figure 51:
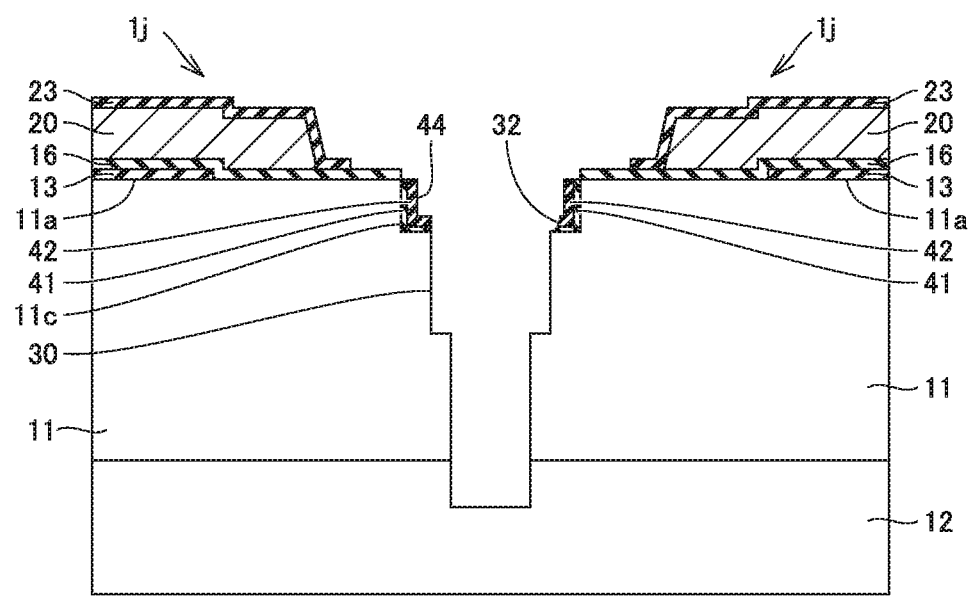
FIG. 51 is a schematic partial enlarged cross sectional view showing a step subsequent to the step shown in FIG. 50 in the method for manufacturing the semiconductor device according to the tenth embodiment of the present invention.

With reference to FIG. 51 and FIG. 52, the method for manufacturing semiconductor device 1j in the present embodiment includes: cutting (S3j) wafer 10 along first groove portion 10c and second groove portion 10d using the blade. Cutting (S3j) wafer 10 along first groove portion 10c and second groove portion 10d in the present embodiment is basically the same as cutting (S3h) wafer 10 along first groove portion 10c and second groove portion 10d in the ninth embodiment. When cutting (S3j) wafer 10, first amorphous insulating film 24 and first insulating film 16 formed between first groove portion 10c and second groove portion 10d are removed.

In addition to the effects of semiconductor device 1i and the method for manufacturing semiconductor device 1i in the ninth embodiment, semiconductor device 1j and the method for manufacturing semiconductor device 1j in the present embodiment exhibit the following effects. As with first amorphous insulating film 24 in the first embodiment, first amorphous insulating film 24 in the present embodiment can prevent occurrence of chipping 32 in device region 2 when cutting (S3j) wafer 10. According to the method for manufacturing semiconductor device 1j in the present embodiment, occurrence of chipping 32 can be suppressed in device region 2 and the manufacturing cost of semiconductor device 1j can be reduced.

Eleventh Embodiment

Figure 53:
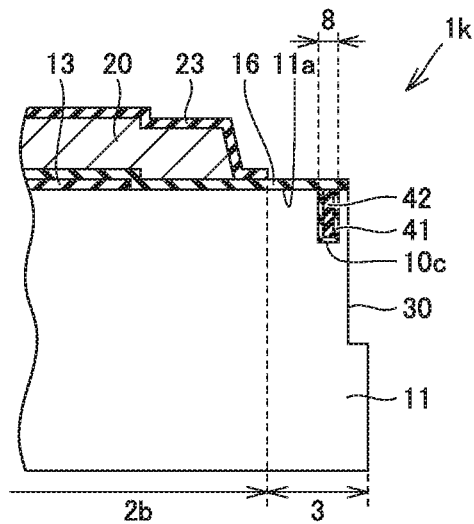
FIG. 53 is a schematic partial enlarged cross sectional view of a semiconductor device according to an eleventh embodiment of the present invention.

With reference to FIG. 53, a semiconductor device 1k according to an eleventh embodiment will be described. Semiconductor device 1k of the present embodiment includes a configuration similar to that of semiconductor device 1h of the eighth embodiment, but is mainly different therefrom in the following points.

In semiconductor device 1k of the present embodiment, substrate 11 has main surface 11a and end surface 30 and is provided with first groove portion 10c. First groove portion 10c is formed in peripheral region 3, and extends along end surface 30 in the form of a stripe. First polycrystal film 42 is provided in first groove portion 10c, and extends along end surface 30 in the form of a stripe. Specifically, fifth insulating film 41 is provided in first groove portion 10c, and first polycrystal film 42 may be provided on this fifth insulating film 41. First polycrystal film 42 may also be provided with a cavity (not shown) inside first polycrystal film 42. First polycrystal film 42 may be covered with first insulating film 16 provided on peripheral region 3.

With reference to FIG. 54 to FIG. 57, a method for manufacturing semiconductor device 1k according to the eleventh embodiment will be described. The method for manufacturing semiconductor device 1k in the present embodiment includes steps similar to those in the method for manufacturing semiconductor device 1h in the eighth embodiment, but is mainly different therefrom in the following points.

Figure 54:
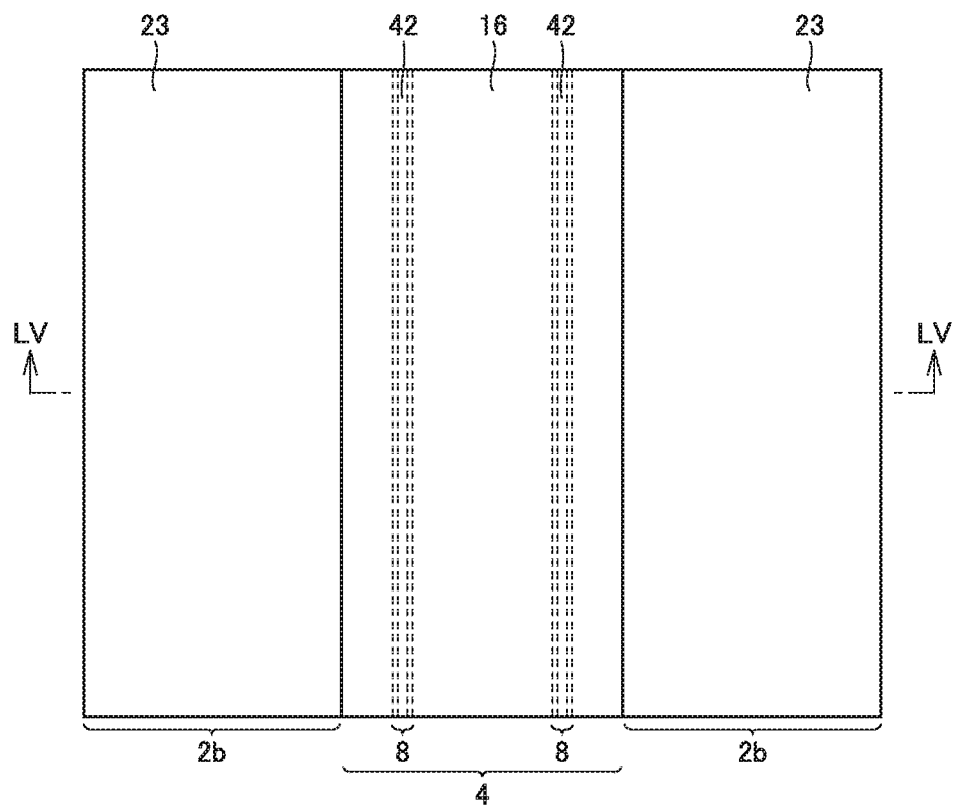
FIG. 54 is a schematic partial enlarged plan view showing one step of a method for manufacturing the semiconductor device according to the eleventh embodiment of the present invention.
Figure 55:
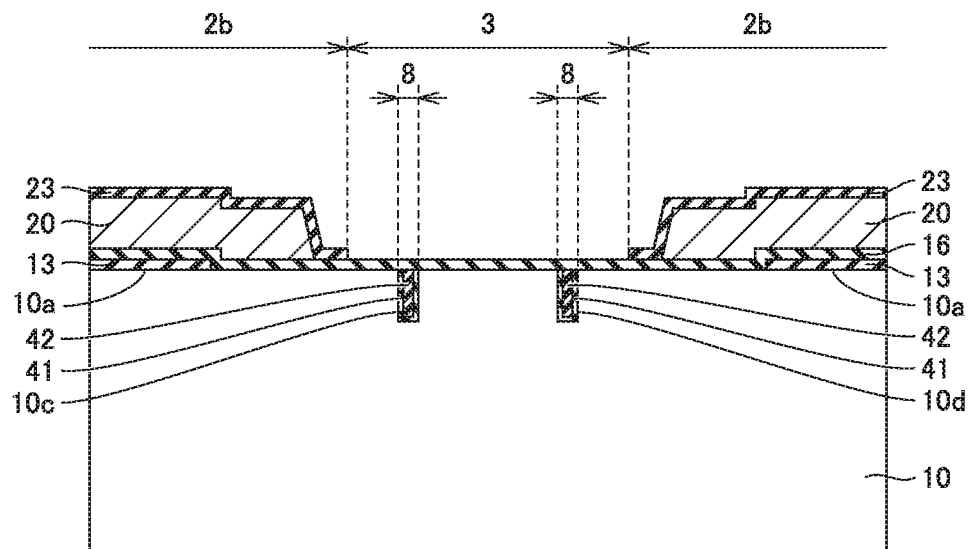
FIG. 55 is a schematic partial enlarged cross sectional view along a cross section line LV-LV shown in FIG. 54 in one step of the method for manufacturing the semiconductor device according to the eleventh embodiment of the present invention.
Figure 57:
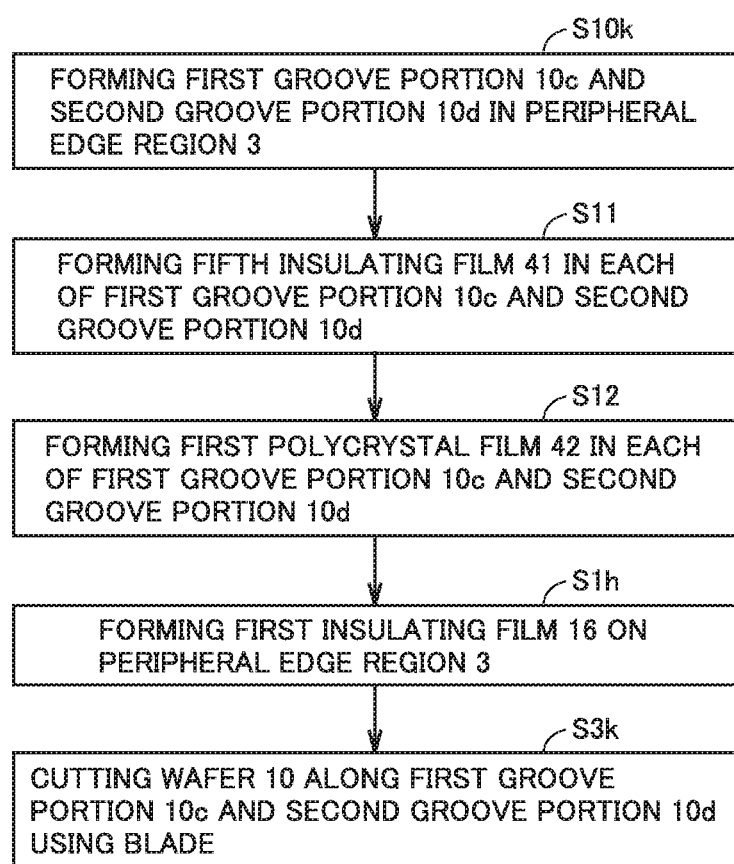
FIG. 57 shows a flowchart of the method for manufacturing the semiconductor device according to the eleventh embodiment of the present invention.

With reference to FIG. 54, FIG. 55, and FIG. 57, the method for manufacturing semiconductor device 1k in the present embodiment includes forming (S10k) first groove portion 10c and second groove portion 10d in peripheral region 3 of main surface 10a of wafer 10. First groove portion 10c and second groove portion 10d may be formed by etching a portion of peripheral region 3 of wafer 10. First groove portion 10c and second groove portion 10d are separated from device region 2. Each of first groove portion 10c and second groove portion 10d extends along the first direction in the form of a stripe. First groove portion 10c and second groove portion 10d are separated from each other in the second direction orthogonal to the first direction. A space between first groove portion 10c and second groove portion 10d is larger than the maximum thickness of the blade to be used when cutting (S3k) wafer 10.

Figure 56:
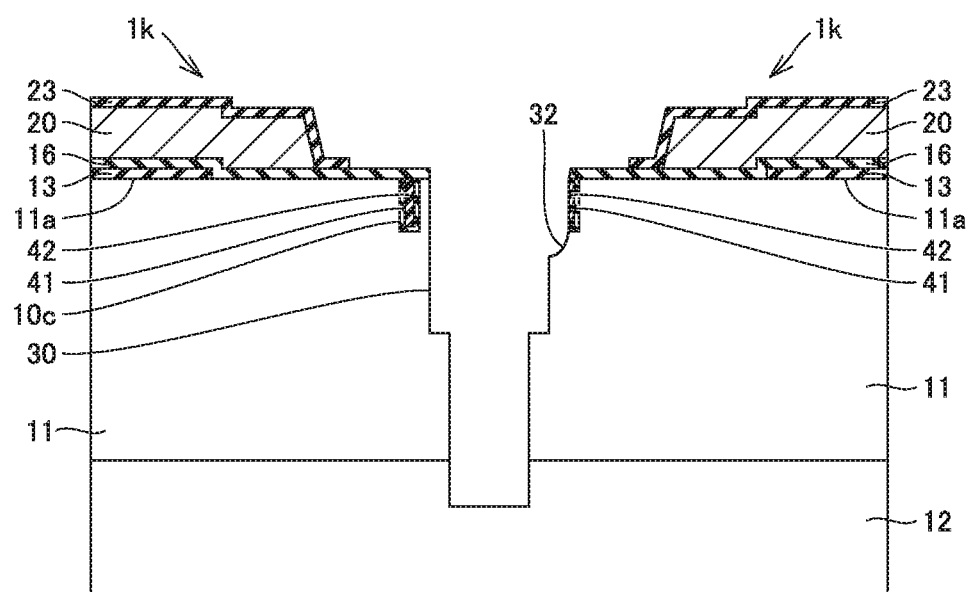
FIG. 56 is a schematic partial enlarged cross sectional view showing a step subsequent to the step shown in FIG. 55 in the method for manufacturing the semiconductor device according to the eleventh embodiment of the present invention.

With reference to FIG. 56 and FIG. 57, the method for manufacturing semiconductor device 1k in the present embodiment includes: cutting (S3k) wafer 10 along first groove portion 10c and second groove portion 10d using the blade. When cutting (S3k) wafer 10, the blade does not enter first groove portion 10c and second groove portion 10d and at least first groove portion 10c remains.

Even if chipping 32 occurs in substrate 11 when cutting (S3k) wafer 10 as shown in semiconductor device 1k on the right-hand side of FIG. 56, this chipping 32 selectively occurs in fragile region 8. Therefore, even though width $W_1$ of peripheral region 3 of wafer 10 is narrowed, occurrence of chipping 32 can be prevented in device region 2. Since width $W_1$ of peripheral region 3 of wafer 10 can be narrowed, a yield of semiconductor devices 1k obtained from one wafer 10 is increased, thus reducing the manufacturing cost of semiconductor device 1k.

Semiconductor device 1k and the method for manufacturing semiconductor device 1k in the present embodiment exhibit the same effects as those of semiconductor device 1h and the method for manufacturing semiconductor device 1h in the eighth embodiment as described below.

Semiconductor device 1k of the present embodiment includes substrate 11 and first polycrystal film 42. Substrate 11 has main surface 11a and end surface 30 and is provided with first groove portion 10c. First groove portion 10c is formed in peripheral region 3, and extends along end surface 30 in the form of a stripe. First polycrystal film 42 is provided in first groove portion 10c, and extends along end surface 30 in the form of a stripe. Even though the width of peripheral region 3 is narrowed, fragile region 8 including first polycrystal film 42 provided in first groove portion 10c can prevent occurrence of chipping 32 in device region 2. Semiconductor device 1k of the present embodiment has a structure with which occurrence of chipping 32 can be suppressed in device region 2 and the manufacturing cost of semiconductor device 1k can be reduced.

The method for manufacturing semiconductor device 1k in the present embodiment includes forming (S10k) first groove portion 10c and second groove portion 10d in peripheral region 3 of main surface 10a of wafer 10. First groove portion 10c and second groove portion 10d are separated from device region 2. Each of first groove portion 10c and second groove portion 10d extends along the first direction in the form of a stripe. First groove portion 10c and second groove portion 10d are separated from each other in the second direction orthogonal to the first direction. The method for manufacturing semiconductor device 1k in the present embodiment includes: cutting (S3k) wafer 10 along first groove portion 10c and second groove portion 10d using the blade. When cutting (S3k) wafer 10, the blade does not enter first groove portion 10c and second groove portion 10d and at least first groove portion 10c remains.

Even though width $W_1$ of peripheral region 3 of wafer 10 is narrowed, fragile region 8 of wafer 10 including first polycrystal film 42 provided in first groove portion 10c can prevent occurrence of chipping 32 in device region 2 when cutting (S3k) wafer 10. According to the method for manufacturing semiconductor device 1k in the present embodiment, occurrence of chipping 32 can be suppressed in device region 2 and the manufacturing cost of semiconductor device 1k can be reduced.

Twelfth Embodiment

Figure 58:
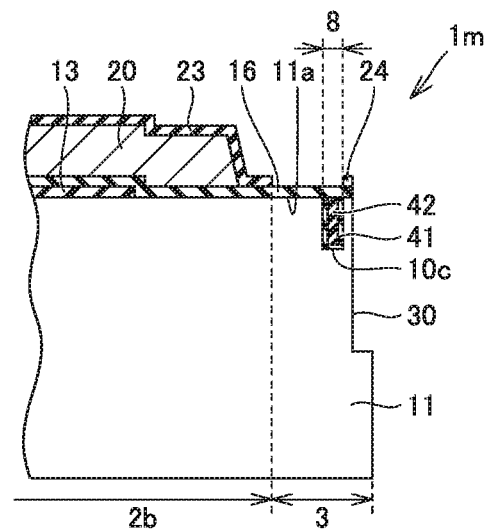
FIG. 58 is a schematic partial enlarged cross sectional view of a semiconductor device according to a twelfth embodiment of the present invention.

With reference to FIG. 58, a semiconductor device 1m according to a twelfth embodiment will be described. Semiconductor device 1m of the present embodiment includes a configuration similar to that of semiconductor device 1k of the eleventh embodiment, but is mainly different therefrom in the following points.

Semiconductor device 1m of the present embodiment further includes: first insulating film 16 provided on device region 2 and peripheral region 3; and first amorphous insulating film 24 provided on first insulating film 16. First amorphous insulating film 24 is disposed between first groove portion 10c and end surface 30, and is separated from device region 2. First amorphous insulating film 24 extends along end surface 30 in the form of a stripe. First amorphous insulating film 24 is flush with end surface 30.

With reference to FIG. 59 to FIG. 62, a method for manufacturing semiconductor device 1*m* according to the twelfth embodiment will be described. The method for manufacturing semiconductor device 1*m* in the present embodiment includes steps similar to those in the method for manufacturing semiconductor device 1*k* in the eleventh embodiment, but is mainly different therefrom in the following points.

Figure 59:
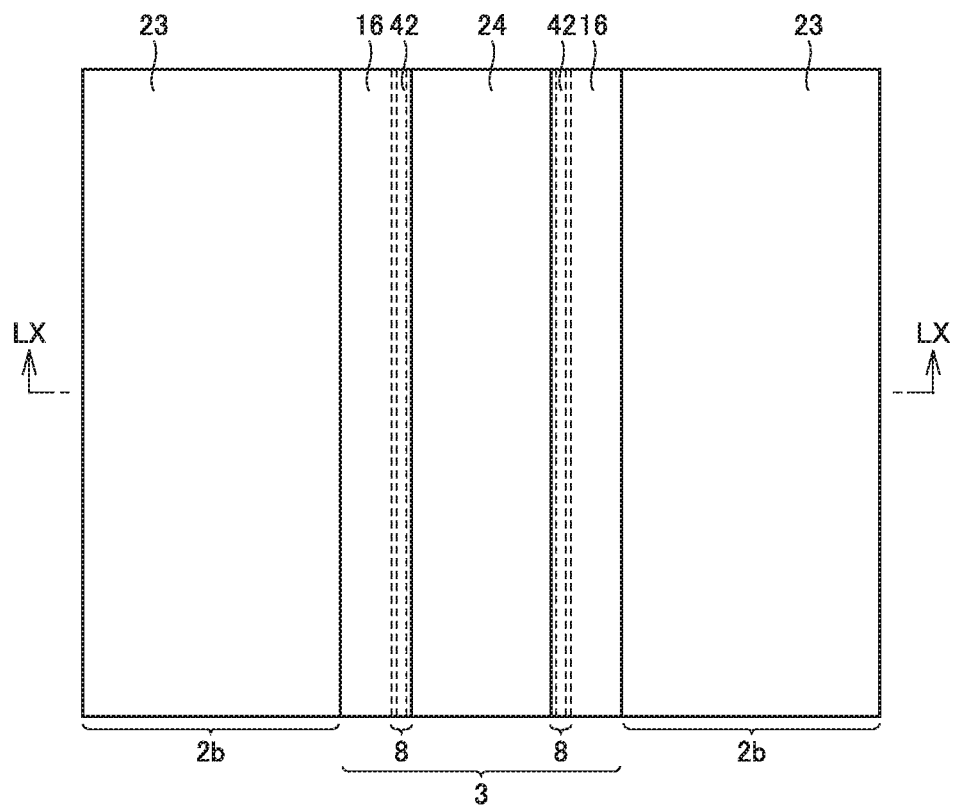
FIG. 59 is a schematic partial enlarged plan view showing one step of a method for manufacturing the semiconductor device according to the twelfth embodiment of the present invention.
Figure 60:
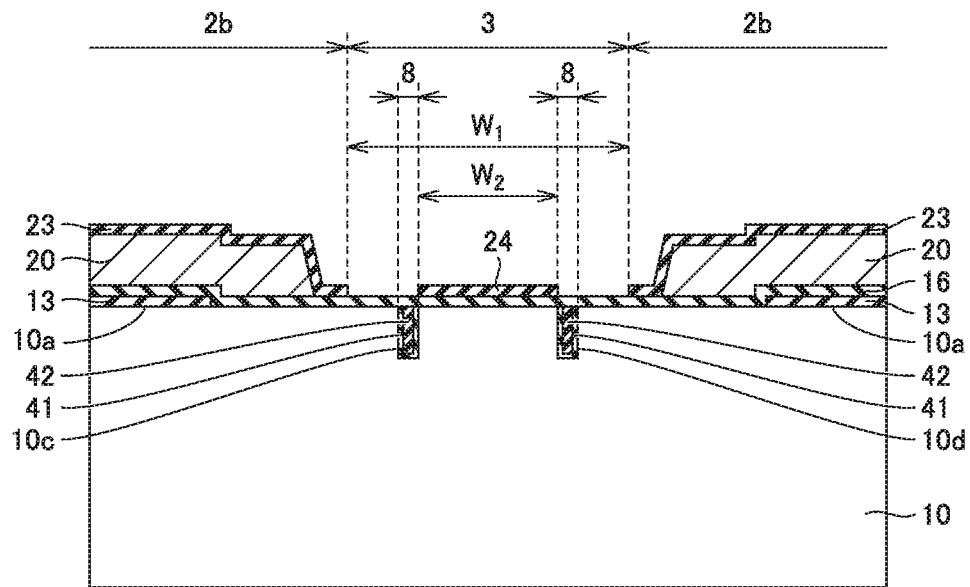
FIG. 60 is a schematic partial enlarged cross sectional view along a cross section line LX-LX shown in FIG. 59 in one step of the method for manufacturing the semiconductor device according to the twelfth embodiment of the present invention.
Figure 62:
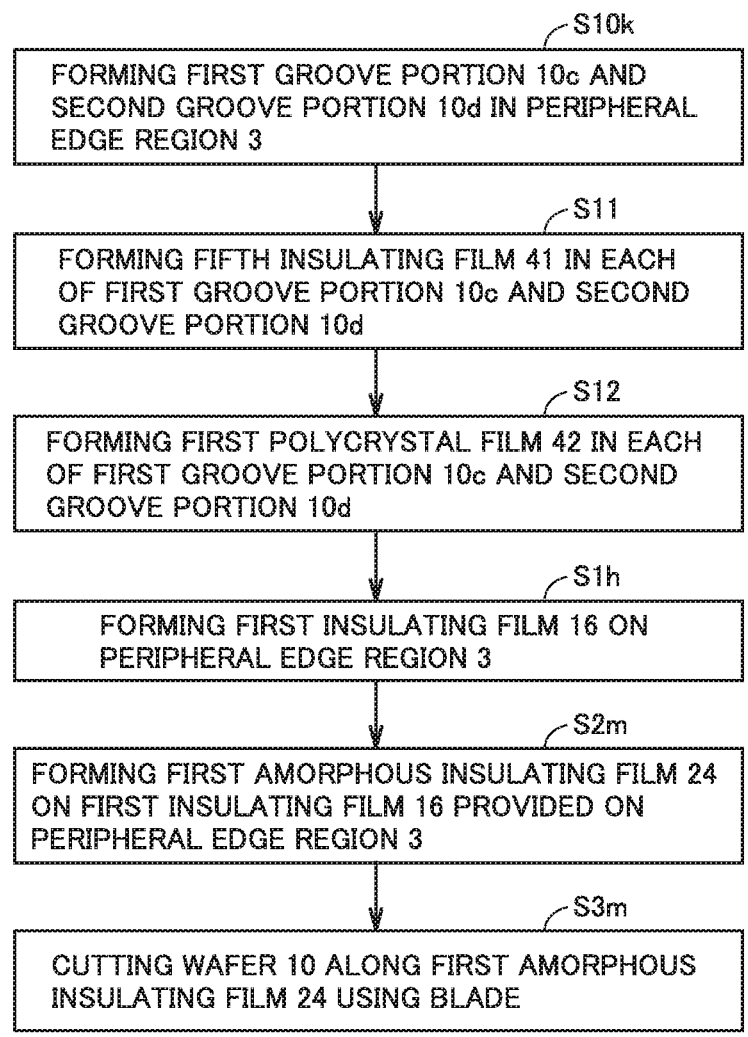
FIG. 62 shows a flowchart of the method for manufacturing the semiconductor device according to the twelfth embodiment of the present invention.

With reference to FIG. 59, FIG. 60 and FIG. 62, the method for manufacturing semiconductor device 1*m* in the present embodiment further includes forming (S2*m*) first amorphous insulating film 24 on first insulating film 16 provided on peripheral region 3. Forming (S2*m*) first amorphous insulating film 24 in the present embodiment is basically the same as forming (S2*e*) first amorphous insulating film 24 in the fifth embodiment. First amorphous insulating film 24 is formed between first groove portion 10*c* and second groove portion 10*d*. Width $W_2$ of first amorphous insulating film 24 is larger than the maximum width of the blade used when cutting (S3*m*) wafer 10. Width $W_2$ of first amorphous insulating film 24 is equal to the space between first groove portion 10*c* and second groove portion 10*d*, or is smaller than the space between first groove portion 10*c* and second groove portion 10*d*.

Figure 61:
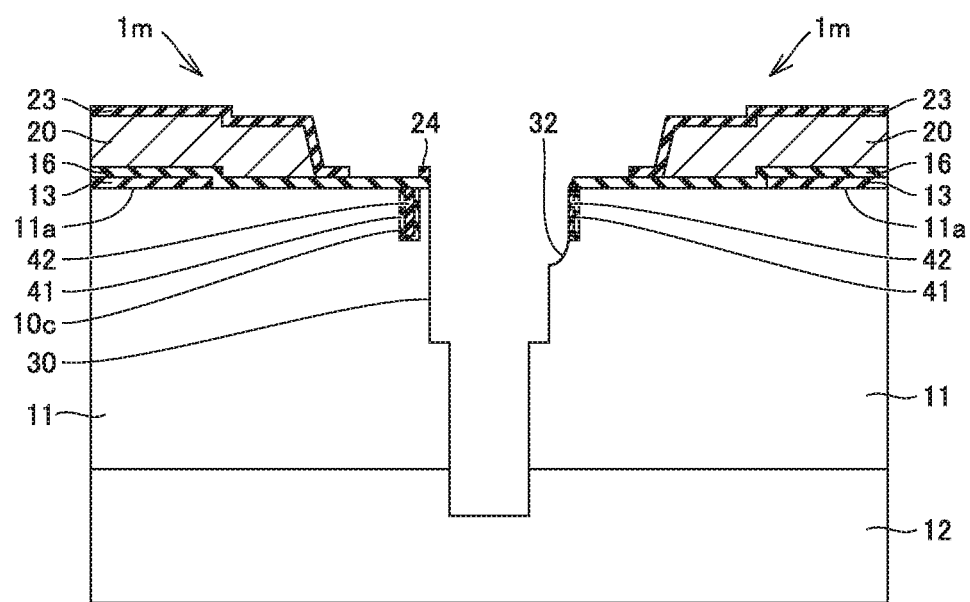
FIG. 61 is a schematic partial enlarged cross sectional view showing a step subsequent to the step shown in FIG. 60 in the method for manufacturing the semiconductor device according to the twelfth embodiment of the present invention.

With reference to FIG. 61 and FIG. 62, the method for manufacturing semiconductor device 1*m* in the present embodiment includes cutting (S3*m*) wafer 10 along first amorphous insulating film 24 using the blade. Cutting (S3*m*) wafer 10 in the present embodiment is basically the same as cutting (S3*k*) wafer 10 in the eleventh embodiment. When cutting (S3*m*) wafer 10, a central portion of first amorphous insulating film 24 is removed whereas the end portions of first amorphous insulating film 24 remain adjacent to the both ends of the blade in the width direction thereof. Accordingly, first amorphous insulating film 24 extends along end surface 30 in the form of a stripe and is flush with end surface 30.

In addition to the effects of semiconductor device 1*k* and the method for manufacturing semiconductor device 1*k* in the eleventh embodiment, semiconductor device 1*m* and the method for manufacturing semiconductor device 1*m* in the present embodiment exhibit the following effects.

Semiconductor device 1*m* of the present embodiment further includes: first insulating film 16 provided on device region 2 and peripheral region 3; and first amorphous insulating film 24 provided on first insulating film 16. First amorphous insulating film 24 is disposed between first groove portion 10*c* and end surface 30, and is separated from device region 2. First amorphous insulating film 24 extends along end surface 30 in the form of a stripe. First amorphous insulating film 24 is flush with end surface 30.

The method for manufacturing semiconductor device 1*m* in the present embodiment further includes forming (S2*m*) first amorphous insulating film 24 on first insulating film 16 provided on peripheral region 3. Width $W_2$ of first amorphous insulating film 24 is equal to the space between first groove portion 10*c* and second groove portion 10*d*, or is smaller than the space between first groove portion 10*c* and second groove portion 10*d*. The method for manufacturing semiconductor device 1*m* in the present embodiment includes cutting (S3*m*) wafer 10 along first amorphous insulating film 24 using the blade. When cutting (S3*m*) wafer 10, the blade does not enter first groove portion 10*c* and second groove portion 10*d* and at least first groove portion 10*c* remains.

As with first amorphous insulating film 24 in the first embodiment, first amorphous insulating film 24 in the present embodiment can prevent occurrence of chipping 32 in device region 2 when cutting (S3*m*) wafer 10. Semiconductor device 1*m* of the present embodiment has a structure with which occurrence of chipping 32 can be suppressed in device region 2 and the manufacturing cost of semiconductor device 1*m* can be reduced. According to the method for manufacturing semiconductor device 1*m* in the present embodiment, occurrence of chipping 32 can be suppressed in device region 2 and the manufacturing cost of semiconductor device 1*m* can be reduced.

Thirteenth Embodiment

Figure 63:
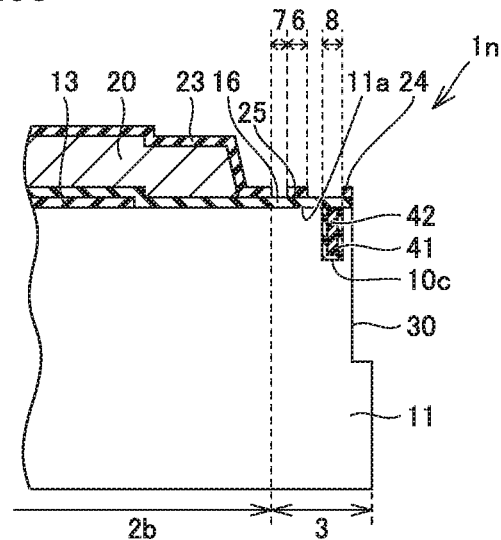
FIG. 63 is a schematic partial enlarged cross sectional view of a semiconductor device according to a thirteenth embodiment of the present invention.

With reference to FIG. 63, a semiconductor device 1*n* according to a thirteenth embodiment will be described. Semiconductor device 1*n* of the present embodiment includes a configuration similar to that of semiconductor device 1*m* of the twelfth embodiment, but is mainly different therefrom in the following points.

Semiconductor device 1*n* of the present embodiment further includes third insulating film 25 provided on first insulating film 16. Third insulating film 25 is disposed between device region 2 and first groove portion 10*c*. Third insulating film 25 is separated from device region 2 and first amorphous insulating film 24. Third insulating film 25 extends along end surface 30 in the form of a stripe. First groove portion 10*c* is located between first amorphous insulating film 24 and third insulating film 25. Third insulating film 25 of the present embodiment is composed of the same material as that of third insulating film 25 of each of the third embodiment, the fifth embodiment, and the seventh embodiment.

First stripe structure portion 6 is thicker than second stripe structure portion 7. First stripe structure portion 6 includes third insulating film 25 and first insulating film 16 provided under third insulating film 25. Second stripe structure portion 7 does not include third insulating film 25, but may include first insulating film 16. In second stripe structure portion 7, main surface 11*a* of substrate 11 may be exposed through first insulating film 16 and third insulating film 25.

With reference to FIG. 64 to FIG. 67, a method for manufacturing semiconductor device 1*n* according to the thirteenth embodiment will be described. The method for manufacturing semiconductor device 1*n* in the present embodiment includes steps similar to those in the method for manufacturing semiconductor device 1*m* in the twelfth embodiment, but is mainly different therefrom in the following points.

Figure 64:
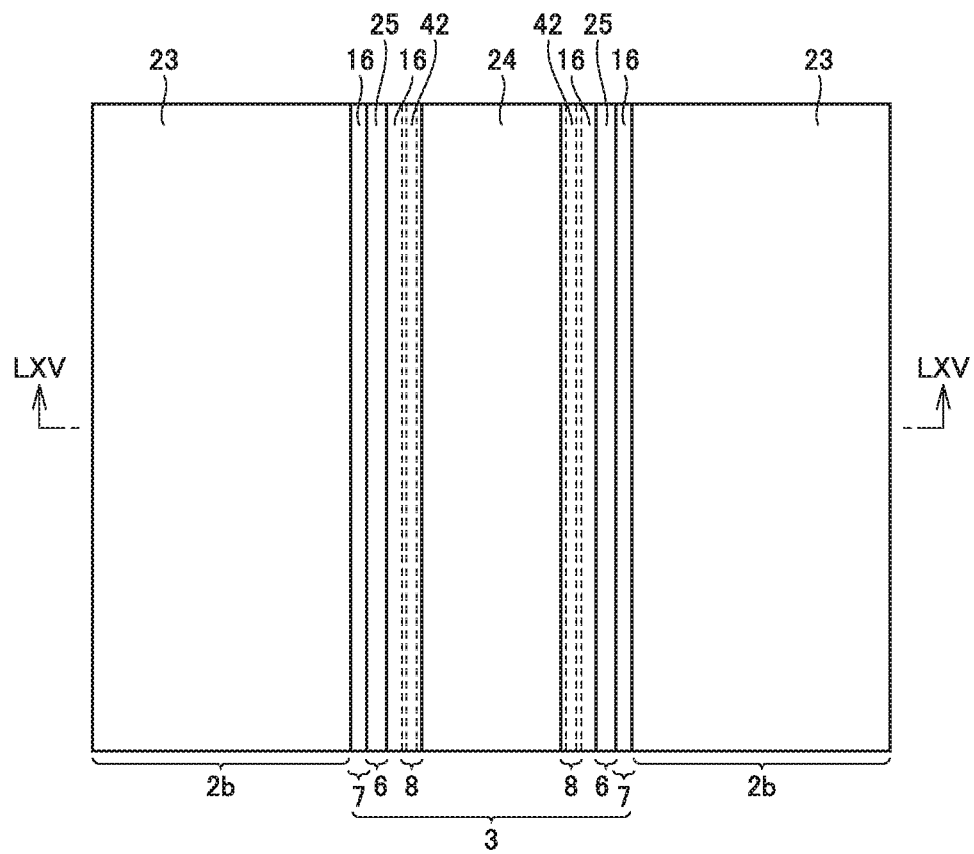
FIG. 64 is a schematic partial enlarged plan view showing one step of a method for manufacturing the semiconductor device according to the thirteenth embodiment of the present invention.
Figure 65:
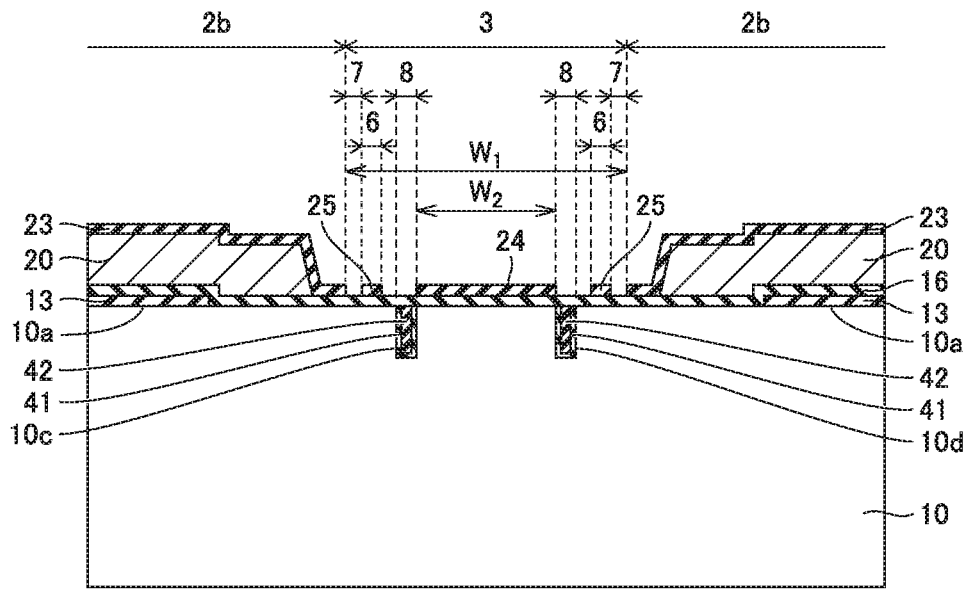
FIG. 65 is a schematic partial enlarged cross sectional view along a cross section line LXV-LXV shown in FIG. 64 in one step of the method for manufacturing the semiconductor device according to the thirteenth embodiment of the present invention.
Figure 66:
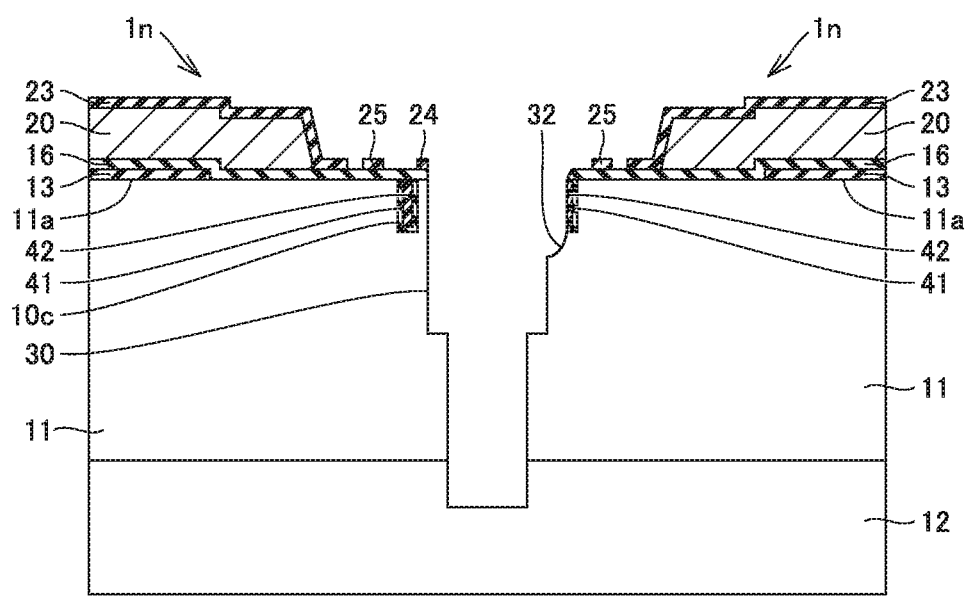
FIG. 66 is a schematic partial enlarged cross sectional view showing a step subsequent to the step shown in FIG. 65 in the method for manufacturing the semiconductor device according to the thirteenth embodiment of the present invention.
Figure 67:
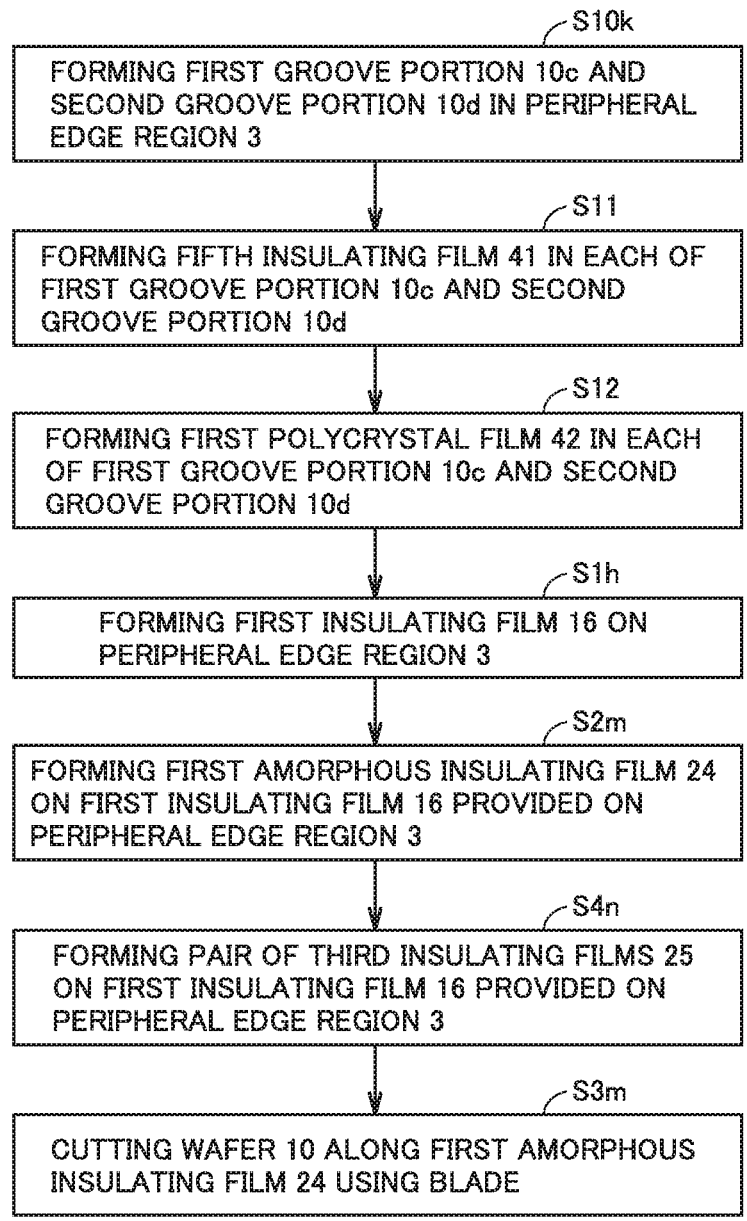
FIG. 67 shows a flowchart of the method for manufacturing the semiconductor device according to the thirteenth embodiment of the present invention.

With reference to FIG. 64, FIG. 65, and FIG. 67, the method for manufacturing semiconductor device 1*n* in the present embodiment further includes forming (S4*n*) a pair of third insulating films 25 on first insulating film 16 provided on peripheral region 3. The pair of third insulating films 25 are formed between first groove portion 10*c* and device region 2 facing first groove portion 10*c*, and between second groove portion 10*d* and device region 2 facing second groove portion 10*d*. Forming (S4*n*) the pair of third insulating films 25 in the present embodiment is basically the same as forming (S4*g*) the pair of third insulating films 25 in the seventh embodiment.

As with first stripe structure portion 6 in the seventh embodiment, first stripe structure portion 6 in the present embodiment can prevent occurrence of chipping 32 in device region 2 even though width $W_1$ of peripheral region 3 of wafer 10 is narrowed. Since width $W_1$ of peripheral region 3 of wafer 10 can be narrowed, a yield of semiconductor devices 1*n* obtained from one wafer 10 is increased, thus reducing the manufacturing cost of semiconductor device 1n. Moreover, as with second stripe structure portion 7 in the seventh embodiment, in second stripe structure portion 7 in the present embodiment, damage caused in third insulating film 25 provided between second stripe structure portions 7 can be prevented from reaching device region 2 via third insulating film 25 when cutting (S3m) wafer 10. The structure (for example, electrode film 20) formed on the surface of device region 2 can be suppressed from being damaged.

In addition to the effects of semiconductor device 1m and the method for manufacturing semiconductor device 1m in the twelfth embodiment, semiconductor device 1n and the method for manufacturing semiconductor device 1n in the present embodiment exhibit the following effects.

Semiconductor device 1n of the present embodiment further includes third insulating film 25 provided on first insulating film 16. Third insulating film 25 is disposed between device region 2 and first groove portion 10c. Third insulating film 25 is separated from device region 2 and first amorphous insulating film 24. Third insulating film 25 extends along end surface 30 in the form of a stripe. First groove portion 10c is located between first amorphous insulating film 24 and third insulating film 25.

The method for manufacturing semiconductor device 1n in the present embodiment further includes forming (S4n) the pair of third insulating films 25 on first insulating film 16 provided on peripheral region 3. The pair of third insulating films 25 are formed between first groove portion 10c and device region 2 facing first groove portion 10c, and between second groove portion 10d and device region 2 facing second groove portion 10d.

As with first stripe structure portion 6 in the seventh embodiment, first stripe structure portion 6 in the present embodiment can prevent occurrence of chipping 32 in device region 2 even though the width of peripheral region 3 is narrowed. Moreover, as with second stripe structure portion 7 in the seventh embodiment, second stripe structure portion 7 in the present embodiment can suppress damage of a structure (for example, electrode film 20) formed on the surface of device region 2. Semiconductor device 1n of the present embodiment has a structure with which occurrence of chipping 32 can be suppressed in device region 2 and the manufacturing cost of semiconductor device 1n can be reduced. According to the method for manufacturing semiconductor device 1n in the present embodiment, occurrence of chipping 32 can be suppressed in device region 2 and the manufacturing cost of semiconductor device 1n can be reduced.

Fourteenth Embodiment

Figure 68:
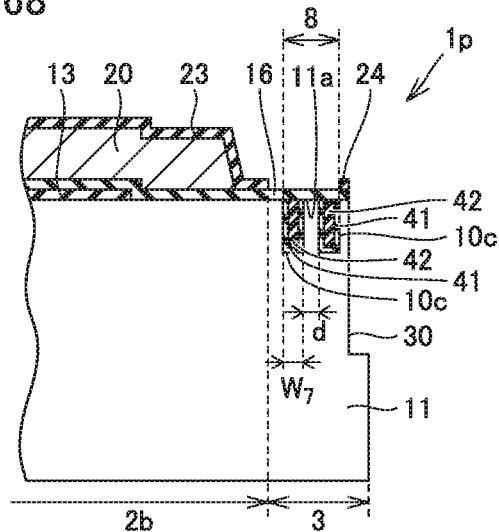
FIG. 68 is a schematic partial enlarged cross sectional view of a semiconductor device according to a fourteenth embodiment of the present invention.

With reference to FIG. 68, a semiconductor device 1p according to a fourteenth embodiment will be described. Semiconductor device 1p of the present embodiment includes a configuration similar to that of semiconductor device 1m of the twelfth embodiment, but is mainly different therefrom in the following points. Semiconductor device 1p of the present embodiment is provided with a plurality of first groove portions 10c. First polycrystal films 42 are provided in the plurality of first groove portions 10c, and each extend along end surface 30 in the form of a stripe. A space d between adjacent first groove portions 10c may be not more than width $W_7$ of each of the plurality of first groove portions 10c. Fifth insulating films 41 may be provided in the plurality of first groove portions 10c and the plurality of second groove portions 10d.

With reference to FIG. 69 to FIG. 72, a method for manufacturing semiconductor device 1p according to the fourteenth embodiment will be described. The method for manufacturing semiconductor device 1p in the present embodiment includes the same steps as those in the method for manufacturing semiconductor device 1m in the twelfth embodiment, but is different therefrom in terms of the number of first groove portions 10c formed in wafer 10 and the number of second groove portions 10d formed therein.

Figure 69:
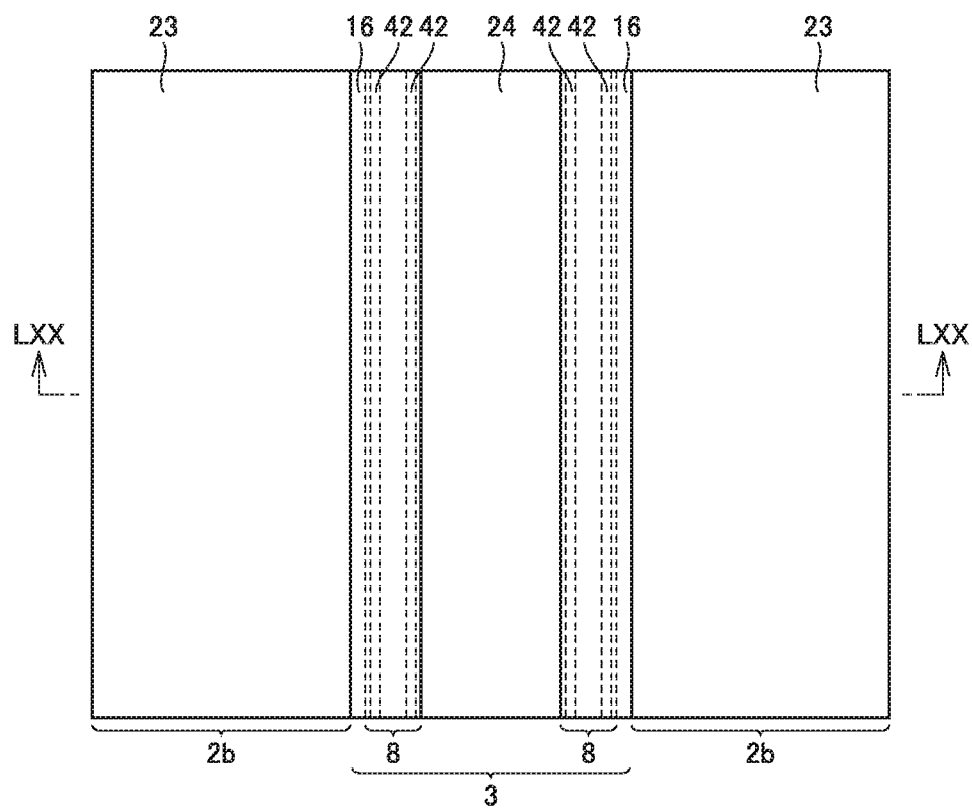
FIG. 69 is a schematic partial enlarged plan view showing one step of a method for manufacturing the semiconductor device according to the fourteenth embodiment of the present invention.
Figure 70:
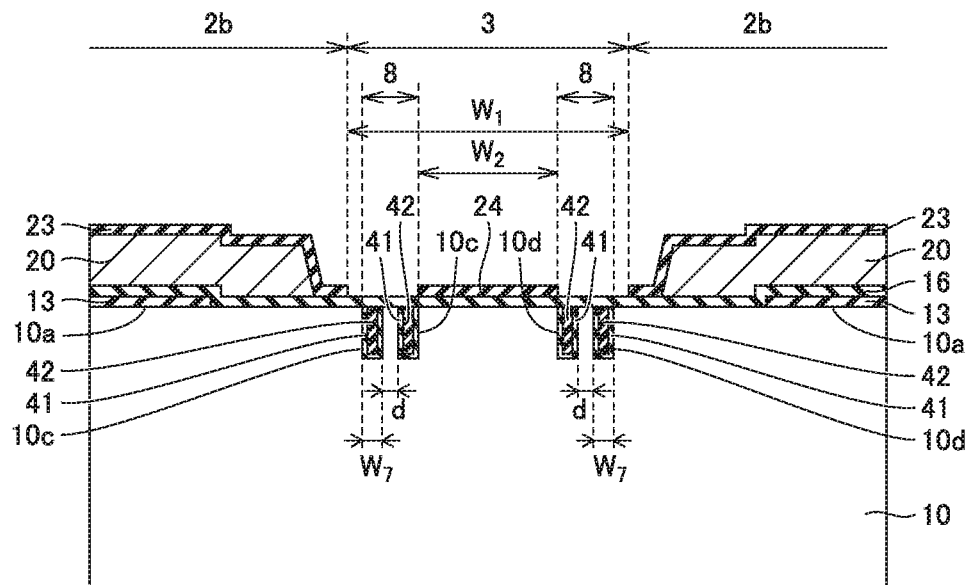
FIG. 70 is a schematic partial enlarged cross sectional view along a cross section line LXX-LXX shown in FIG. 69 in one step of the method for manufacturing the semiconductor device according to a fourteenth embodiment of the present invention.
Figure 72:
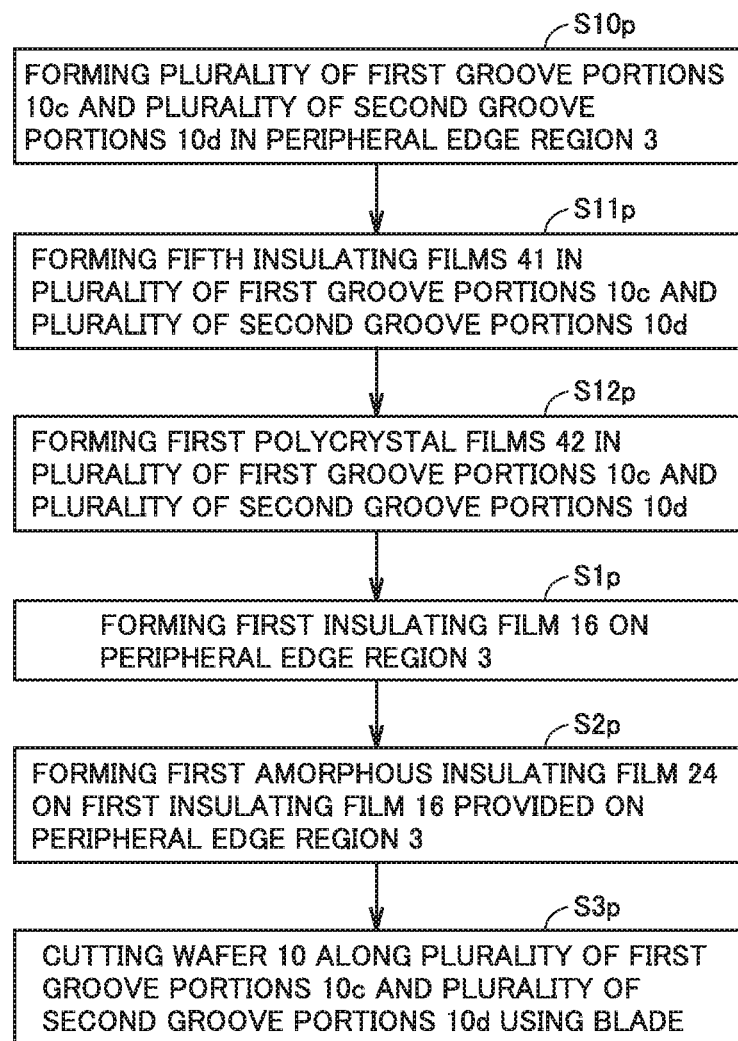
FIG. 72 shows a flowchart of the method for manufacturing the semiconductor device according to the fourteenth embodiment of the present invention.

With reference to FIG. 69, FIG. 70, and FIG. 72, the method for manufacturing semiconductor device 1p in the present embodiment includes forming (S10p) the plurality of first groove portions 10c and the plurality of second groove portions 10d in peripheral region 3 of main surface 10a of wafer 10. Forming (S10p) the plurality of first groove portions 10c and the plurality of second groove portions 10d in the present embodiment is basically the same as forming (S10) first groove portion 10c and second groove portion 10d in the twelfth embodiment. The plurality of first groove portions 10c and the plurality of second groove portions 10d are separated from device region 2. Each of the plurality of first groove portions 10c and the plurality of second groove portions 10d extends along the first direction in the form of a stripe. The plurality of first groove portions 10c are separated from the plurality of second groove portions 10d in the second direction orthogonal to the first direction. A shortest space between the plurality of first groove portions 10c and the plurality of second groove portions 10d is larger than the maximum thickness of the blade to be used when cutting (S3d) wafer 10.

With reference to FIG. 69, FIG. 70, and FIG. 72, the method for manufacturing semiconductor device 1p in the present embodiment may include forming (S11p) fifth insulating films 41 in the plurality of first groove portions 10c and the plurality of second groove portions 10d. Specifically, fifth insulating films 41 may be formed in all of the plurality of first groove portions 10c and all of the plurality of second groove portions 10d. Forming (S11p) fifth insulating films 41 in the present embodiment is basically the same as forming (S11) fifth insulating films 41 in the twelfth embodiment.

With reference to FIG. 69, FIG. 70, and FIG. 72, the method for manufacturing semiconductor device 1p in the present embodiment includes forming (S12p) first polycrystal films 42 in the plurality of first groove portions 10c and the plurality of second groove portions 10d. Forming (S12p) first polycrystal films 42 in the present embodiment is basically the same as forming (S12) first polycrystal films 42 in the twelfth embodiment. Fragile region 8 of wafer 10 is constituted of the region on which each first polycrystal film 42 is formed, the region sandwiched between the plurality of first groove portions 10c, and the region sandwiched between the plurality of second groove portions 10d in wafer 10. Fragile region 8 of wafer 10 is more likely to be cracked than other regions of wafer 10.

With reference to FIG. 69, FIG. 70, and FIG. 72, the method for manufacturing semiconductor device 1p in the present embodiment includes forming (S1p) first insulating film 16 on peripheral region 3 of main surface 10a of wafer 10. Forming (S1p) first insulating film 16 in the present embodiment is basically the same as forming (S1h) first insulating film 16 in the twelfth embodiment. First insulating film 16 provided on peripheral region 3 may be formed on main surface 10a of wafer 10 between the plurality of first groove portions 10c and the plurality of second groove portions 10d, and on first polycrystal films 42 formed in the plurality of first groove portions 10c and the plurality of second groove portions 10d. With reference to FIG. 69, FIG. 70, and FIG. 72, the method for manufacturing semiconductor device 1p in the present embodiment further includes forming (S2p) first amorphous insulating film 24 on first insulating film 16 provided on peripheral region 3. Forming (S2p) first amorphous insulating film 24 in the present embodiment is the same as forming (S2m) first amorphous insulating film 24 in the twelfth embodiment. First amorphous insulating film 24 is formed between the plurality of first groove portions 10c and the plurality of second groove portions 10d. Width $W_2$ of first amorphous insulating film 24 is larger than the maximum width of the blade used when cutting (S3p) wafer 10. Width $W_2$ of first amorphous insulating film 24 is equal to the space between the plurality of first groove portions 10c and the plurality of second groove portions 10d, or is smaller than the space between the plurality of first groove portions 10c and the plurality of second groove portions 10d.

Figure 71:
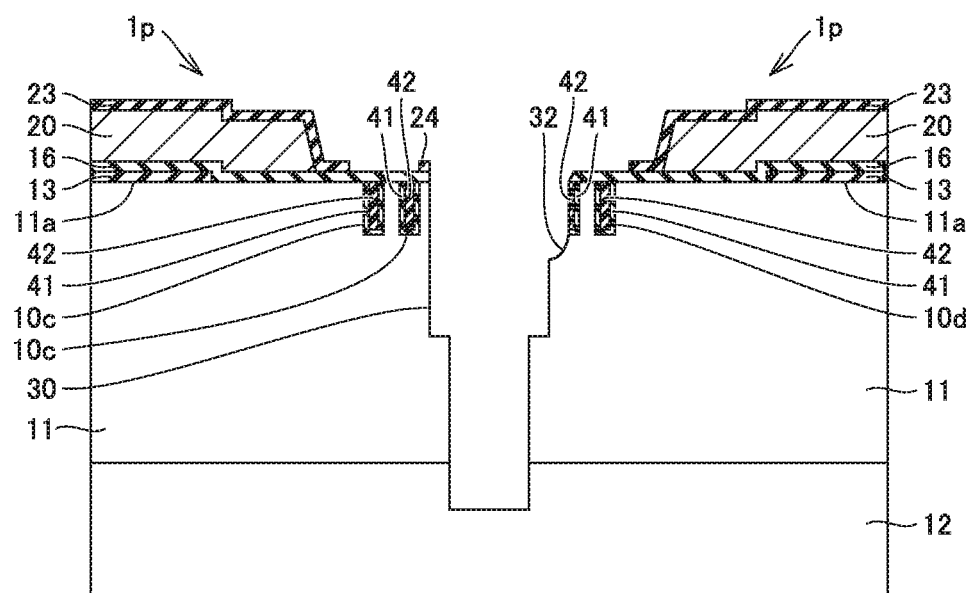
FIG. 71 is a schematic partial enlarged cross sectional view showing a step subsequent to the step shown in FIG. 70 in the method for manufacturing the semiconductor device according to the fourteenth embodiment of the present invention.

With reference to FIG. 71 and FIG. 72, the method for manufacturing semiconductor device 1p in the present embodiment includes cutting (S3p) wafer 10 along the plurality of first groove portions 10c and the plurality of second groove portions 10d using the blade. When cutting (S3p) wafer 10, the blade may not enter the plurality of first groove portions 10c and the plurality of second groove portions 10d. When cutting (S3p) wafer 10, the blade may enter a part of the plurality of first groove portions 10c, or may enter a part of the plurality of second groove portions 10d. When cutting (S3p) wafer 10, at least a portion of first polycrystal film 42 remains.

Even if chipping 32 occurs in substrate 11 when cutting (S3p) wafer 10 as shown in semiconductor device 1p on the right-hand side of FIG. 71, this chipping 32 selectively occurs in fragile region 8. The plurality of first groove portions 10c and the plurality of second groove portions 10d can serve to gradually attenuate the mechanical energy applied from the blade to substrate 11. Therefore, even though width $W_1$ of peripheral region 3 of wafer 10 is narrowed, occurrence of chipping 32 can be prevented in device region 2. Since width $W_1$ of peripheral region 3 of wafer 10 can be narrowed, a yield of semiconductor devices 1p obtained from one wafer 10 is increased, thus reducing the manufacturing cost of semiconductor device 1p.

A space d between adjacent first groove portions 10c may be not more than width $W_7$ of each of the plurality of first groove portions 10c. Therefore, the mechanical strength of wafer 10 between adjacent first groove portions 10c is decreased. Chipping 32 is more likely to occur in fragile region 8 selectively. Therefore, even though width $W_1$ of peripheral region 3 of wafer 10 is narrowed, occurrence of chipping 32 can be prevented in device region 2. Space d between adjacent second groove portions 10d may be not more than width $W_7$ of each of the plurality of second groove portions 10d. Accordingly, the mechanical strength of wafer 10 between adjacent second groove portions 10d is decreased. Chipping 32 is more likely to occur in fragile region 8 selectively. Therefore, even though width $W_1$ of peripheral region 3 of wafer 10 is narrowed, occurrence of chipping 32 can be prevented in device region 2.

Effects of semiconductor device 1p and the method for manufacturing semiconductor device 1p in the present embodiment will be described as follows.

Semiconductor device 1p of the present embodiment includes substrate 11 and first polycrystal film 42. Substrate 11 includes main surface 11a and end surface 30 and is provided with the plurality of first groove portions 10c. Main surface 11a includes peripheral region 3 and device region 2 surrounded by peripheral region 3. Each of the plurality of first groove portions 10c is formed in peripheral region 3, and extends along end surface 30 in the form of a stripe. First polycrystal films 42 are provided in the plurality of first groove portions 10c, and each extend along end surface 30 in the form of a stripe. Fragile region 8 including first polycrystal films 42 provided in the plurality of first groove portions 10c can further prevent occurrence of chipping 32 in device region 2. Semiconductor device 1p of the present embodiment has a structure with which occurrence of chipping 32 can be suppressed in device region 2 and the manufacturing cost of semiconductor device 1p can be reduced.

The method for manufacturing semiconductor device 1p in the present embodiment include forming (S10p) the plurality of first groove portion 10c and the plurality of second groove portions 10d in peripheral region 3 of main surface 10a of wafer 10. The plurality of first groove portions 10c and the plurality of second groove portions 10d are separated from device region 2. Each of the plurality of first groove portions 10c and the plurality of second groove portions 10d extends along the first direction in the form of a stripe. The plurality of first groove portions 10c are separated from the plurality of second groove portions 10d in the second direction orthogonal to the first direction. The method for manufacturing semiconductor device 1p in the present embodiment includes cutting (S3p) wafer 10 along the plurality of first groove portions 10c and the plurality of second groove portions 10d using the blade. When cutting (S3p) wafer 10, the blade does not enter the plurality of first groove portions 10c and the plurality of second groove portions 10d, and at least first groove portions 10c remain.

Even though width $W_1$ of peripheral region 3 of wafer 10 is narrowed, fragile region 8 including first polycrystal film 42 provided in each of the plurality of first groove portions 10c and the plurality of second groove portions 10d can further prevent occurrence of chipping 32 in device region 2 when cutting (S3p) wafer 10. According to the method for manufacturing semiconductor device 1p in the present embodiment, occurrence of chipping 32 can be suppressed in device region 2 and the manufacturing cost of semiconductor device 1p can be reduced.

Fifteenth Embodiment

Figure 73:
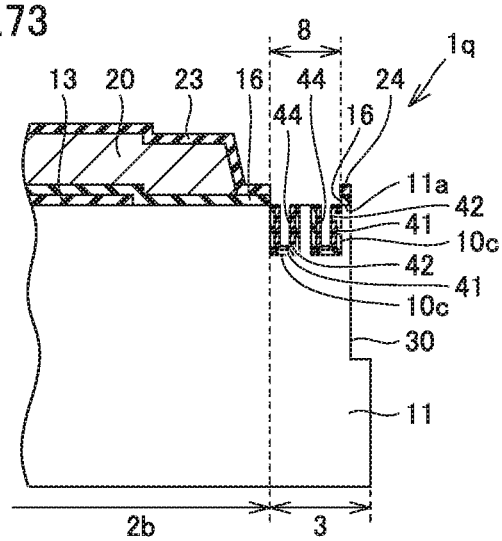
FIG. 73 is a schematic partial enlarged cross sectional view of a semiconductor device according to a fifteenth embodiment of the present invention.

With reference to FIG. 73, a semiconductor device 1q according to a fifteenth embodiment will be described. Semiconductor device 1q of the present embodiment includes a configuration similar to that of semiconductor device 1p of the fourteenth embodiment, but is mainly different therefrom in the following points. In semiconductor device 1q of the present embodiment, first polycrystal film 42 is provided with cavity 44 inside first polycrystal film 42. The plurality of first groove portions 10c are not covered with first insulating film 16.

With reference to FIG. 74 to FIG. 77, a method for manufacturing semiconductor device 1q according to the fifteenth embodiment will be described. The method for manufacturing semiconductor device 1q in the present embodiment includes steps similar to those in the method for manufacturing semiconductor device 1p in the fourteenth embodiment, but is mainly different therefrom in the following points.

Figure 74:
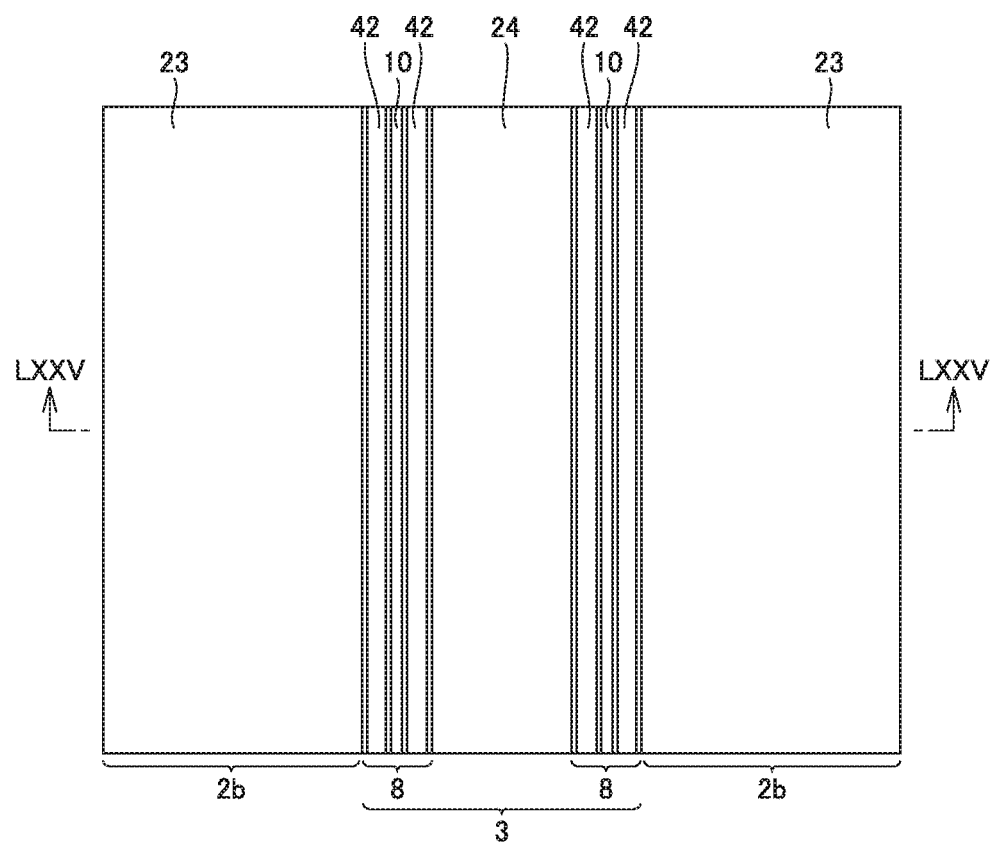
FIG. 74 is a schematic partial enlarged plan view showing one step of a method for manufacturing the semiconductor device according to the fifteenth embodiment of the present invention.
Figure 75:
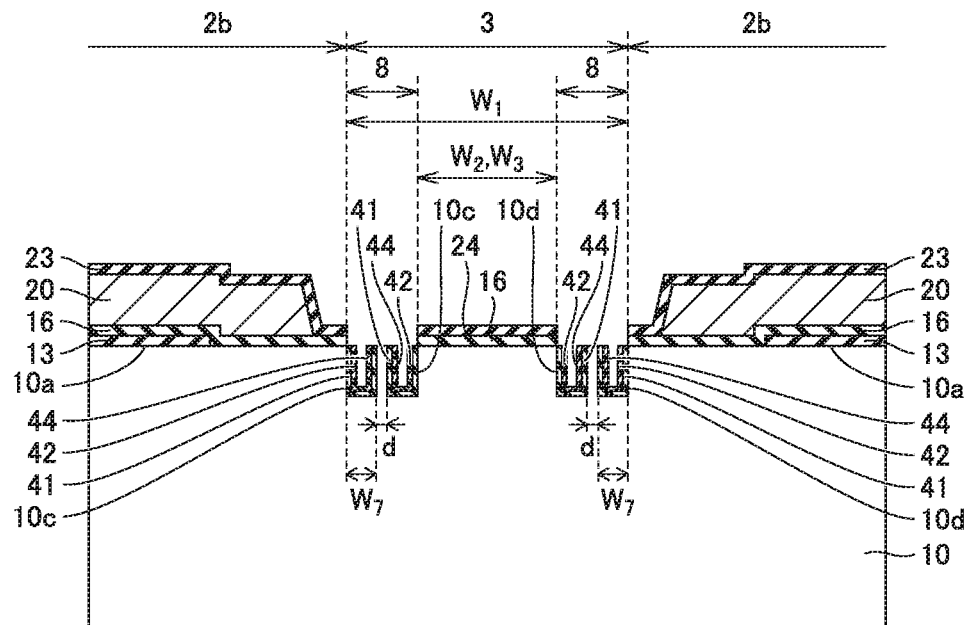
FIG. 75 is a schematic partial enlarged cross sectional view along a cross section line LXXV-LXXV shown in FIG. 74 in one step of the method for manufacturing the semiconductor device according to a fifteenth embodiment of the present invention.
Figure 76:
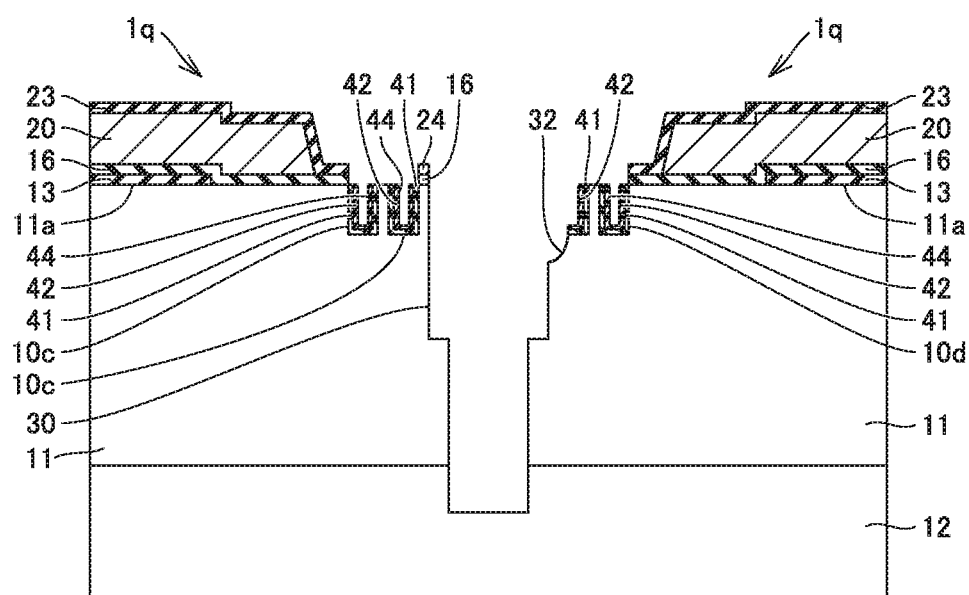
FIG. 76 is a schematic partial enlarged cross sectional view showing a step subsequent to the step shown in FIG. 75 in the method for manufacturing the semiconductor device according to the fifteenth embodiment of the present invention.
Figure 77:
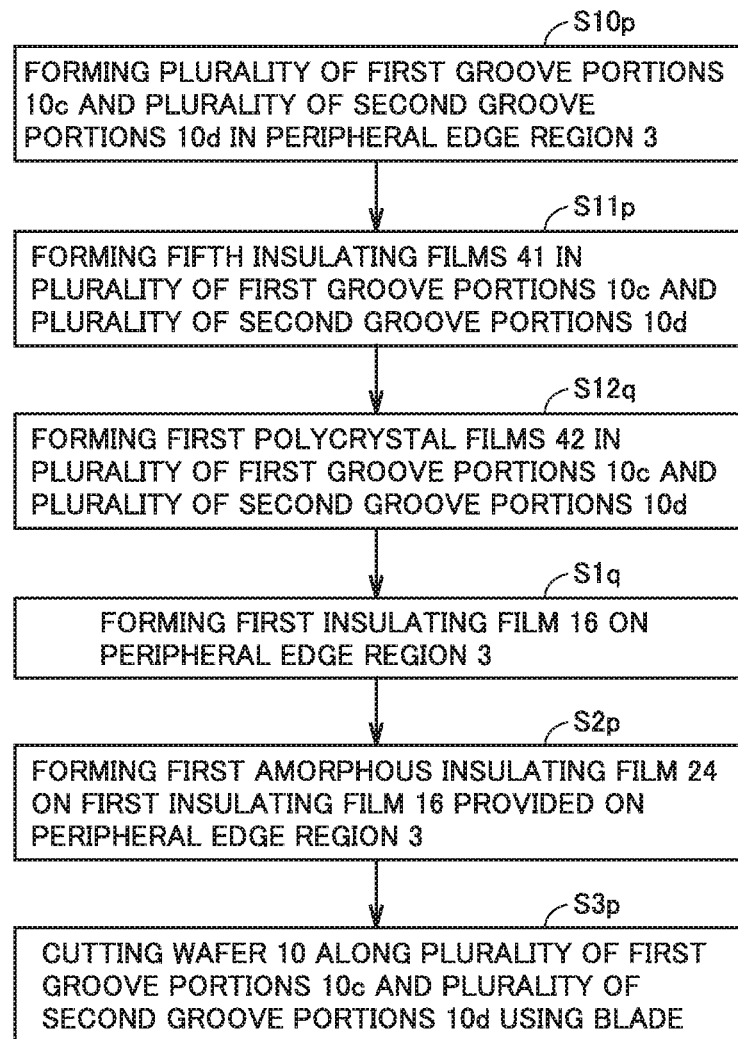
FIG. 77 shows a flowchart of the method for manufacturing the semiconductor device according to the fifteenth embodiment of the present invention.

With reference to FIG. 74, FIG. 75, and FIG. 77, the method for manufacturing semiconductor device 1q in the present embodiment includes forming (S12q) first polycrystal films 42 in the plurality of first groove portions 10c and the plurality of second groove portions 10d. Specifically, first polycrystal films 42 may be formed on the insulating films in the plurality of first groove portions 10c and the plurality of second groove portions 10d. Each of first polycrystal films 42 is provided with cavity 44 inside first polycrystal film 42. The region of wafer 10 in which first polycrystal film 42 is formed is a fragile region 8 of wafer 10. Fragile region 8 of wafer 10 is more likely to be cracked than other regions of wafer 10.

With reference to FIG. 74, FIG. 75, and FIG. 77, the method for manufacturing semiconductor device 1q in the present embodiment includes forming (S1q) first insulating film 16 on peripheral region 3 of main surface 10a of wafer 10. First insulating film 16 formed on peripheral region 3 extends along the first direction in the form of a stripe. First insulating film 16 is not formed on first polycrystal film 42. Width $W_3$ of first insulating film 16 is smaller than width $W_1$ of peripheral region 3. Width $W_3$ of first insulating film 16 may be smaller than the maximum width of the blade.

In addition to the effects of semiconductor device 1p and the method for manufacturing semiconductor device 1p in the fourteenth embodiment, semiconductor device 1q and the method for manufacturing semiconductor device 1q in the present embodiment exhibit the following effects.

In each of semiconductor device 1q and the method for manufacturing semiconductor device 1q in the present embodiment, first polycrystal film 42 is provided with cavity 44 inside first polycrystal film 42. Therefore, as compared with fragile region 8 of wafer 10 in the fourteenth embodiment, chipping 32 occurs more selectively in fragile region 8 of wafer 10 in the present embodiment. According to semiconductor device 1q and the method for manufacturing semiconductor device 1q in the present embodiment, occurrence of chipping 32 can be further prevented in device region 2. Semiconductor device 1q of the present embodiment has a structure with which occurrence of chipping 32 can be suppressed in device region 2 and the manufacturing cost of semiconductor device 1q can be reduced. According to the method for manufacturing semiconductor device 1q in the present embodiment, occurrence of chipping 32 can be suppressed in device region 2 and the manufacturing cost of semiconductor device 1q can be reduced.

First insulating film 16 is not formed in fragile region 8 in the present embodiment. Therefore, as compared with fragile region 8 of wafer 10 in the fourteenth embodiment, chipping 32 occurs more selectively in fragile region 8 of wafer 10 in the present embodiment. According to semiconductor device 1q and the method for manufacturing semiconductor device 1q in the present embodiment, occurrence of chipping 32 can be further prevented in device region 2. Semiconductor device 1q of the present embodiment has a structure with which occurrence of chipping 32 can be suppressed in device region 2 and the manufacturing cost of semiconductor device 1q can be reduced. According to the method for manufacturing semiconductor device 1q in the present embodiment, occurrence of chipping 32 can be suppressed in device region 2 and the manufacturing cost of semiconductor device 1q can be reduced.

Sixteenth Embodiment

Figure 78:
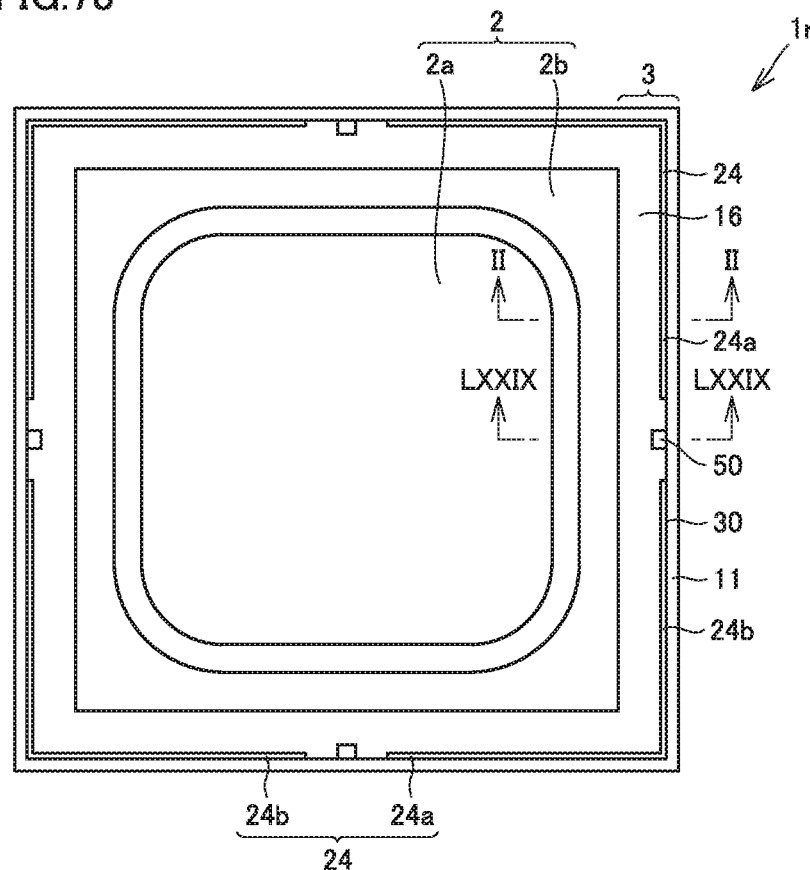
FIG. 78 is a schematic plan view of a semiconductor device according to a sixteenth embodiment of the present invention.
Figure 79:
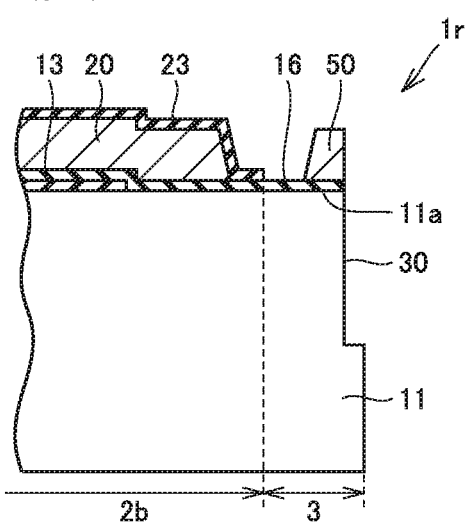
FIG. 79 is a schematic partial enlarged cross sectional view of the semiconductor device according to the sixteenth embodiment of the present invention along a cross section line LXXIX-LXXIX shown in FIG. 78.

With reference to FIG. 78 and FIG. 79, a semiconductor device 1r according to a sixteenth embodiment will be described. Semiconductor device 1r of the present embodiment includes a configuration similar to that of semiconductor device 1 of the first embodiment, but is mainly different therefrom in the following points.

Semiconductor device 1r of the present embodiment further includes a second conductive film 50 provided on first insulating film 16 provided on peripheral region 3. Second conductive film 50 is separated from first amorphous insulating film 24 in the first direction. Second conductive film 50 is a portion of an alignment mark 51 shown in FIG. 80 and FIG. 81. Second conductive film 50 may be flush with end surface 30 of substrate 11. Second conductive film 50 may be thicker than first insulating film 16. Second conductive film 50 may be composed of the same material as that of electrode film 20, or may be composed of a different material. Second conductive film 50 may be an AlSi film or Al film, for example.

First amorphous insulating film 24 includes a first amorphous insulating film portion 24a and a second amorphous insulating film portion 24b. Each of first amorphous insulating film portion 24a and second amorphous insulating film portion 24b extends along the first direction in the form of a stripe. First amorphous insulating film portion 24a and second amorphous insulating film portion 24b are separated from each other in the first direction. When main surface 11a of substrate 11 is viewed in a plan view, the length of first amorphous insulating film portion 24a may be not less than ⅙ of the length of end surface 30, may be not less than ¼ of the length of end surface 30, may be not less than ⅓ of the length of end surface 30, or may be not less than ⅜ of the length of end surface 30. When main surface 11a of substrate 11 is viewed in a plan view, the length of first amorphous insulating film 24 is smaller than ½ of the length of end surface 30. When main surface 11a of substrate 11 is viewed in a plan view, the length of second amorphous insulating film portion 24b may be not less than ⅙ of the length of end surface 30, may be not less than ¼ of the length of end surface 30, may be not less than ⅓ of the length of end surface 30, or may be not less than ⅜ of the length of end surface 30. When main surface 11a of substrate 11 is viewed in a plan view, the length of second amorphous insulating film 23 is smaller than ½ of the length of end surface 30.

The length of second conductive film 50 in the first direction is shorter than the length of first amorphous insulating film portion 24a in the first direction. The length of second conductive film 50 in the first direction is shorter than the length of second amorphous insulating film portion 24b in the first direction. Second conductive film 50, first amorphous insulating film portion 24a, and second amorphous insulating film portion 24b are disposed along end surface 30 of substrate 11. First amorphous insulating film portion 24a and second amorphous insulating film portion 24b are flush with end surface 30 of substrate 11. Second conductive film 50 is sandwiched between first amorphous insulating film portion 24a and second amorphous insulating film portion 24b.

With reference to FIG. 80 to FIG. 83, a method for manufacturing semiconductor device 1r according to the sixteenth embodiment will be described. The method for manufacturing semiconductor device 1r in the present embodiment includes steps similar to those in the method for manufacturing semiconductor device 1 in the first embodiment, but is mainly different therefrom in the following points.

Figure 80:
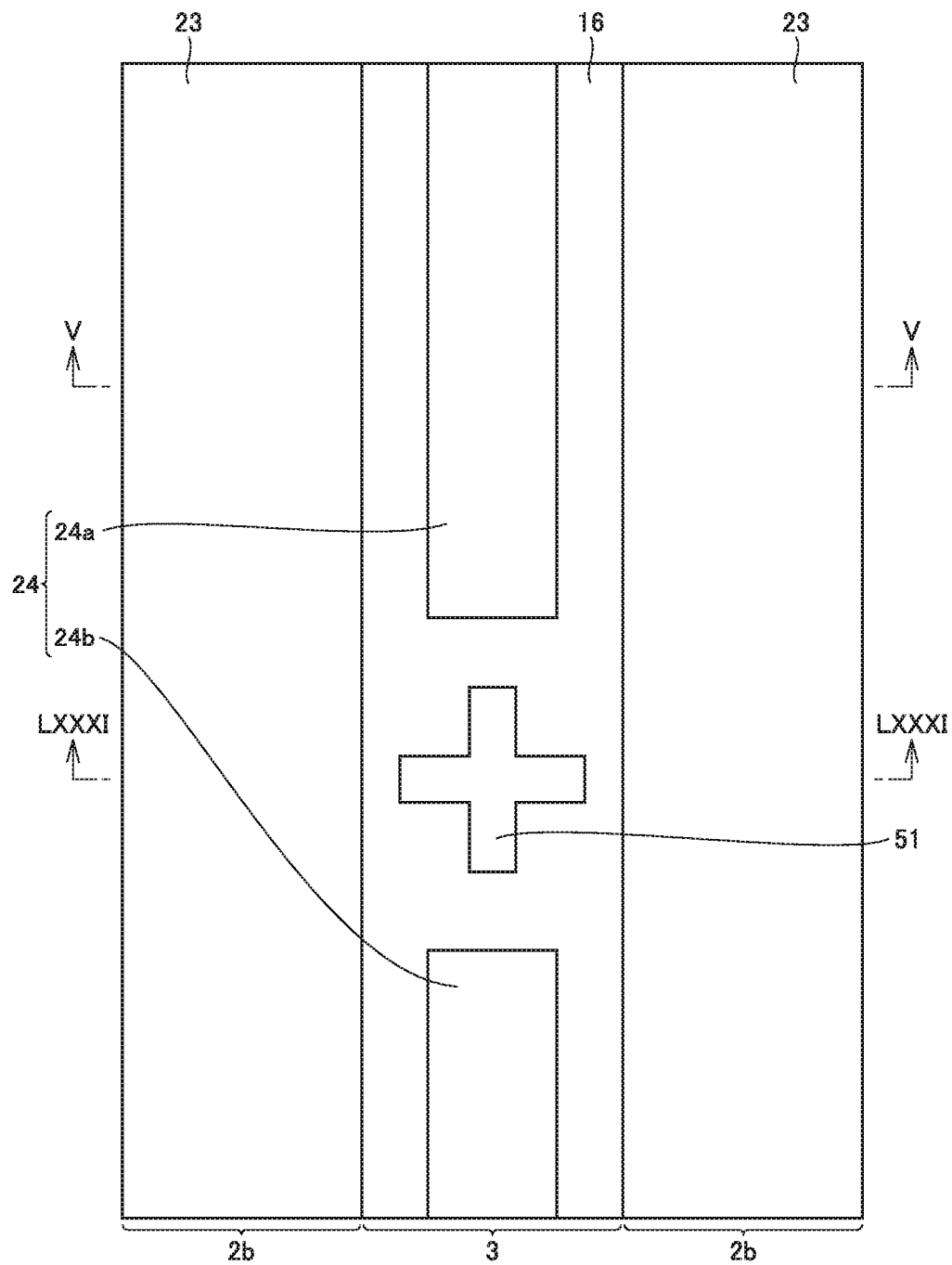
FIG. 80 is a schematic partial enlarged plan view showing one step of a method for manufacturing the semiconductor device according to the sixteenth embodiment of the present invention.
Figure 81:
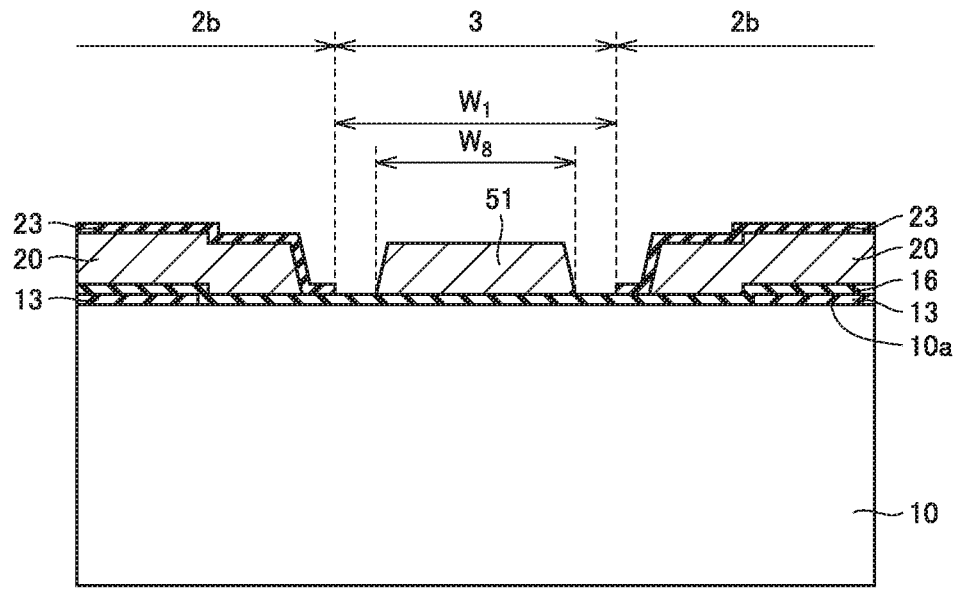
FIG. 81 is a schematic partial enlarged cross sectional view along a cross section line LXXXI-LXXXI shown in FIG. 80 in one step of the method for manufacturing the semiconductor device according to the sixteenth embodiment of the present invention.
Figure 83:
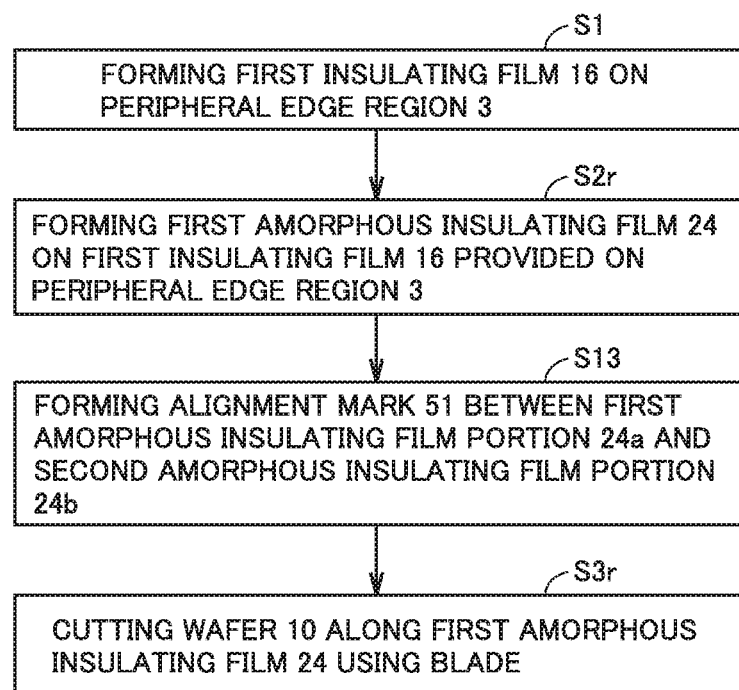
FIG. 83 shows a flowchart of the method for manufacturing the semiconductor device according to the sixteenth embodiment of the present invention.

With reference to FIG. 80, FIG. 81, and FIG. 83, the method for manufacturing semiconductor device 1r in the present embodiment includes forming (S2r) first amorphous insulating film 24 on first insulating film 16. First amorphous insulating film 24 includes first amorphous insulating film portion 24a and second amorphous insulating film portion 24b. Each of first amorphous insulating film portion 24a and second amorphous insulating film portion 24b extends along the first direction in the form of a stripe. First amorphous insulating film portion 24a and second amorphous insulating film portion 24b are separated from each other in the first direction. Forming (S2r) first amorphous insulating film 24 in the present embodiment is basically the same as forming (S2) first amorphous insulating film 24 in the first embodiment.

With reference to FIG. 80, FIG. 81, and FIG. 83, the method for manufacturing semiconductor device 1r in the present embodiment includes forming (S13) alignment mark 51 between first amorphous insulating film portion 24a and second amorphous insulating film portion 24b. Second conductive film 50 may be formed on first insulating film 16. Alignment mark 51 is disposed on peripheral region 3, and is separated from device region 2. Width $W_8$ of alignment mark 51 is smaller than width $W_1$ of peripheral region 3. Width $W_8$ of alignment mark 51 is larger than the thickness of the blade to be used when cutting (S3r) wafer 10. Alignment mark 51 may be an AlSi film or Al film, for example. Forming (S13) alignment mark 51 may be performed in the same step as forming electrode films 20 on a plurality of device regions 2.

Figure 82:
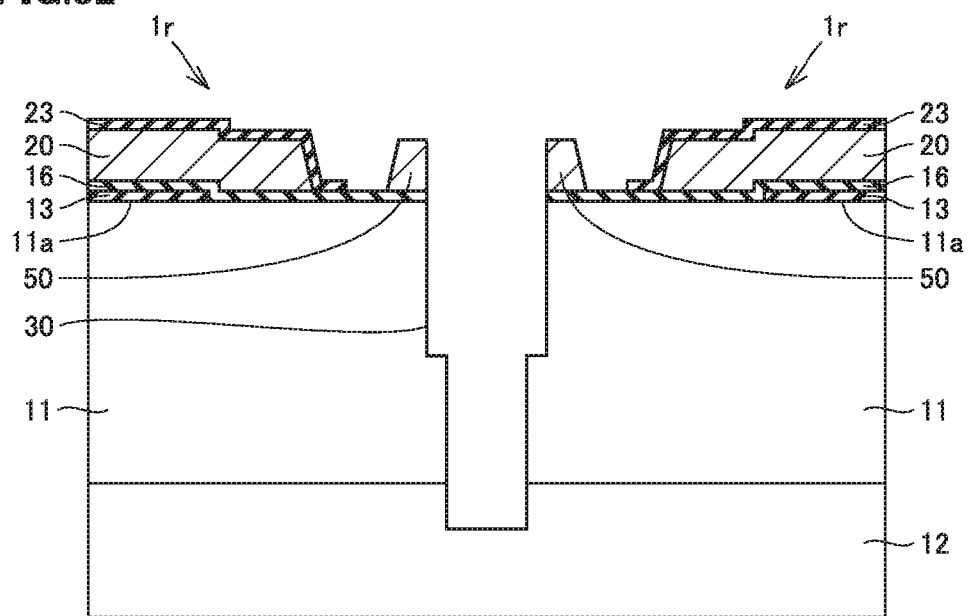
FIG. 82 is a schematic partial enlarged cross sectional view showing a step subsequent to the step shown in FIG. 81 in the method for manufacturing the semiconductor device according to the sixteenth embodiment of the present invention.

With reference to FIG. 82 and FIG. 83, the method for manufacturing semiconductor device 1r in the present embodiment includes cutting (S3r) wafer 10 along first amorphous insulating film 24 using the blade. When cutting (S3r) wafer 10, the central portion of first amorphous insulating film portion 24a, the central portion of second amorphous insulating film portion 24b, and the central portion of alignment mark 51 are removed, whereas the end portions of first amorphous insulating film portion 24a, the end portions of second amorphous insulating film portion 24b, and the end portions of alignment mark 51 remain adjacent to the both ends of the blade in the width direction thereof. The end portions of alignment mark 51 correspond to second conductive films 50. Cutting (S3r) wafer 10 along first amorphous insulating film 24 in the present embodiment is the same as cutting (S3) wafer 10 along first amorphous insulating film 24 in the first embodiment.

In addition to the effects of semiconductor device 1 and the method for manufacturing semiconductor device 1 in the first embodiment, semiconductor device 1r and the method for manufacturing semiconductor device 1r in the present embodiment exhibit the following effects.

In each of semiconductor device 1r and the method for manufacturing semiconductor device 1r in the present embodiment, first amorphous insulating film 24 sandwiches second conductive film 50 or alignment mark 51. In peripheral region 3 in which first amorphous insulating film 24 is formed, occurrence of chipping 32 is suppressed in device region 2. Therefore, also in peripheral region 3 in which second conductive film 50 or alignment mark 51 is formed, chipping 32 can be less likely to occur in device region 2. Semiconductor device 1r of the present embodiment has a structure with which occurrence of chipping 32 can be suppressed in device region 2 and the manufacturing cost of semiconductor device 1r can be reduced. According to the method for manufacturing semiconductor device 1r in the present embodiment, even if second conductive film 50 or alignment mark 51 is formed on peripheral region 3 of wafer 10, occurrence of chipping 32 can be suppressed in device region 2 and the manufacturing cost of semiconductor device 1r can be reduced.

Seventeenth Embodiment

Figure 84:
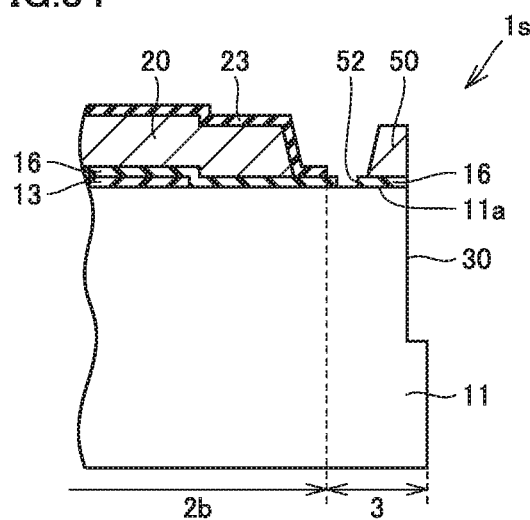
FIG. 84 is a schematic partial enlarged cross sectional view of a semiconductor device according to a seventeenth embodiment of the present invention.

With reference to FIG. 84, a semiconductor device is according to a seventeenth embodiment will be described. Semiconductor device is of the present embodiment includes a configuration similar to that of semiconductor device 1r of the sixteenth embodiment, but is mainly different therefrom in the following points. In semiconductor device is of the present embodiment, first insulating film 16 provided on peripheral region 3 between device region 2 and second conductive film 50 is provided with a through hole 52 extending along end surface 30 in the form of a stripe. In through hole 52, substrate 11 has exposed main surface 11a. The length of through hole 52 in the first direction may be larger than the length of second conductive film 50 in the first direction.

With reference to FIG. 85 to FIG. 88, a method for manufacturing semiconductor device is according to the seventeenth embodiment will be described. The method for manufacturing semiconductor device is in the present embodiment includes steps similar to those in the method for manufacturing semiconductor device 1r in the sixteenth embodiment, but is mainly different therefrom in the following points.

Figure 85:
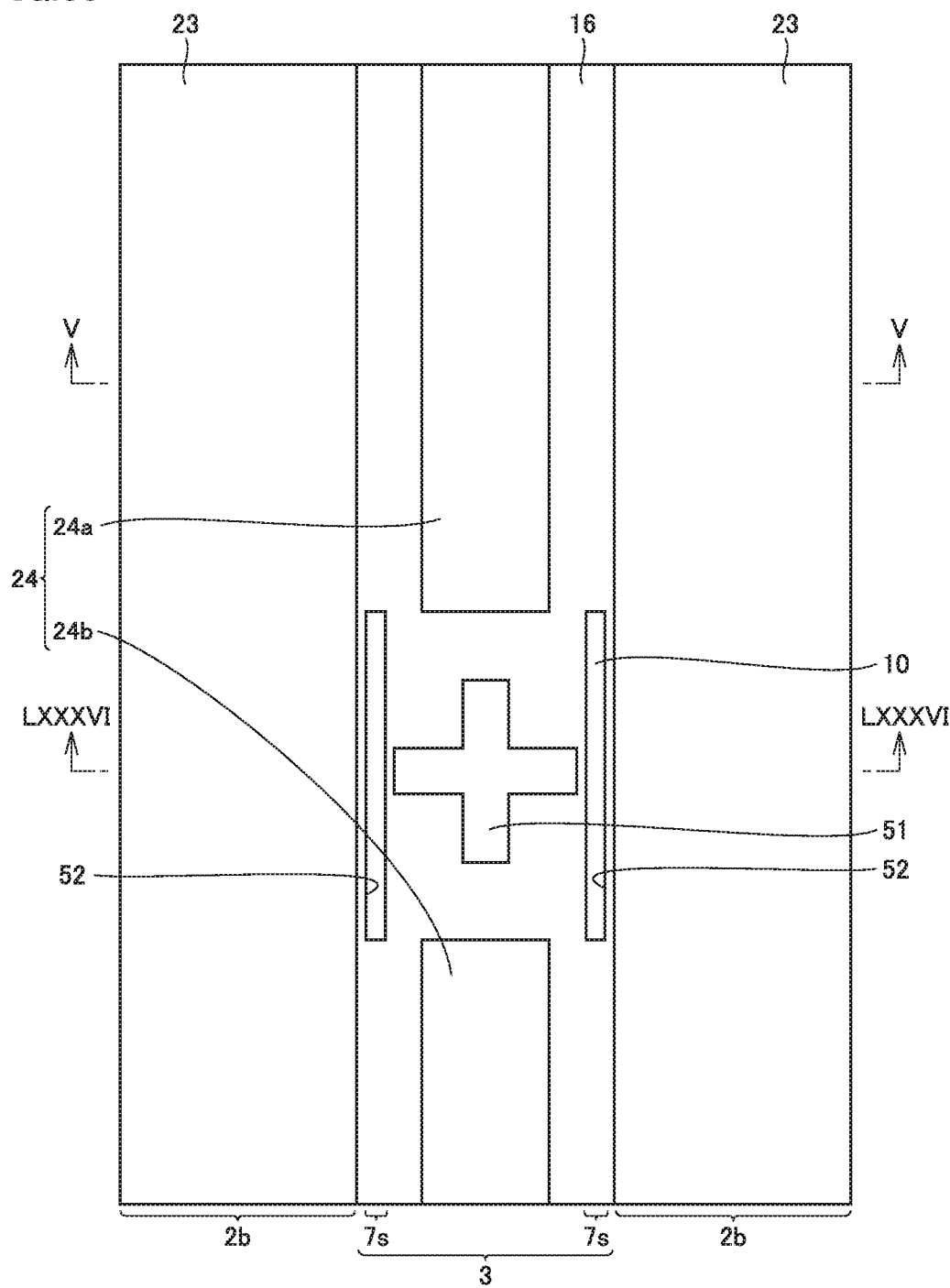
FIG. 85 is a schematic partial enlarged plan view showing one step of a method for manufacturing the semiconductor device according to the seventeenth embodiment of the present invention.
Figure 86:
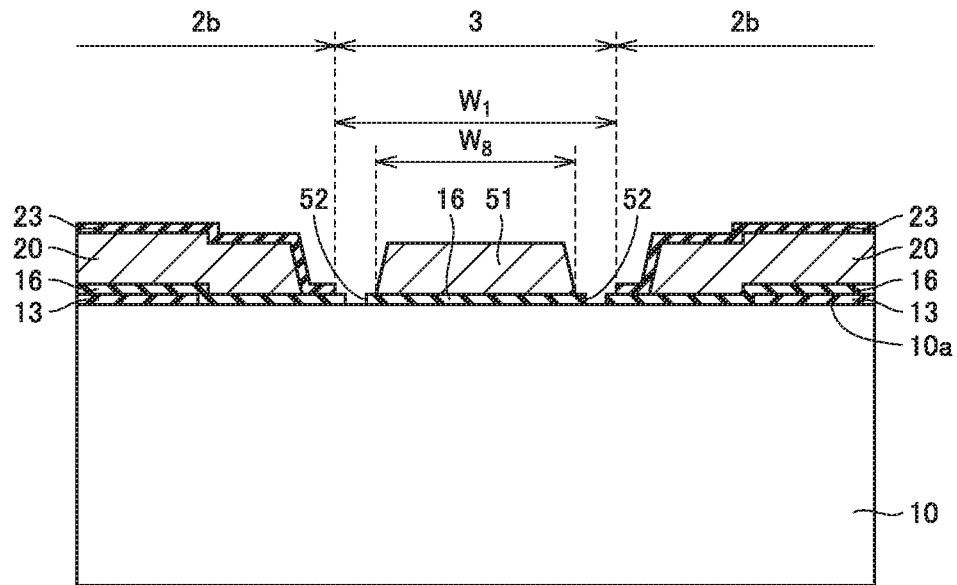
FIG. 86 is a schematic partial enlarged cross sectional view along a cross section line LXXXVI-LXXXVI shown in FIG. 85 in one step of the method for manufacturing the semiconductor device according to a seventeenth embodiment of the present invention.
Figure 88:
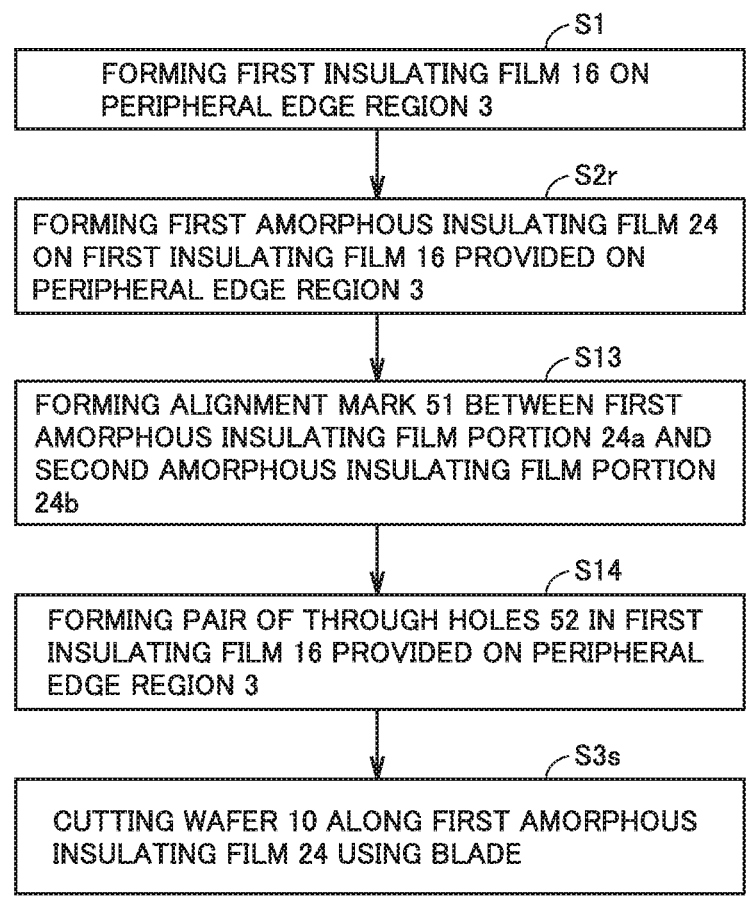
FIG. 88 shows a flowchart of the method for manufacturing the semiconductor device according to the seventeenth embodiment of the present invention.

With reference to FIG. 85, FIG. 86, and FIG. 88, the method for manufacturing semiconductor device is in the present embodiment includes forming (S14) a pair of through holes 52 in first insulating film 16 provided on peripheral region 3. Each of the pair of through holes 52 is located between alignment mark 51 and corresponding device region 2. The pair of through holes 52 may be formed by etching portions of first insulating film 16. The pair of through holes 52 extend along the first direction. The pair of through holes 52 are separated from each other in the first direction orthogonal to the second direction. A space between the pair of through holes 52 is larger than the thickness of the blade to be used when cutting (S3s) wafer 10. The length of each of the pair of through holes 52 in the first direction may be larger than the length of alignment mark 51 in the first direction. Each of the pair of through holes 52 may have a width of not less than 1 μm, for example. Each of the pair of through holes 52 may have a width of not more than 5 μm, for example. The width of each of the pair of through holes 52 is defined as the length of each of the pair of through holes 52 in the second direction orthogonal to the first direction.

Figure 87:
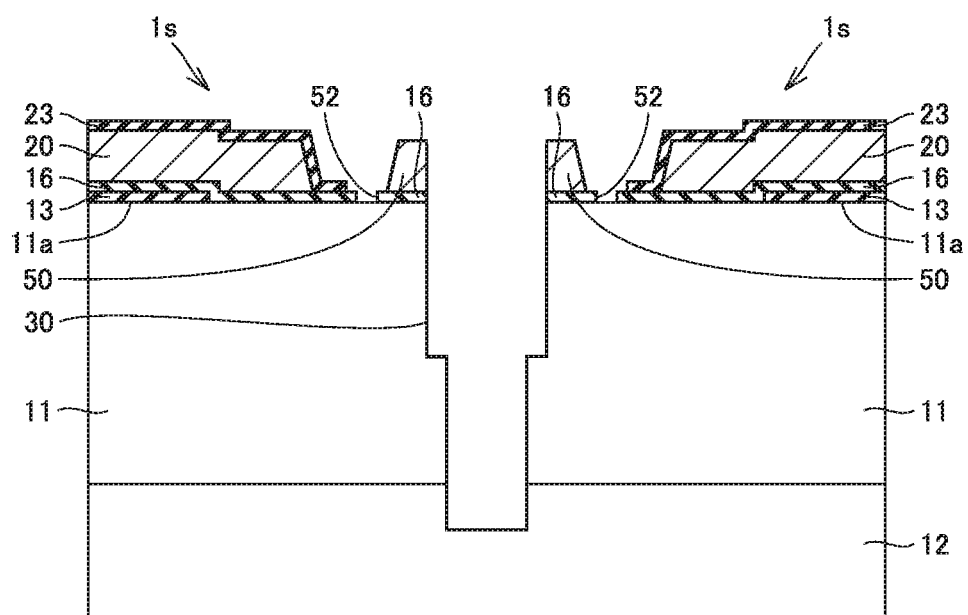
FIG. 87 is a schematic partial enlarged cross sectional view showing a step subsequent to the step shown in FIG. 86 in the method for manufacturing the semiconductor device according to the seventeenth embodiment of the present invention.

With reference to FIG. 87 and FIG. 88, the method for manufacturing semiconductor device is in the present embodiment includes cutting (S3s) wafer 10 along first amorphous insulating film 24 using the blade. Cutting (S3s) wafer 10 along first amorphous insulating film 24 in the present embodiment is basically the same as cutting (S3r) wafer 10 along first amorphous insulating film 24 in the sixteenth embodiment. When cutting (S3s) wafer 10, the central portion of first amorphous insulating film portion 24a and the central portion of second amorphous insulating film portion 24b are removed, whereas the end portions of first amorphous insulating film portion 24a, the end portions of second amorphous insulating film portion 24b, and the pair of through holes 52 remain adjacent to the both ends of the blade in the width direction thereof.

In addition to the effects of semiconductor device 1r and the method for manufacturing semiconductor device 1r in the sixteenth embodiment, semiconductor device 1s and the method for manufacturing semiconductor device 1s in the present embodiment exhibit the following effects.

In semiconductor device is of the present embodiment, first insulating film 16 is provided with through hole 52 between device region 2 and second conductive film 50. Therefore, even if first insulating film 16 formed under second conductive film 50 is damaged, through hole 52 can suppress this damage from reaching device region 2 via first insulating film 16. The structure (for example, electrode film 20) formed on the surface of device region 2 can be suppressed from being damaged. Semiconductor device is of the present embodiment has a structure with which occurrence of chipping 32 can be suppressed in device region 2 and the manufacturing cost of semiconductor device is can be reduced.

The method for manufacturing semiconductor device is in the present embodiment further includes forming (S14) the pair of through holes 52 in first insulating film 16 provided on peripheral region 3. Therefore, even if first insulating film 16 formed under alignment mark 51 is damaged when cutting (S3r) wafer 10, the pair of through holes 52 can suppress this damage from reaching device region 2 via first insulating film 16. The structure (for example, electrode film 20) formed on the surface of device region 2 can be suppressed from being damaged. According to the method for manufacturing semiconductor device is in the present embodiment, occurrence of chipping 32 can be suppressed in device region 2 and the manufacturing cost of semiconductor device is can be reduced.

Eighteenth Embodiment

Figure 89:
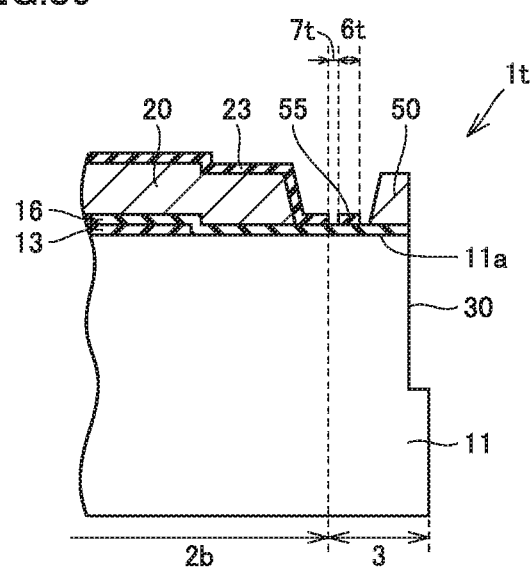
FIG. 89 is a schematic partial enlarged cross sectional view of a semiconductor device according to an eighteenth embodiment of the present invention.

With reference to FIG. 89, a semiconductor device 1t according to an eighteenth embodiment will be described. Semiconductor device 1t of the present embodiment includes a configuration similar to that of semiconductor device 1r of the sixteenth embodiment, but is mainly different therefrom in the following points.

Semiconductor device 1t of the present embodiment further includes a sixth insulating film 55 provided on first insulating film 16 provided on peripheral region 3. Sixth insulating film 55 is provided between device region 2 and second conductive film 50, and is separated from device region 2 and second conductive film 50. Sixth insulating film 55 extends along end surface 30 of substrate 11 in the form of a stripe. The length of sixth insulating film 55 in the first direction may be larger than the length of second conductive film 50 in the first direction. Sixth insulating film 55 may be separated from device region 2 by not less than 1 μm. Sixth insulating film 55 may be separated from device region 2 by not more than 5 μm. Sixth insulating film 55 may be composed of a material different from that of first insulating film 16. Sixth insulating film 55 may be composed of the same material as that of second amorphous insulating film 23 or may be composed of a material different therefrom. Sixth insulating film 55 may be an amorphous silicon nitride film, for example.

Semiconductor device 1t of the present embodiment includes a third stripe structure portion 6t and a fourth stripe structure portion 7t. Third stripe structure portion 6t is located on peripheral region 3, and extends along end surface 30. Fourth stripe structure portion 7t is located on peripheral region 3, and extends along end surface 30. Third stripe structure portion 6t is located between device region 2 and second conductive film 50. Fourth stripe structure portion 7t is located between device region 2 and third stripe structure portion 6t. Third stripe structure portion 6t is thicker than fourth stripe structure portion 7t. The width of third stripe structure portion 6t may be larger than the width of fourth stripe structure portion 7t. The width of fourth stripe structure portion 7t may be not less than 1 μm, for example. The width of fourth stripe structure portion 7t may be not more than 5 μm, for example.

Third stripe structure portion 6t includes a portion of first insulating film 16 and sixth insulating film 55 provided on the portion of first insulating film 16. Fourth stripe structure portion 7t includes first insulating film 16, but does not include sixth insulating film 55. Fourth stripe structure portion 7t may not include first insulating film 16, and main surface 11a of substrate 11 may be exposed through first insulating film 16. In fourth stripe structure portion 7t, substrate 11 may have exposed main surface 11a.

With reference to FIG. 90 to FIG. 93, a method for manufacturing semiconductor device 1t according to the eighteenth embodiment will be described. The method for manufacturing semiconductor device 1t in the present embodiment includes steps similar to those in the method for manufacturing semiconductor device 1r in the sixteenth embodiment, but is mainly different therefrom in the following points.

Figure 90:
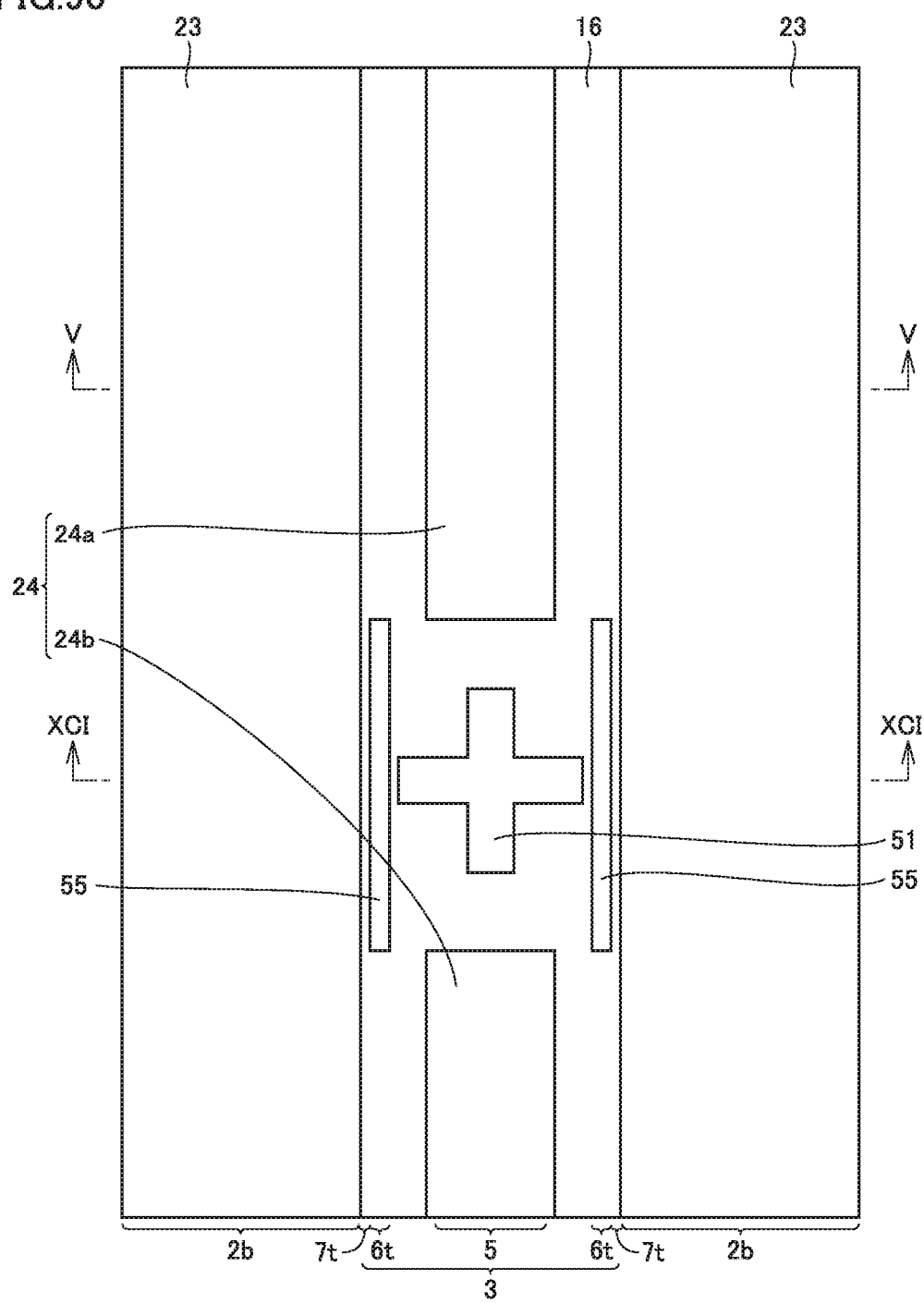
FIG. 90 is a schematic partial enlarged plan view showing one step of a method for manufacturing the semiconductor device according to the eighteenth embodiment of the present invention.
Figure 91:
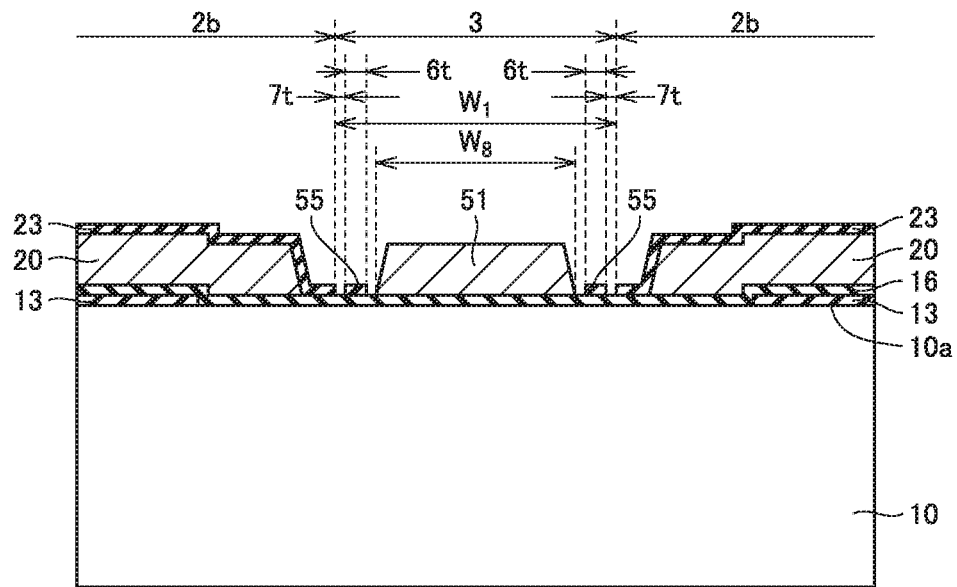
FIG. 91 is a schematic partial enlarged cross sectional view along a cross section line XCI-XCI shown in FIG. 90 in one step of the method for manufacturing the semiconductor device according to the eighteenth embodiment of the present invention.
Figure 93:
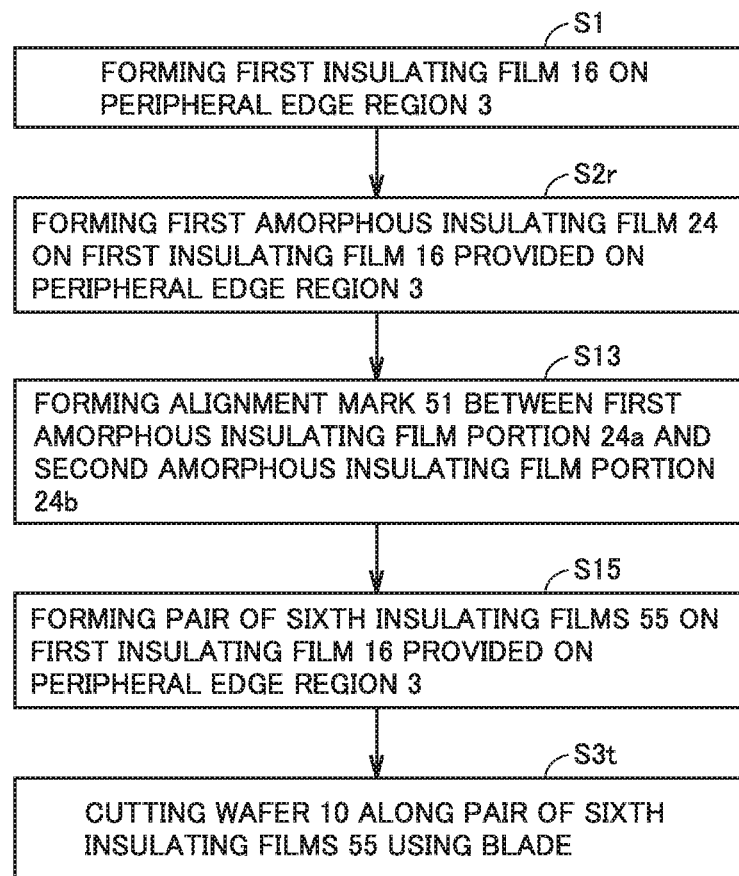
FIG. 93 shows a flowchart of the method for manufacturing the semiconductor device according to the eighteenth embodiment of the present invention.

With reference to FIG. 90, FIG. 91, and FIG. 93, the method for manufacturing semiconductor device 1t in the present embodiment further includes forming (S15) a pair of sixth insulating films 55 on first insulating film 16 provided on peripheral region 3. The pair of sixth insulating films 55 may be formed on first insulating film 16 using the chemical vapor deposition (CVD) method, the evaporation method, or the spin coat method, for example. Forming (S15) the pair of sixth insulating films 55 may be performed in the same step as forming second amorphous insulating film 23 on electrode film 20.

Each of the pair of sixth insulating films 55 is provided between corresponding device region 2 and alignment mark 51, and are separated from device region 2 and alignment mark 51. Each of the pair of sixth insulating films 55 extends along the first direction in the form of a stripe. The pair of sixth insulating films 55 are separated from each other in the second direction orthogonal to the first direction. The length of each sixth insulating film 55 in the first direction may be larger than the length of alignment mark 51 in the first direction. The pair of sixth insulating films 55 are separated from each other in the second direction orthogonal to the first direction. A space between the pair of sixth insulating films 55 is larger than the thickness of the blade to be used when cutting (S3t) wafer 10.

Third stripe structure portions 6t are portions of peripheral region 3 in which the pair of sixth insulating films 55 are formed on first insulating film 16. Third stripe structure portions 6t are thicker than portions located adjacent to respective sides of third stripe structure portions 6t and extending along the first direction in the form of a stripe. Specifically, third stripe structure portions 6t are thicker than fourth stripe structure portions 7t. Each of third stripe structure portions 6t is thicker than a portion located between third stripe structure portion 6t and alignment mark 51 and extending along the first direction in the form of a stripe. For example, third stripe structure portion 6t includes first insulating film 16 and sixth insulating film 55 on first insulating film 16. Each of fourth stripe structure portions 7t includes first insulating film 16, but does not include sixth insulating film 55. Fourth stripe structure portion 7t is located between third stripe structure portion 6t and device region 2, and is adjacent to third stripe structure portion 6t. The portion located between third stripe structure portion 6t and alignment mark 51 and extending along the first direction in the form of a stripe includes first insulating film 16 but does not include sixth insulating film 55.

Figure 92:
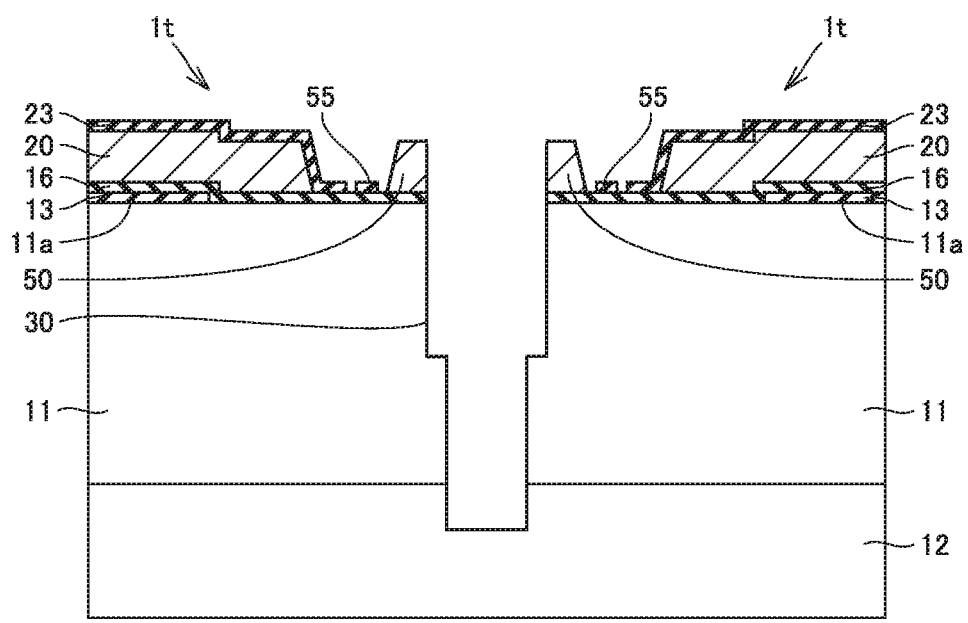
FIG. 92 is a schematic partial enlarged cross sectional view showing a step subsequent to the step shown in FIG. 91 in the method for manufacturing the semiconductor device according to the eighteenth embodiment of the present invention.

With reference to FIG. 92 and FIG. 93, the method for manufacturing semiconductor device 1t in the present embodiment further includes cutting (S3t) wafer 10 along the pair of sixth insulating films 55 using the blade. When cutting (S3t) wafer 10, the central portion of first amorphous insulating film portion 24a, the central portion of second amorphous insulating film portion 24b, and the central portion of alignment mark 51 are removed, whereas the end portions of first amorphous insulating film portion 24a, the end portions of second amorphous insulating film portion 24b, and the end portions of alignment mark 51, and at least portions of the pair of sixth insulating films 55 remain adjacent to the both ends of the blade in the width direction thereof. Specifically, when cutting (S3t) wafer 10, all of the pair of sixth insulating films 55 may remain adjacent to the both ends of the blade in the width direction thereof.

Each of third stripe structure portions 6t includes first insulating film 16 and sixth insulating film 55 stacked on first insulating film 16. Third stripe structure portions 6t are thicker than portions located adjacent to respective sides of third stripe structure portions 6t and extending along the first direction in the form of a stripe. Mechanical energy required to chip the portion of wafer 10 on which third stripe structure portion 6t is formed is larger than mechanical energy required to chip the portions of wafer 10 located adjacent to respective sides of third stripe structure portion 6t. Therefore, even if a crack is generated near the portion of wafer 10 located under alignment mark 51 when cutting (S3t) wafer 10, first stripe structure portion 6 can prevent this crack from reaching device region 2.

Thus, even though width $W_1$ of peripheral region 3 of wafer 10 is narrowed, occurrence of chipping can be prevented in device region 2. Since width $W_1$ of peripheral region 3 of wafer 10 can be narrowed, a yield of semiconductor devices 1t obtained from one wafer 10 is increased, thus reducing the manufacturing cost of semiconductor device 1t. By setting the width of fourth stripe structure portion 7t to be not more than 5 μm, the width of third stripe structure portion 6t can be increased. Therefore, third stripe structure portion 6t can further prevent occurrence of chipping in device region 2.

Further, sixth insulating film 55 is separated from device region 2. In fourth stripe structure portion 7t, sixth insulating film 55 is not formed. Therefore, even if sixth insulating film 55 provided between fourth stripe structure portions 7t is damaged when cutting (S3t) wafer 10, this damage can be prevented from reaching device region 2 via sixth insulating film 55. By setting the width of fourth stripe structure portion 7t to be not less than 1 μm, this damage can be further prevented from reaching device region 2. The structure (for example, electrode film 20) formed on the surface of device region 2 can be suppressed from being damaged.

In addition to the effects of semiconductor device 1r and the method for manufacturing semiconductor device 1r in the sixteenth embodiment, semiconductor device 1t and the method for manufacturing semiconductor device 1t in the present embodiment exhibit the following effects.

Semiconductor device 1t of the present embodiment further includes sixth insulating film 55 provided on first insulating film 16 provided on peripheral region 3. Even though the width of peripheral region 3 is narrowed, the third stripe structure portion including first insulating film 16 and sixth insulating film 55 stacked on first insulating film 16 can prevent occurrence of chipping in device region 2. Semiconductor device 1t of the present embodiment has a structure with which occurrence of chipping 32 can be suppressed in device region 2 and the manufacturing cost of semiconductor device 1t can be reduced.

In semiconductor device 1t of the present embodiment, third stripe structure portion 6t includes a portion of first insulating film 16, and sixth insulating film 55 provided on the portion of first insulating film 16. Fourth stripe structure portion 7t includes first insulating film 16. A portion of first insulating film 16 is provided on peripheral region 3, and extends along end surface 30 in the form of a stripe. Third insulating film 25 extends along end surface 30 in the form of a stripe. Fourth stripe structure portion 7t separates sixth insulating film 55 from device region 2. Hence, even if sixth insulating film 55 is damaged, this damage can be prevented from reaching device region 2 via sixth insulating film 55. The structure (for example, electrode film 20) formed on the surface of device region 2 can be suppressed from being damaged. Semiconductor device 1t of the present embodiment has a structure with which occurrence of chipping 32 can be suppressed in device region 2 and the manufacturing cost of semiconductor device 1t can be reduced.

The method for manufacturing semiconductor device 1t in the present embodiment further includes forming (S15) a pair of sixth insulating films 55 on first insulating film 16 provided on peripheral region 3. The pair of sixth insulating films 55 are provided between device region 2 and alignment mark 51, and are separated from device region 2 and alignment mark 51. Each of the pair of sixth insulating films 55 extends along the first direction in the form of a stripe.

Third stripe structure portion 6t including first insulating film 16 and sixth insulating film 55 on first insulating film 16 can prevent occurrence of chipping 32 in device region 2 even though width $W_1$ of peripheral region 3 of wafer 10 is narrowed. According to the method for manufacturing semiconductor device 1t in the present embodiment, occurrence of chipping 32 can be suppressed in device region 2 and the manufacturing cost of semiconductor device 1t can be reduced.

The pair of sixth insulating films 55 are separated from device region 2. Therefore, even when sixth insulating film 55 provided between fourth stripe structure portions 7t is damaged, this damage can be prevented from reaching device region 2 via sixth insulating film 55. The structure (for example, electrode film 20) formed on the surface of device region 2 can be suppressed from being damaged. According to the method for manufacturing semiconductor device 1t in the present embodiment, occurrence of chipping 32 can be suppressed in device region 2 and the manufacturing cost of semiconductor device 1t can be reduced.

Nineteenth Embodiment

Figure 94:
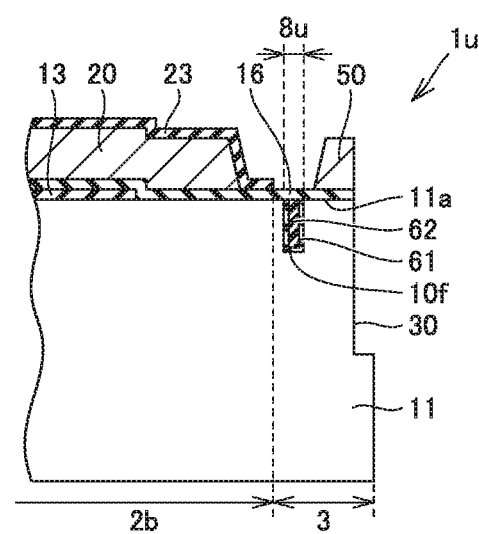
FIG. 94 is a schematic partial enlarged cross sectional view of a semiconductor device according to a nineteenth embodiment of the present invention.

With reference to FIG. 94, a semiconductor device 1u according to a nineteenth embodiment will be described. Semiconductor device 1u of the present embodiment includes a configuration similar to that of semiconductor device 1r of the sixteenth embodiment, but is mainly different therefrom in the following points.

Semiconductor device 1u of the present embodiment further includes second polycrystal film 62. Substrate 11 includes third groove portion 10f formed in main surface 11a at peripheral region 3 and extending along end surface 30 in the form of a stripe. Second polycrystal film 62 is provided in third groove portion 10f, and extends along end surface 30 in the form of a stripe. Second polycrystal film 62 and third groove portion 10f are located between device region 2 and second conductive film 50. Seventh insulating film 61 is provided in third groove portion 10f, and second polycrystal film 62 may be provided on this seventh insulating film 61. Seventh insulating film 61 may be a silicon dioxide film, for example. Second polycrystal film 62 may also be provided with a cavity (not shown) inside second polycrystal film 62.

Second polycrystal film 62 may be covered with first insulating film 16 provided on peripheral region 3.

With reference to FIG. 95 to FIG. 98, a method for manufacturing semiconductor device 1u according to the nineteenth embodiment will be described. The method for manufacturing semiconductor device 1u in the present embodiment includes steps similar to those in the method for manufacturing semiconductor device 1r in the sixteenth embodiment, but is mainly different therefrom in the following points.

Figure 95:
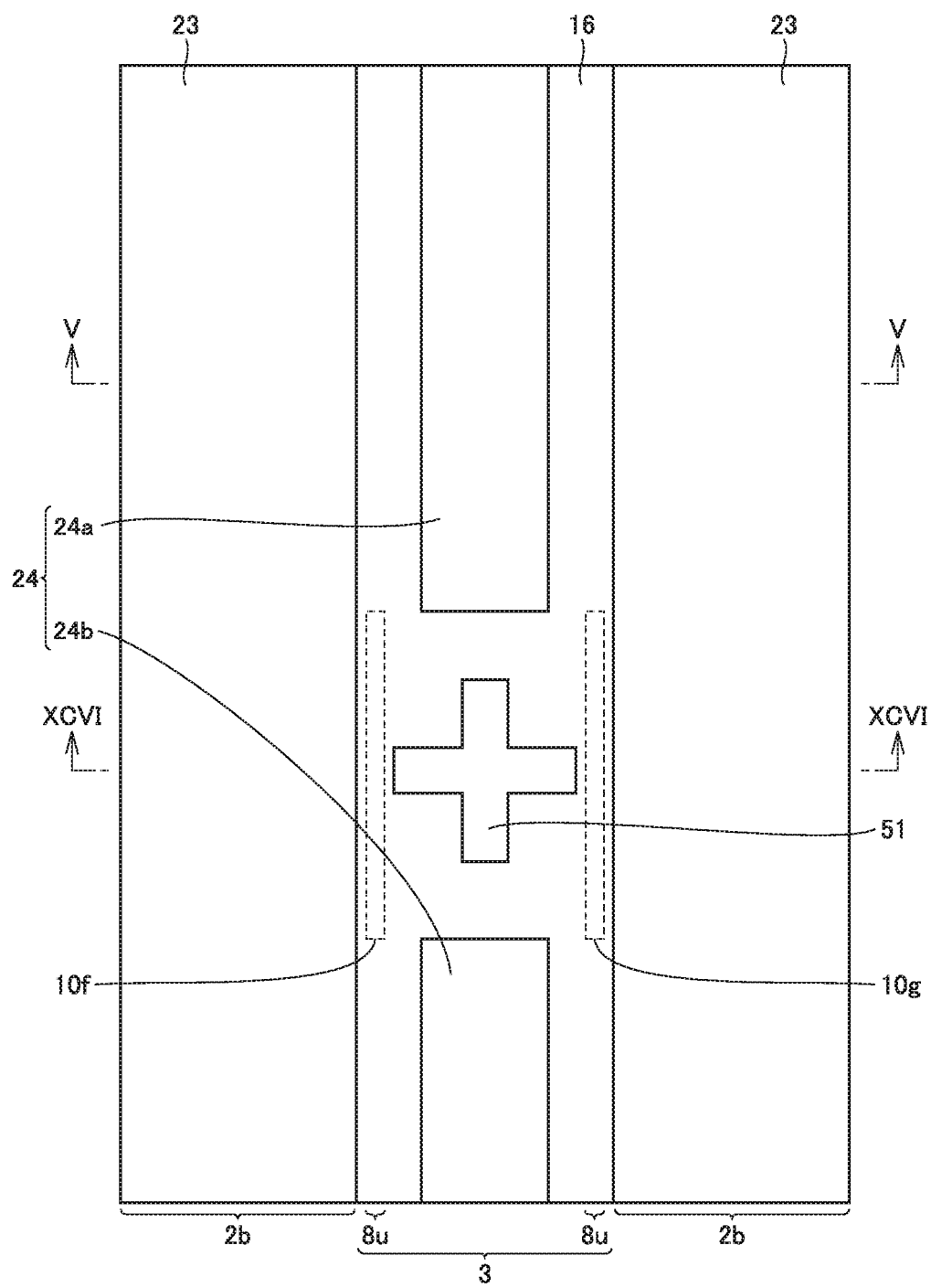
FIG. 95 is a schematic partial enlarged plan view showing one step of a method for manufacturing the semiconductor device according to the nineteenth embodiment of the present invention.
Figure 96:
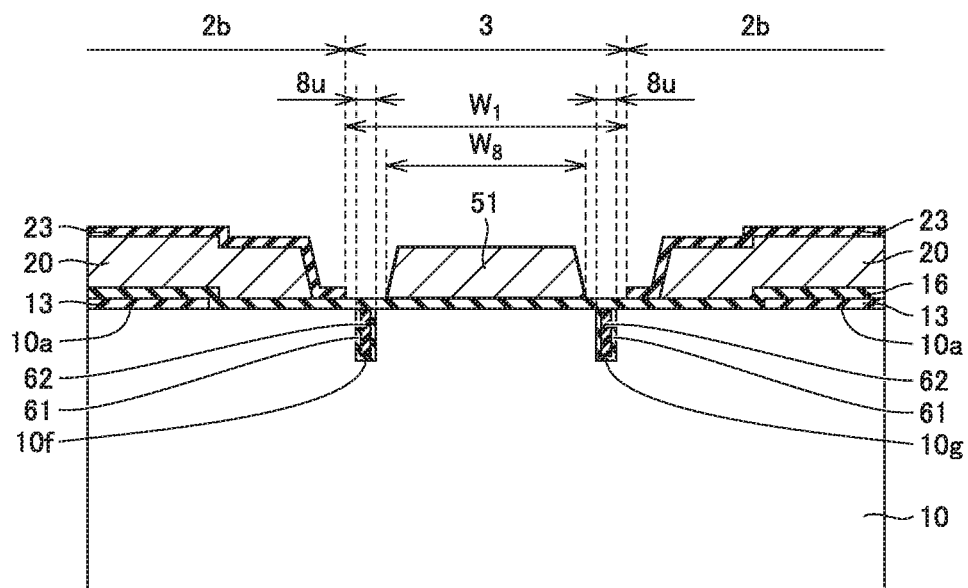
FIG. 96 is a schematic partial enlarged cross sectional view along a cross section line XCVI-XCVI shown in FIG. 95 in one step of the method for manufacturing the semiconductor device according to the nineteenth embodiment of the present invention.
Figure 98:
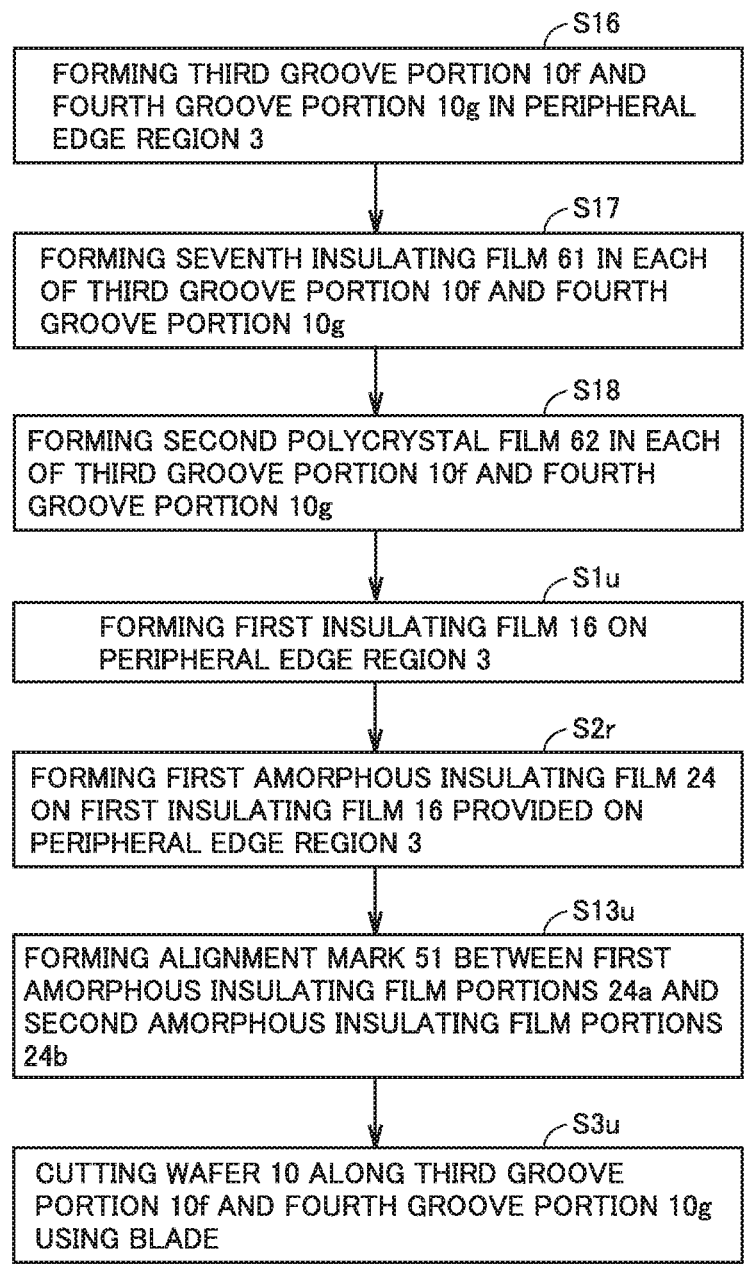
FIG. 98 shows a flowchart of the method for manufacturing the semiconductor device according to the nineteenth embodiment of the present invention.

With reference to FIG. 95, FIG. 96, and FIG. 98, the method for manufacturing semiconductor device 1u in the present embodiment further includes forming (S16) third groove portion 10f and fourth groove portion 10g in peripheral region 3 of main surface 10a of wafer 10. Third groove portion 10f and fourth groove portion 10g may be formed by etching portions of peripheral region 3 of main surface 10a of wafer 10. Each of third groove portion 10f and fourth groove portion 10g is located between device region 2 and alignment mark 51, and is separated from device region 2 and alignment mark 51. Each of third groove portion 10f and fourth groove portion 10g extends along the first direction in the form of a stripe. Third groove portion 10f and fourth groove portion 10g are separated from each other in the second direction orthogonal to the first direction. A space between third groove portion 10f and fourth groove portion 10g may be larger than the maximum thickness of the blade to be used when cutting (S3u) wafer 10.

With reference to FIG. 95, FIG. 96, and FIG. 98, the method for manufacturing semiconductor device 1u in the present embodiment may include forming (S17) seventh insulating film 61 in each of third groove portion 10f and fourth groove portion 10g. Seventh insulating film 61 may be formed by oxidizing a surface of each of third groove portion 10f and fourth groove portion 10g.

With reference to FIG. 95, FIG. 96 and FIG. 98, the method for manufacturing semiconductor device 1u in the present embodiment includes forming (S18) second polycrystal film 62 in each of third groove portion 10f and fourth groove portion 10g. Specifically, second polycrystal film 62 may be formed on seventh insulating film 61 in each of third groove portion 10f and fourth groove portion 10g. Second polycrystal film 62 may be formed on seventh insulating film 61 using the chemical vapor deposition (CVD) method or the evaporation method, for example. Second polycrystal film 62 may also be provided with a cavity (not shown) inside second polycrystal film 62. The region of wafer 10 on which each second polycrystal film 62 is formed is fragile region 8u of wafer 10. Fragile region 8u of wafer 10 is more likely to be cracked than other regions of wafer 10.

With reference to FIG. 95, FIG. 96, and FIG. 98, the method for manufacturing semiconductor device 1u in the present embodiment includes forming (S1u) first insulating film 16 on peripheral region 3 of main surface 10a of wafer 10. Forming (S1u) first insulating film 16 in the present embodiment is basically the same as forming (S1h) first insulating film 16 in the eleventh embodiment. First insulating film 16 provided on peripheral region 3 may be formed on main surface 10a of wafer 10 between third groove portion 10f and fourth groove portion 10g and on first polycrystal film 42 formed in each of third groove portion 10f and fourth groove portion 10g.

With reference to FIG. 95, FIG. 96, and FIG. 98, the method for manufacturing semiconductor device 1u in the present embodiment includes forming (S13u) alignment mark 51 between first amorphous insulating film portion 24a and second amorphous insulating film portion 24b. Forming (S13u) alignment mark 51 in the present embodiment is basically the same as forming (S13) alignment mark 51 in the sixteenth embodiment. When main surface 10a of wafer 10 is viewed in a plan view, alignment mark 51 is formed on peripheral region 3 and between third groove portion 10f and fourth groove portion 10g. Each of third groove portion 10f and fourth groove portion 10g is located between device region 2 and alignment mark 51, and is separated from device region 2 and alignment mark 51. The length of alignment mark 51 in the first direction may be smaller than the length of third groove portion 10f in the first direction. The length of alignment mark 51 in the first direction may be smaller than the length of fourth groove portion 10g in the first direction.

Figure 97:
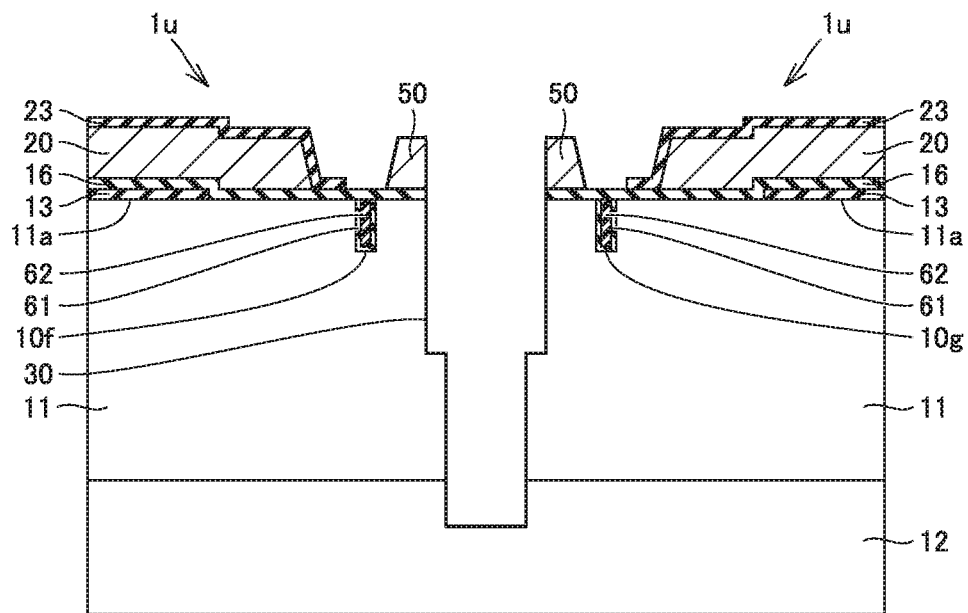
FIG. 97 is a schematic partial enlarged cross sectional view showing a step subsequent to the step shown in FIG. 96 in the method for manufacturing the semiconductor device according to the nineteenth embodiment of the present invention.

With reference to FIG. 97 and FIG. 98, the method for manufacturing semiconductor device 1u in the present embodiment includes: cutting (S3u) wafer 10 along third groove portion 10f and fourth groove portion 10g using the blade. When cutting (S3u) wafer 10, the blade does not enter third groove portion 10f and fourth groove portion 10g and at least third groove portion 10f remains. Specifically, when cutting (S3u) wafer 10, third groove portion 10f and fourth groove portion 10g may remain. When cutting (S3u) wafer 10, at least a portion of second polycrystal film 62 remains.

Fragile region 8u of wafer 10 is more likely to be cracked than other regions of wafer 10. Even if chipping occurs in wafer 10 under alignment mark 51 when cutting (S3u) wafer 10, this chipping selectively occurs in fragile region 8u. Therefore, even though width $W_1$ of peripheral region 3 of wafer 10 is narrowed, occurrence of chipping can be prevented in device region 2. A yield of semiconductor devices 1u obtained from one wafer 10 is increased and the manufacturing cost of semiconductor device 1u can be decreased.

In addition to the effects of semiconductor device 1r and the method for manufacturing semiconductor device 1r in the sixteenth embodiment, semiconductor device 1u and the method for manufacturing semiconductor device 1u in the present embodiment exhibit the following effects.

Semiconductor device 1u of the present embodiment further includes second polycrystal film 62. Substrate 11 is provided with third groove portion 10f formed in main surface 11a in peripheral region 3 and extending along end surface 30 in the form of a stripe. Second polycrystal film 62 is provided in third groove portion 10f, and extends along end surface 30 in the form of a stripe. Second polycrystal film 62 and third groove portion 10f are located between device region 2 and second conductive film 50. Fragile region 8u including second polycrystal film 62 provided in third groove portion 10f can prevent occurrence of chipping in device region 2. Semiconductor device 1u of the present embodiment has a structure with which occurrence of chipping 32 can be suppressed in device region 2 and the manufacturing cost of semiconductor device 1u can be reduced.

The method for manufacturing semiconductor device 1u in the present embodiment further includes forming (S16) third groove portion 10f and fourth groove portion 10g in peripheral region 3 of main surface 10a of wafer 10. Third groove portion 10f and fourth groove portion 10g are separated from device region 2. Third groove portion 10f and fourth groove portion 10g extend along the first direction in the form of a stripe. Third groove portion 10f and fourth groove portion 10g are separated from each other in the second direction orthogonal to the first direction. The method for manufacturing semiconductor device 1u in the present embodiment further includes: forming (S18) second polycrystal film 62 in each of third groove portion 10f and fourth groove portion 10g; and forming (S13u) alignment mark 51 between first amorphous insulating film portion 24a and second amorphous insulating film portion 24b. When main surface 10a of wafer 10 is viewed in a plan view, alignment mark 51 is formed on peripheral region 3 and between third groove portion 10f and fourth groove portion 10g. Third groove portion 10f and fourth groove portion 10g are located between device region 2 and alignment mark 51, and are separated from alignment mark 51. The method for manufacturing semiconductor device 1u in the present embodiment includes cutting (S3u) wafer 10 along third groove portion 10f and fourth groove portion 10g using the blade.

Even though width $W_1$ of peripheral region 3 of wafer 10 is narrowed, fragile region 8u including second polycrystal film 62 provided in each of third groove portion 10f and fourth groove portion 10g can prevent occurrence of chipping in device region 2 when cutting (S3u) wafer 10. According to the method for manufacturing semiconductor device 1u in the present embodiment, occurrence of chipping 32 can be suppressed in device region 2 and the manufacturing cost of semiconductor device 1u can be reduced.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a substrate having a main surface and an end surface extending in a direction transverse to the main surface, the main surface including a peripheral region and a device region surrounded by the peripheral region;
a first insulating film provided on the device region and the peripheral region; and
a first amorphous insulating film provided on the first insulating film,
the first amorphous insulating film being disposed on the peripheral region, the first amorphous insulating film being separated from the device region,
the first amorphous insulating film extending in a form of a stripe along the direction in which the end surface extends,
the first amorphous insulating film being flush with the end surface.

2. The semiconductor device according to claim 1, wherein
the first insulating film provided under the first amorphous insulating film between the device region and the first amorphous insulating film is separated from the first insulating film provided on the device region,
the first insulating film provided under the first amorphous insulating film extends along the end surface in a form of a stripe, and
the first insulating film provided under the first amorphous insulating film is flush with the end surface.

3. A semiconductor device comprising:
a substrate having a main surface and an end surface extending in a direction transverse to the main surface, the main surface including a peripheral region and a device region surrounded by the peripheral region;
a first stripe structure portion located on the peripheral region and extending along the direction in which the end surface extends; and
a second stripe structure portion located on the peripheral region and extending along the direction in which the end surface extends,
the second stripe structure portion being located between the device region and the first stripe structure portion,
the first stripe structure portion being thicker than the second stripe structure portion.

4. The semiconductor device according to claim 3, wherein
the first stripe structure portion includes a portion of a first insulating film and a third insulating film provided on the portion of the first insulating film,
the second stripe structure portion includes the first insulating film,
the first insulating film is provided on the device region and the peripheral region,
the portion of the first insulating film is provided on the peripheral region, and extends along the end surface in a form of a stripe, and
the third insulating film extends along the end surface in a form of a stripe.

5. The semiconductor device according to claim 3, wherein
the first stripe structure portion includes a fourth insulating film, a first insulating film provided on the fourth insulating film, and a first conductive film provided on the first insulating film,
the fourth insulating film is provided on the peripheral region and extends along the end surface in a form of a stripe, and
the first conductive film extends along the end surface in a form of a stripe.

6. The semiconductor device according to claim 1, further comprising a third insulating film provided on the first insulating film provided on the peripheral region, wherein
the third insulating film is provided between the device region and the first amorphous insulating film,
the third insulating film is separated from the device region and the first amorphous insulating film, and
the third insulating film extends along the end surface in a form of a stripe.

7. A semiconductor device comprising a substrate having a main surface, and an end surface defining an outer edge of the substrate and extending in a direction transverse to the main surface, and the substrate being provided with a notch portion connected to the main surface and the end surface, the main surface including a peripheral region and a device region surrounded by the peripheral region, the notch portion extending in a form of a stripe along the direction in which the end surface extends,
the notch portion including a side surface that is inward from the end surface and connected to the main surface and a bottom surface that extends inwardly from the end surface and is connected to the side surface and the end surface,
the notch portion being constituted of only an exposed surface of the substrate.

8. The semiconductor device according to claim 7, further comprising:
a first insulating film provided on the device region and the peripheral region; and
a third insulating film provided on the first insulating film provided on the peripheral region, wherein
the third insulating film is provided between the device region and the notch portion,
the third insulating film is separated from the device region, and the third insulating film extends in a form of a stripe along the direction in which the end surface extends.

9. A semiconductor device comprising:
a substrate having a main surface, and an end surface defining an outer edge of the substrate and extending in a direction transverse to the main surface, and the substrate being provided with one or more first groove portions, the main surface including a peripheral region and a device region surrounded by the peripheral region, the one or more first groove portions being formed in the peripheral region, the one or more first groove portions extending along the end surface in a form of a stripe or stripes; and
a first polycrystal film provided in the one or more first groove portions, the first polycrystal film extending in a form of a stripe along the direction in which the end surface extends.

10. The semiconductor device according to claim 9, comprising:
a first insulating film provided on the device region and the peripheral region; and
a first amorphous insulating film provided on the first insulating film, wherein
the first amorphous insulating film is disposed between the one or more first groove portions and the end surface and is separated from the device region,
the first amorphous insulating film extends in a form of a stripe along the direction in which the end surface extends, and
the first amorphous insulating film is flush with the end surface.

11. The semiconductor device according to claim 10, further comprising a third insulating film provided on the first insulating film, wherein
the third insulating film is disposed between the device region and the one or more first groove portions, and is separated from the device region and the first amorphous insulating film, and
the third insulating film extends along the end surface in a form of a stripe.

12. The semiconductor device according to claim 1, comprising a second conductive film provided on the first insulating film provided on the peripheral region, wherein the second conductive film is separated from the first amorphous insulating film,
the first amorphous insulating film includes a first amorphous insulating film portion and a second amorphous insulating film portion,
the second conductive film, the first amorphous insulating film portion, and the second amorphous insulating film portion are disposed along the end surface, and
the second conductive film is sandwiched between the first amorphous insulating film portion and the second amorphous insulating film portion.

13. The semiconductor device according to claim 12, wherein the first insulating film provided on the peripheral region is provided with a through hole extending along the end surface in a form of a stripe between the device region and the second conductive film.

14. The semiconductor device according to claim 12, further comprising a sixth insulating film provided on the first insulating film provided on the peripheral region, wherein
the sixth insulating film is provided between the device region and the second conductive film and is separated from the device region and the second conductive film, and
the sixth insulating film extends along the end surface in a form of a stripe.

15. The semiconductor device according to claim 12, further comprising a second polycrystal film, wherein
the substrate is provided with a third groove portion formed in the main surface at the peripheral region and extending along the end surface in a form of a stripe,
the second polycrystal film is provided in the third groove portion and extends along the end surface in a form of a stripe, and
the second polycrystal film and the third groove portion are located between the device region and the second conductive film.

16. The semiconductor device according to claim 1, wherein the device region includes a breakdown voltage holding region adjacent to the peripheral region, and an active device region surrounded by the breakdown voltage holding region.

* * * * *